US006548848B2

(12) United States Patent
Horiguchi et al.

(10) Patent No.: US 6,548,848 B2
(45) Date of Patent: Apr. 15, 2003

(54) SEMICONDUCTOR MEMORY DEVICE

(75) Inventors: Fumio Horiguchi, Tokyo-To (JP);
Takashi Ohsawa, Yokohama (JP);
Yoshihisa Iwata, Yokohama (JP);
Takashi Yamada, Ebina (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/005,180

(22) Filed: Dec. 3, 2001

(65) Prior Publication Data

US 2002/0130341 A1 Sep. 19, 2002

(30) Foreign Application Priority Data

Mar. 15, 2001 (JP) .......................................... 2001-074236

(51) Int. Cl.⁷ ............................................. H01L 27/108
(52) U.S. Cl. ...................... 257/296; 257/315; 257/314; 257/317
(58) Field of Search ................................. 257/315, 317, 257/133, 296, 314, 324, 318–321; 438/257, 258, 259, 260, 261, 262, 263, 264; 395/185.26, 185.27

(56) References Cited

U.S. PATENT DOCUMENTS

| 4,979,014 A | 12/1990 | Hieda et al. |
| 5,258,635 A | 11/1993 | Nitayama et al. |
| 5,929,479 A | * 7/1999 | Oyama .......................... 257/315 |
| 6,391,658 B1 | * 5/2002 | Gates et al. .................... 438/3 |

FOREIGN PATENT DOCUMENTS

| JP | 01-042176 | 2/1989 |
| JP | 02-0715556 | 3/1990 |
| JP | 02-188966 | 7/1990 |
| JP | 03-171768 | 7/1991 |
| JP | 08-316337 | 11/1996 |

OTHER PUBLICATIONS

"A Capacitorless DRAM Cell on SOI Substrate", by Wann, et al.—IEDM93, pp635–638.
"The Multistable Charge–Controlled Memory Effect in SOI MOS Transistors at Low Temperature", by Tack, et al.—IEEE Transactions on Electron Device, vol. 37, May, 1990, pp1373–1382.
"dRAM Design Using the Taper–Isolated Dynamic RAM Cell" by Leiss, et al.—IEEE Journal of Solid–State Circuits, vol. SC–17, No. 2, Apr. 1982, pp337–344.
"Semiconductor Memory Device and Its Manufacturing Method", U.S. patent application No. 09/947,908, Sep. 7, 2001.

* cited by examiner

Primary Examiner—David Nelms
Assistant Examiner—Long Tran
(74) Attorney, Agent, or Firm—Hogan & Hartson, LLP

(57) ABSTRACT

Each of MIS transistors of a semiconductor memory device has a semiconductor layer (12); a source region (15) formed in the semiconductor layer; a drain region (14) formed apart from the source region in the semiconductor layer, the semiconductor layer between the source region and the drain region serving as a channel body in a floating state; a first gate (13) which forms a channel in the channel body; a second gate (20) formed so as to control a potential of the channel body by a capacitive coupling; and a high concentration region (21) formed in the channel body on the second gate side, impurity concentration of the high concentration region being higher than that of the channel body.

26 Claims, 48 Drawing Sheets

"0" READ / "1" WRITE

"1" READ / REFRESH

"0" READ / "1" WRITE

"1" WRITE / READ

SEMICONDUCTOR MEMORY DEVICE

CROSS REFERENCE TO RELATED APPLICATION

This application claims the benefit of priority under 35 U.S.C. §119 to Japanese Patent Application No. 2001-74236 filed on Mar. 15, 2001, the entire contents of which are incorporated by reference herein.

BACKGROUND OF THE INVENTION

1. Field of the Invention

The present invention relates to a semiconductor memory device which dynamically stores data with using a channel body of a transistor as a storage node.

2. Related Background Art

In a related DRAM, a memory cell is composed of an MOS transistor and a capacitor. The scale-down of the DRAM has been remarkably advanced by the adoption of a trench capacitor structure and a stacked capacitor structure. At present, the cell size of a unit memory cell is scaled down to an area of $2F \times 4F = 8F^2$, where F is a minimum feature size. Namely, the minimum feature size F decreases with the advance of generation, and when the cell size is generally taken to be $\alpha F^2$, $\alpha$ coefficient a also decreases with the advance of generation. Thus, at the present of $F=0.18$ $\mu$m, $\alpha=8$ is realized.

In order to hereafter secure the trend of cell size or chip size which is the same as before, it is demanded to satisfy $\alpha < 8$ in $F < 0.18$ $\mu$m and further satisfy $\alpha < 6$ in $F < 0.13$ $\mu$m, and together with microfabrication, the formation of cell size of the possible small area becomes a large problem. Accordingly, various proposals for decreasing the size of the one memory cell with the one transistor and one capacitor to $6F^2$ or $4F^2$ are made. However, practical use is not easy since there are a technical difficulty that the transistor has to be a vertical type, a problem that electric interference between adjacent memory cells increases, and in addition difficulties in terms of manufacturing technology including fabrication, film formation, and the like.

SUMMARY OF THE INVENTION

It is therefore an object of the present invention to provide a semiconductor memory device which includes memory cells with simple transistor structure and which can store data dynamically.

According to one aspect of the present invention, a semiconductor memory device including MIS transistors to constitute memory cells, each of the MIS transistors comprising:
  a semiconductor layer;
  a source region formed in the semiconductor layer;
  a drain region formed apart from the source region in the semiconductor layer, the semiconductor layer between the source region and the drain region serving as a channel body in a floating state;
  a first gate which forms a channel in the channel body;
  a second gate formed so as to control a potential of the channel body by a capacitive coupling; and
  a high concentration region formed in the channel body on the second gate side, impurity concentration of the high concentration region being higher than that of the channel body,
  wherein the MIS transistor has a first data state in which the channel body has a first potential and a second data state in which the channel body has a second potential.

According to another aspect of the present invention, a semiconductor memory device including MIS transistors to constitute memory cells, each of the MIS transistors comprising:
  a semiconductor layer;
  a source region formed in the semiconductor layer;
  a drain region formed apart from the source region in the semiconductor layer, the semiconductor layer between the source region and the drain region serving as a channel body in a floating state; and
  a first gate which forms a channel in the channel body,
  wherein characteristics of the MIS transistor in the case where a channel current flows from the source region to the drain region is different from characteristics of the MIS transistor in the case where a channel current flows from the drain region to the source region, even when the same potential is applied to the first gate, and
  wherein the MIS transistor has a first data state in which the channel body has a first potential and a second data state in which the channel body has a second potential, the first data state being set by the impact ionization generated near a drain junction or by a drain leakage current caused by the first gate, the second data state being set by sending a forward bias current between the drain region and the channel body.

According to a further aspect of the present invention, a semiconductor memory device including MIS transistors to constitute memory cells, each of the MIS transistors comprising:
  a semiconductor layer;
  a source region formed in the semiconductor layer;
  a drain region formed apart from the source region in the semiconductor layer, the semiconductor layer between the source region and the drain region serving as a channel body in a floating state; and
  a gate which forms a channel in the channel body,
  wherein the MIS transistor has a first data state in which the channel body has a first potential and a second data state in which the channel body has a second potential, the first data state being set by a drain leakage current caused by the gate to which a negative potential is applied, the second data state being set by sending a forward bias current between the drain region and the channel body.

DETAILED DESCRIPTION OF THE PREFERRED EMBODIMENTS

Preferred embodiments of the present invention will be explained below with reference to the drawings.

[Basic Concept]

Figure 1:
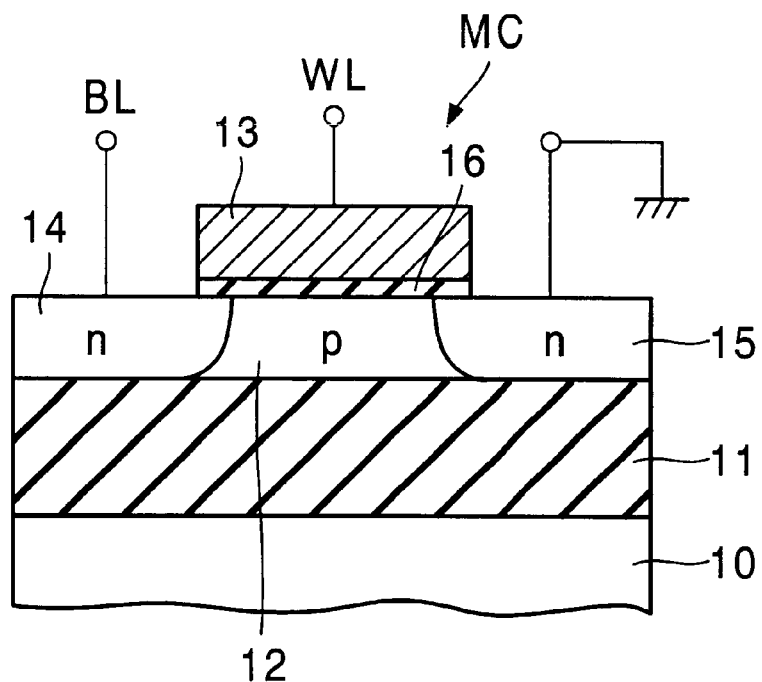
FIG. 1 is a sectional view showing the basic structure of a memory cell according to the basic concept of the present invention.
Figure 2:
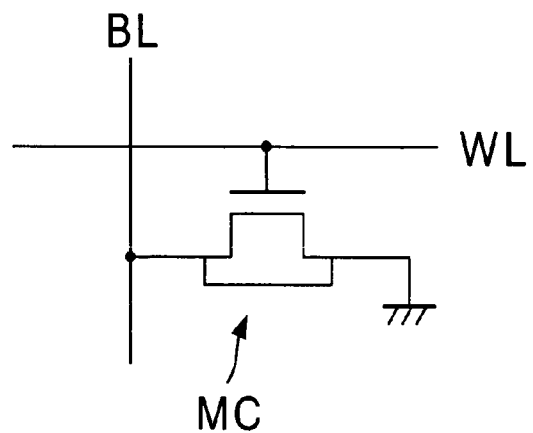
FIG. 2 is a diagram showing an equivalent circuit of the memory cell.

FIG. 1 shows the basic sectional structure of a unit memory cell of a DRAM according to respective embodiments described later, and FIG. 2 shows its equivalent circuit. A memory cell MC is composed of an N-channel MIS transistor with an SOI structure. Specifically, an SOI substrate, in which a silicon oxide film 11 as an insulating film is formed on a silicon substrate 10 and a p-type silicon layer 12 is formed on the silicon oxide film 11, is used. A gate electrode 13 is formed on the silicon layer 12 of this substrate with a gate oxide film 16 therebetween, and n-type source/drain diffusion regions 14 and 15 are formed, being self-aligned by the gate electrode 13.

The source/drain 14 and 15 are formed deep to reach the silicon oxide film 11 at the bottom. Therefore, a channel body formed out of the p-type silicon layer 12 is insulatingly isolated from others at its bottom face and its side faces in a channel width direction if isolation in the channel width direction (a direction perpendicular to a paper surface in FIG. 1) is performed by an oxide film, and it is floating in a channel length direction by being isolated by a pn junction.

When these memory cells MC are arranged in a matrix form, the gate electrode 13 is connected to a word line WL, the source 15 is connected to a fixed potential line (ground potential line), and the drain 14 is connected to a bit line BL.

Figure 3:
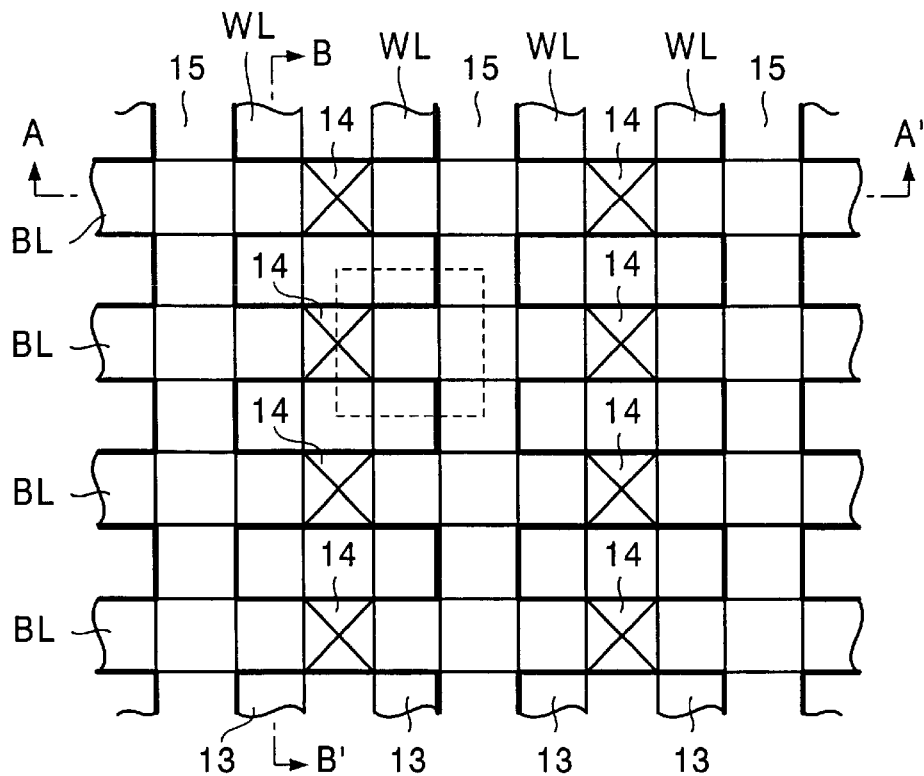
FIG. 3 is a layout of a memory cell array of the DRAM in which the memory cells are used.
Figure 4A:
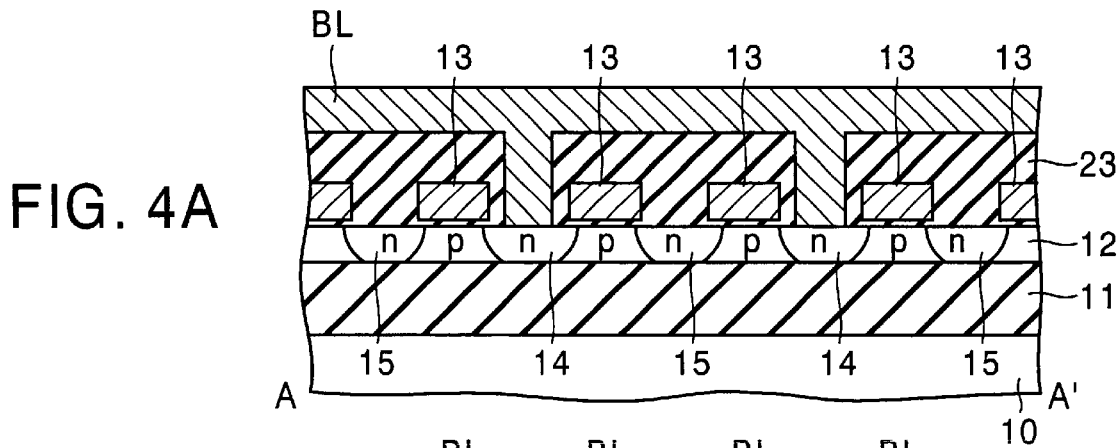
FIG. 4A is a sectional view taken along the line A–A' in FIG. 3.
Figure 4B:
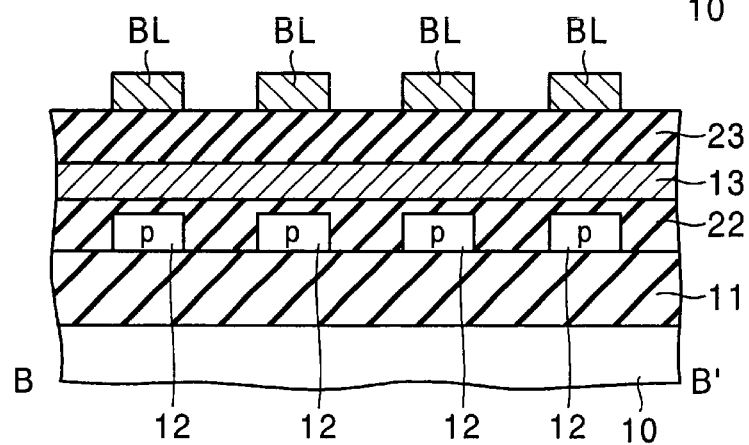
FIG. 4B is a sectional view taken along the line B–B' in FIG. 3.

FIG. 3 shows the layout of a memory cell array, and FIG. 4A and FIG. 4B respectively show sections taken along the line A–A' and the line B–B' in FIG. 3. The p-type silicon layer 12 is pattern-formed in a lattice form by burying a silicon oxide film 22 therein. Namely, two transistor regions sharing a drain are arranged, being element-isolated in a word line WL direction by the silicon oxide film 22. Alternatively, instead of burying the silicon oxide film 22, element isolation in a crosswise direction may be performed by etching the silicon layer 12. The gates 13 are formed continuously in one direction to constitute the word lines WL. The sources 15 are continuously formed in the word line WL direction to constitute the fixed potential line (common source line).

The transistors are covered with an interlayer dielectric film 23, and the bit lines BL are formed thereon. The bit lines BL are disposed to be in contact with the drains 14 each shared by two transistors and intersect the word lines WL. Incidentally, in order to lower the wiring resistance of the fixed potential line (common source line) of the sources 15, it is suitable to form metal wires parallel to the word lines WL on or under the bit lines BL and to connect them to the fixed potential line for every plural bit lines.

Hence, the silicon layers 12, each being a channel region of each transistor, are isolated from each other at their bottom faces and side faces in the channel width direction by the oxide film, and isolated from each other in the channel length direction by a pn junction to be maintained in a floating state.

In this memory cell array configuration, if the word lines WL and the bit lines BL are formed at the pitch of a minimum feature size F, a unit cell area is $2F \times 2F = 4F^2$ as shown by a broken line in FIG. 3.

The operational principle of the memory cell MC composed of this n-channel type MIS transistor utilizes the accumulation of holes which are majority carriers in the channel body (the p-type silicon layer 12 insulatingly isolated from others) of the MIS transistor. Specifically, a large current is sent from the drain 14 by operating the transistor in a pentode region to generate impact ionization near the drain 14. Holes which are majority carriers produced by the impact ionization are held in the p-type silicon layer 12, and this state in which the holes are accumulated is defined, for example, as data "1". A state in which the pn junction between the drain 14 and the p-type silicon layer 12 is forward biased to emit excessive holes in the p-type silicon layer 12 to the drain side is defined as data "0".

The data "0" and "1" are stored as difference in the potential of the channel body, that is, difference in the threshold voltage of the transistor. Namely, a threshold voltage Vth1 in a data "1" state in which the channel body potential is high due to hole accumulation is lower than a threshold voltage Vth0 in a data "0" state. In order to hold the "1" data state in which holes being majority carriers are accumulated in the channel body, it is necessary to apply a negative bias voltage to the word line. This data hold state is not changed in theory even when a read operation is performed as long as the read operation is performed in a linear region unless a write operation of inverted data (erase) is performed. Namely, differently from a one transistor/one capacitor DRAM which utilizes charge storage by the capacitor, non-destructive read-out is possible.

Figure 5:
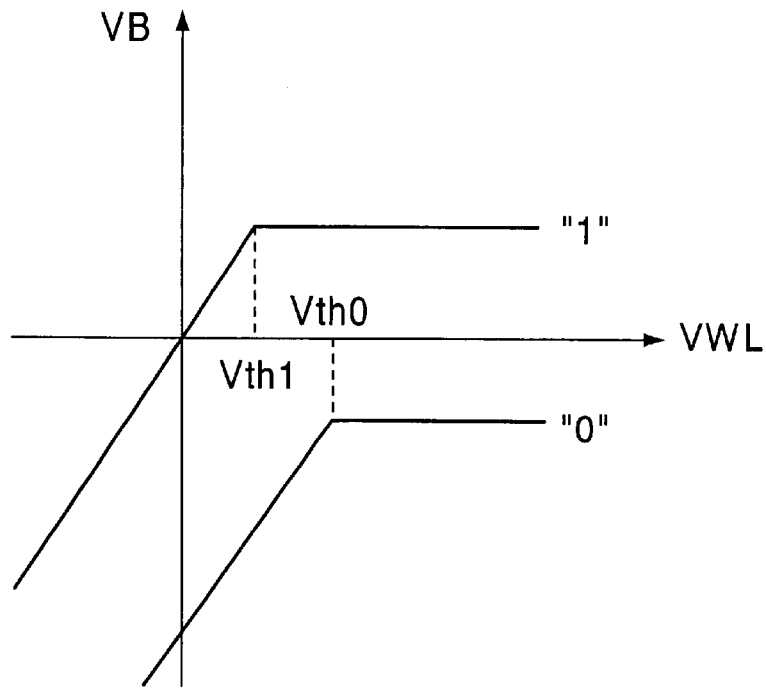
FIG. 5 is a diagram showing the relation between a word line potential and a channel body potential of the memory cell.
Figure 6:
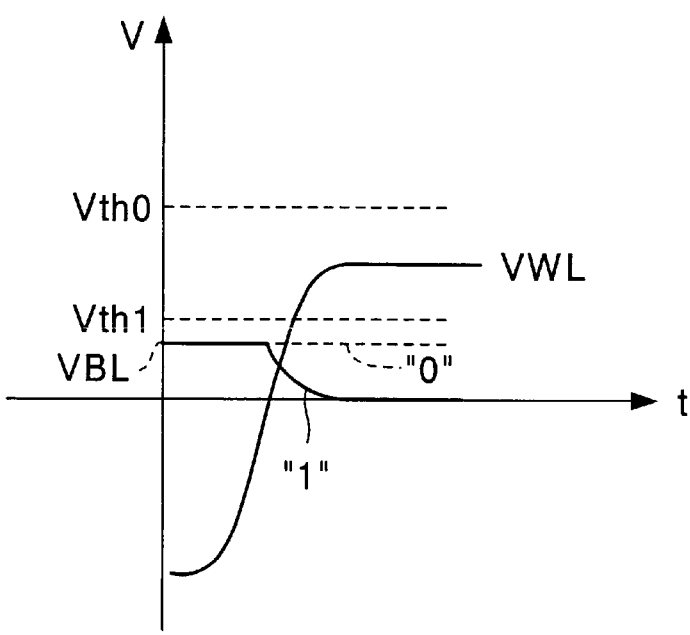
FIG. 6 is a diagram for explaining a read method of the memory cell.

There are various methods of reading data. The relation between a word line potential Vw1 and a channel body potential VB is shown in FIG. 5 in relation to the data "0" and "1". A first method of reading data utilizes the fact that the word line WL is given a read potential which has an intermediate value between the threshold voltages Vth0 and Vth1 of the data "0" and "1", and that a current is not passed through a memory cell storing the "0" data, while a current is passed through a memory cell storing the "1" data. More specifically, for example, the bit line BL is precharged at a predetermined potential VBL, and thereafter the word line WL is driven. Thereby, as shown in FIG. 6, in the case of the "0" data, the precharge potential VBL of the bit line does not change, while in the case of the "1" data, the precharge potential VBL lowers.

Figure 7:
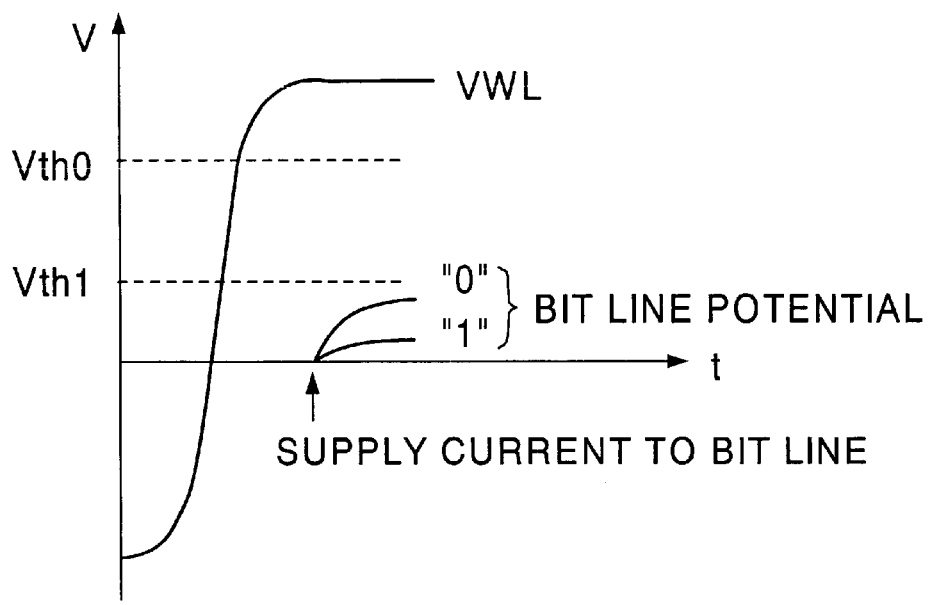
FIG. 7 is a diagram for explaining a different read method of the memory cell.

A second read method utilizes the fact that after the potential of the word line WL is raised, a current is supplied to the bit line BL, and that the increasing speed of the bit line potential is different according to the conductivity of "0" and "1". In brief, the bit line BL is precharged at 0 V, the potential of the word line WL is raised, and then a current is supplied to the bit line as shown in FIG. 7. By detecting a difference in bit line potential increase by using a dummy cell at this time, data distinction becomes possible.

A third read method is a method of reading a difference in bit line current which differs according to "0" and "1" when the bit line BL is clamped at a predetermined potential. A current-voltage conversion circuit is necessary to read current difference, and finally a potential difference is differentially amplified and a sense output is given.

In the memory cell MC according to the basic concept, in order to selectively write the "0" data, that is, in order to emit holes only from the channel body of the memory cell selected by potentials of the selected word line WL and bit line BL in the memory cell array, capacitive coupling between the word line WL and the channel body is essential. A state in which holes are accumulated in the channel body in the case of the data "1" needs to be held in a state in which the word line is fully biased in a negative direction, whereby the capacitance between the gate and the channel body of the memory cell is the capacitance of the gate oxide film (namely, in a state in which no depletion layer is formed on the surface).

Moreover, it is desirable that the write operation be performed by pulse write to reduce electric power consumption in the case of both "0" and "1". In the "0" write operation, a hole current is sent from the channel body to the drain of the selected transistor, while an electron current is sent from the drain to the channel body, but no hole is injected into the channel body.

More concrete operation waveforms will be explained. FIG. 8 to FIG. 11 show waveforms of read/refresh and read/write operations when the first read method of performing data distinction by the presence or absence of electric discharge of the bit line in the selected cell is used.

Figure 8:
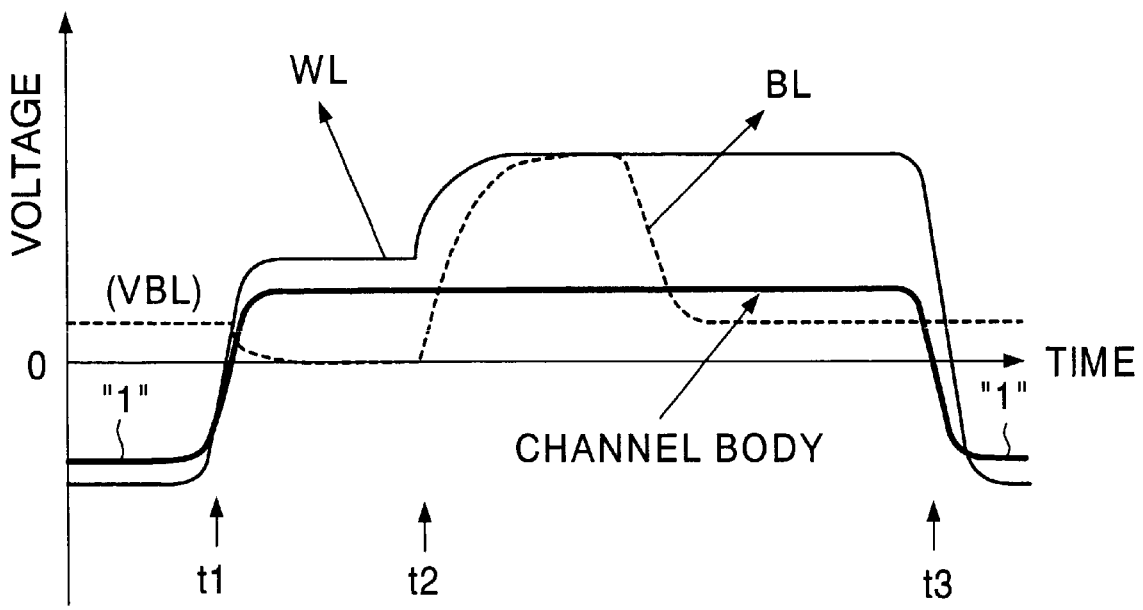
FIG. 8 is a diagram showing waveforms of "1" data read/refresh operations of the DRAM.
Figure 9:
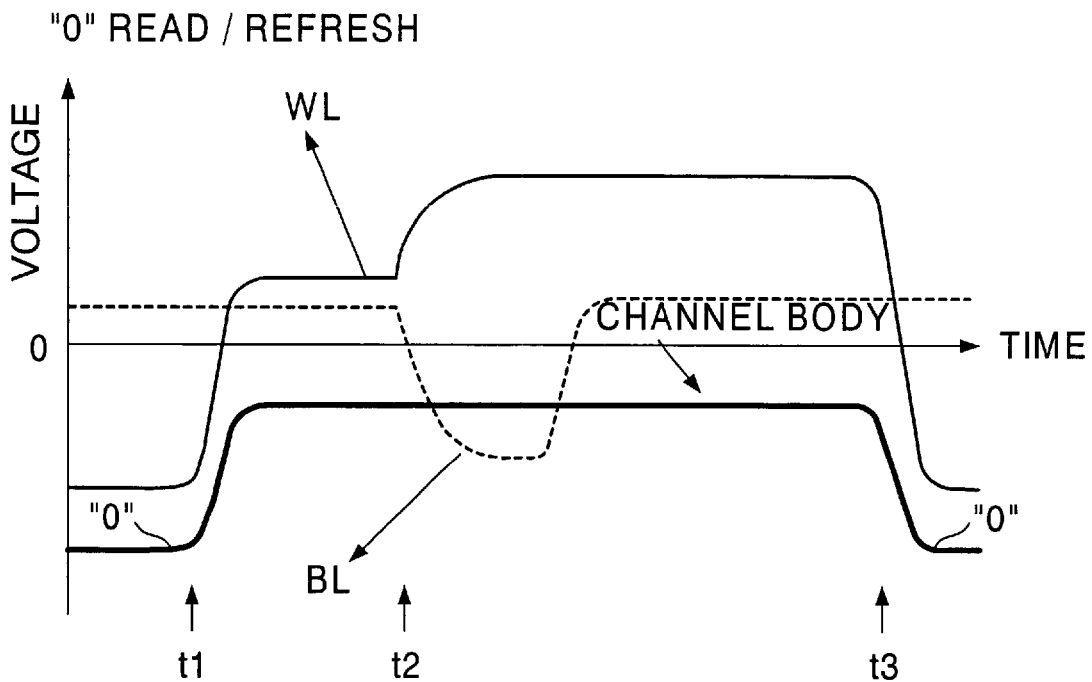
FIG. 9 is a diagram showing waveforms of "0" data read/refresh operations of the DRAM.

FIG. 8 and FIG. 9 respectively show read/refresh operations of the "1" data and the "0" data. Until a point in time t1, a data hold state (non-selected state) continues and a negative potential is given to the word line WL. At the point in time t1, the word line WL is raised to a positive predetermined potential. At this time, the word line potential is set at a value between the thresholds Vth0 and Vth1 of the "0" and "1" data. As a result, in the case of the "1" data, the bit line BL precharged in advance comes to have a lower potential by electric discharge. In the case of the "0" data, the bit line potential VBL is maintained. Hence, the "1" and "0" data can be distinguished.

At a point in time t2, the potential of the word line WL is further increased. At the same time, when the read data is "1", a positive potential is given to the bit line BL (FIG. 8), and when the read data is "0", a negative potential is given to the bit line BL (FIG. 9). Thereby, when the selected memory cell stores the "1" data, a large channel current flows by a pentode operation to generate impact ionization, whereby excessive holes are injected into the channel body and held therein, and thus the "1" data is written again. In the case of the "0" data, a drain junction is forward biased, and thereby the "0" data in the state in which no excessive hole is held in the channel body is written again.

At a point in time t3, the word line WL is biased in the negative direction, and the read/refresh operations are completed. In other non-selected memory cells which are connected to the same bit line BL as the memory cell which has performed the "1" data read operation, the word line WL is maintained at a negative potential, and hence the channel body thereof is maintained at a negative potential, whereby impact ionization does not occur. In other non-selected memory cells which are connected to the same bit line BL as the memory cell which has performed the "0" data read operation, the word line WL is maintained at a negative potential as well, whereby hole emission does not occur.

Figure 10:
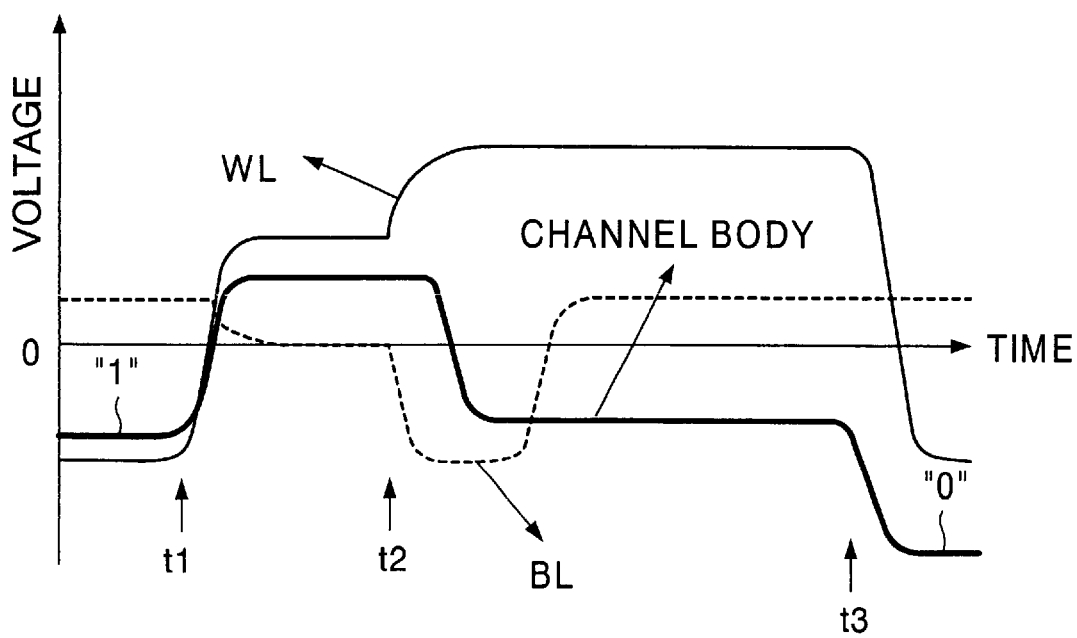
FIG. 10 is a diagram showing waveforms of "1" data read/"0" data write operations of the DRAM.
Figure 11:
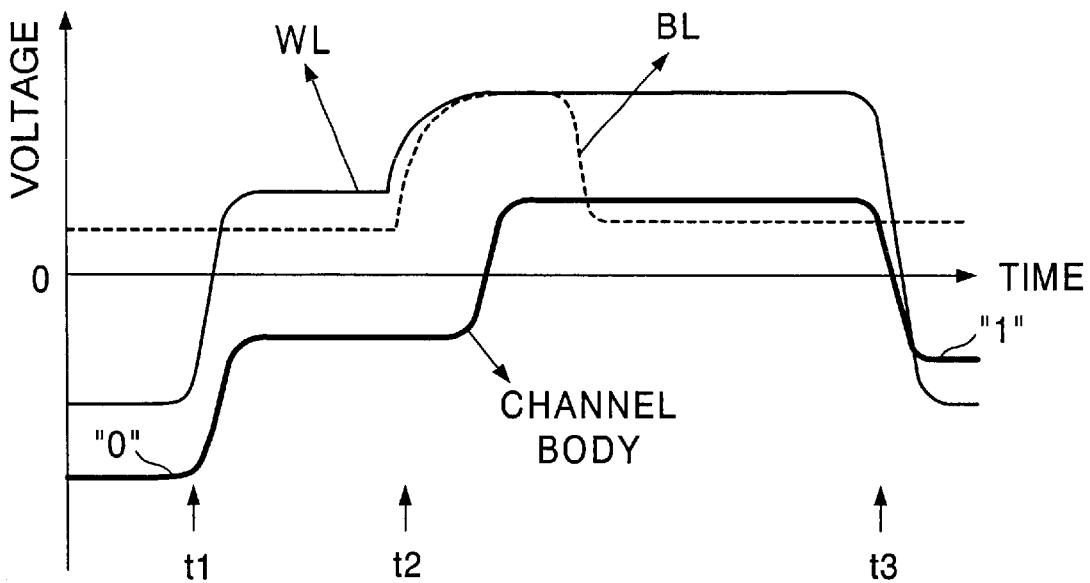
FIG. 11 is a diagram showing waveforms of "0" data read/"1" data write operations of the DRAM.

FIG. 10 and FIG. 11 show read/write operations of the "1" data and the "0" data by the same read method. The read operations at the point in time t1 in FIG. 10 and FIG. 11 are the same as in FIG. 8 and FIG. 9 respectively. After the read operation, at the point in time t2, the potential of the word line WL is further increased. When the "0" data is written in the same selected cell, a negative potential is given to the bit line BL (FIG. 10) at the same time, and when the "1" data is written therein, a positive potential is given to the bit line BL (FIG. 11). Thereby, in the cell to which the "0" data is given, the drain junction is forward biased, and holes in the channel body are emitted. Meanwhile, in the cell to which the "1" data is given, impact ionization occurs near the drain, and excessive holes are injected into the channel body and held therein.

FIG. 12 to FIG. 15 show waveforms of read/refresh and read/write operations when the second read method of precharging the bit line BL at 0 V, supplying a current to the bit line BL after the selection of the word line, and performing data distinction by the increasing speed of the potential of the bit line BL is used.

Figure 12:
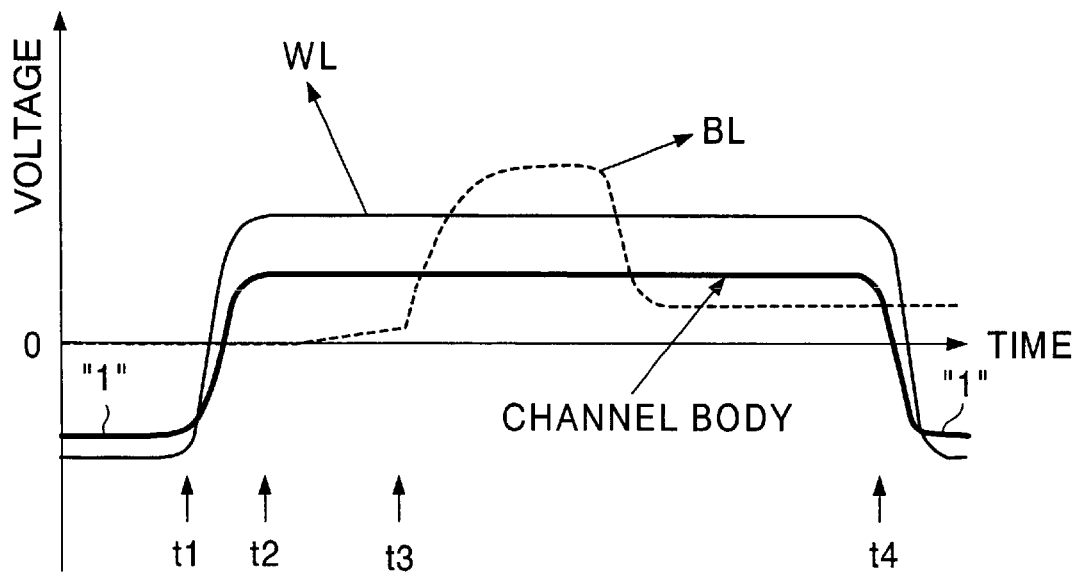
FIG. 12 is a diagram showing waveforms of "1" data read/refresh operations by the different read method of the DRAM.
Figure 13:
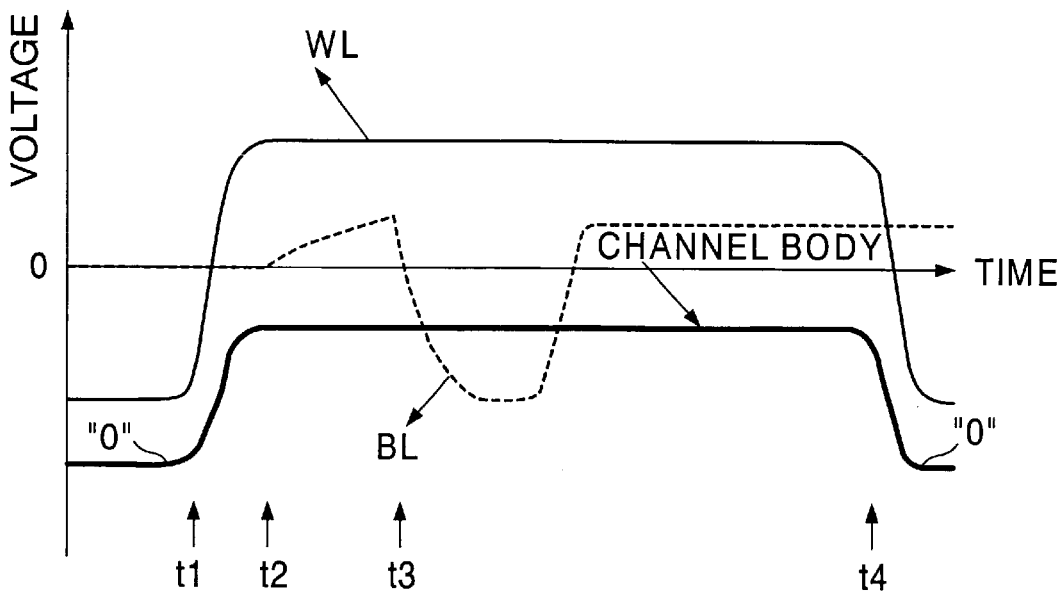
FIG. 13 is a diagram showing waveforms of "0" data read/refresh operations by the different read method of the DRAM.

FIG. 12 and FIG. 13 respectively show read/refresh operations of the "1" data and the "0" data. The word line WL which is maintained at a negative potential is raised to a positive potential at the point in time t1. At this time, the word line potential is set at a value higher than both the thresholds Vth0 and Vth1 of the "0" and "1" data as shown in FIG. 7. Alternatively, similarly to the first read method, the word line potential may be set at a value between the thresholds Vth0 and Vth1 of the "0" and "1" data. Then, a current is supplied to the bit line at the point in time t2. Thereby, in the case of the "1" data, the memory cell is turned on deeply and an increase in the potential of the bit line BL is small (FIG. 12), while in the case of the "0" data, a small current is passed through the memory cell (or no current is passed therethrough) and the bit line potential increases rapidly. Hence, the "1" and "0" data can be distinguished.

At the point in time t3, a positive potential is given to the bit line BL when the read data is "1" (FIG. 12), while a negative potential is given to the bit line BL when the read data is "0" (FIG. 13). Consequently, when the selected memory cell stores the "1" data, a drain current flows to generate impact ionization, excessive holes are injected into the channel body and held therein, and the "1" data is written again. In the case of the "0" data, the drain junction is forward biased, and the "0" data in the state in which there are no excessive holes in the channel body is written again.

At a point in time t4, the word line WL is biased in the negative direction, and the read/refresh operations are completed.

Figure 14:
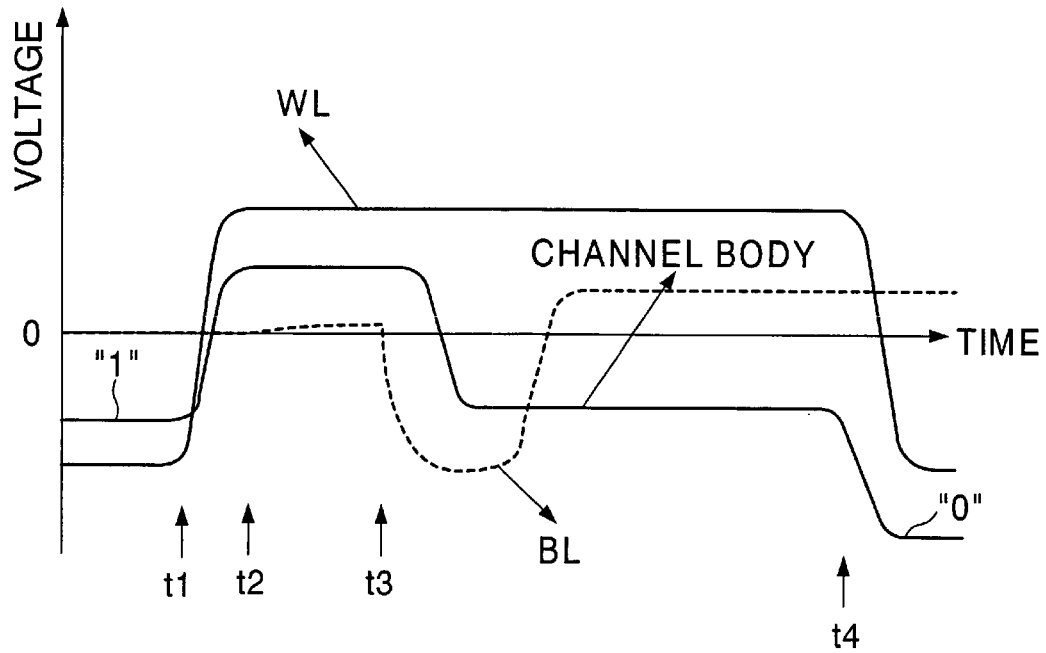
FIG. 14 is a diagram showing waveforms of "1" data read/"0" data write operations by the different read method of the DRAM.
Figure 15:
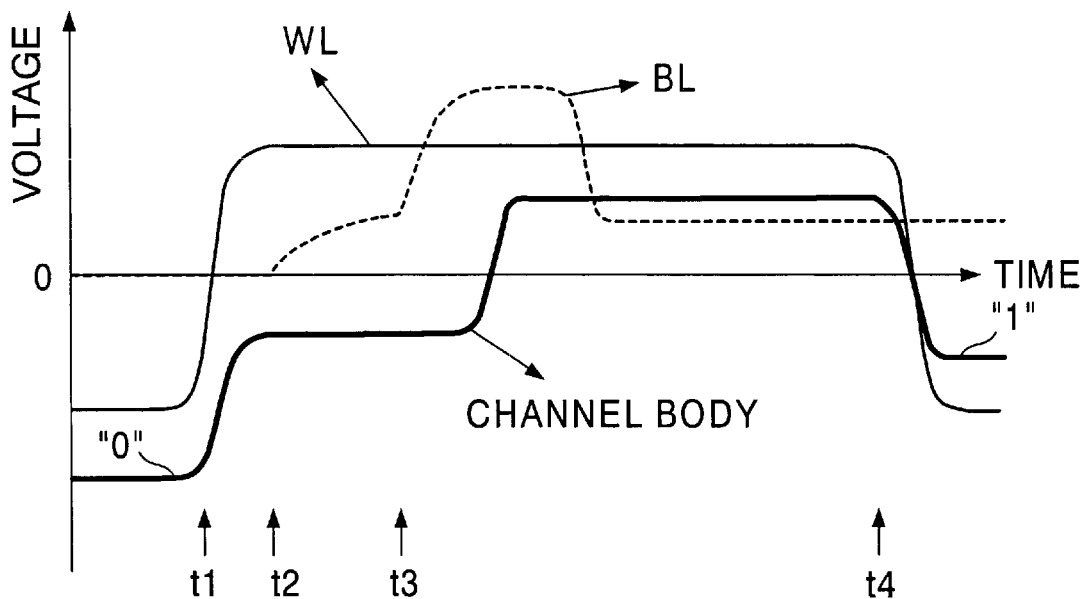
FIG. 15 is a diagram showing waveforms of "0" data read/"1" data write operations by the different read method of the DRAM.

FIG. 14 and FIG. 15 respectively show read/write operations of the "1" data and "0" data by the same read method. The read operations at the points in time t1 and t2 in FIG. 14 and FIG. 15 are the same as in FIG. 12 and FIG. 13 respectively. When the "0" data is written in the same selected cell after the read operation, a negative potential is given to the bit line BL (FIG. 14), and when the "1" data is written, a positive potential is given to the bit line BL (FIG. 15). Thereby, in the cell to which the "0" data is given, the drain junction is forward biased, and excessive holes in the channel body are emitted. Meanwhile, in the cell to which the "1" data is given, a large drain current flows to generate impact ionization near the drain, and excessive holes are injected into the channel body and held therein.

As described above, the memory cell MC according to the basic concept is composed of the simple MIS transistor having the floating channel body which is electrically isolated from others, and the cell size of 4 $F^2$ can be realized. Capacitive coupling from the gate electrode is used for the potential control of the floating body, and the source has a fixed potential. Namely, the control of read/write operations is performed by the word line WL and the bit line BL, which is simple. Moreover, data in the memory cell is basically non-destructively read out, whereby it is unnecessary to provide a sense amplifier in each bit line, which facilitates the layout of the sense amplifiers. In addition, since it adopts a current read method, it is not affected by noise, whereby read is possible, for example, even by an open bit line system. Moreover, the process of manufacturing the memory cell is simple.

The SOI structure is an important technique when improvement in the performance of a logic LSI in future is considered. The DRAM according to the basic concept is very promising also when mounted together with such a logic LSI having the SOI structure. Unlike a related DRAM using a capacitor, the DRAM in the basic concept does not need a process different from that of the logic LSI, and hence its manufacturing process is simplified.

Furthermore, the DRAM having the SOI structure according to the basic concept has an advantage that an excellent memory holding characteristic can be obtained, compared with the case where a related one transistor/one capacitor-type DRAM is formed to have the SOI structure. Specifically, if the related one transistor/one capacitor-type DRAM is formed to have the SOI structure, holes are accumulated in a floating body, the threshold of a transistor decreases, and thereby a subthreshold current in the transistor is increased, which deteriorates a memory holding characteristic. On the other hand, in the memory cell having only one transistor according to the basic concept, a transistor path which decreases memory charge does not exist, and hence a data holding characteristic is determined by only leakage from the pn junction, which eliminates a problem of subthreshold leakage.

In the basic memory cell explained above, it is important for a memory characteristic to what extent the difference in threshold voltage between the data "0" and "1" which is stored as difference in channel body potential can be increased. According to the result of simulation on this point, on the occasion of a data write operation accompanied by the control of the potential of the channel body by capacitive coupling from the gate, it becomes clear that compared with the difference in body potential between the "0" and "1" data immediately after the write operation, the difference in body potential between the "0" and "1" data in the subsequent data hold state becomes smaller. The result of the simulation will be explained below.

Device conditions are as follows. The gate length is Lg=0.35 μm, the p-type silicon layer 12 has a thickness of tSi=100 nm and an acceptor concentration of NA=5×10$^{17}$/cm$^3$, the source 14 and the drain 15 each have a donor concentration of ND=5×10$^{20}$/cm$^3$, and the gate oxide film has a thickness of tox=10 nm.

Figure 16:
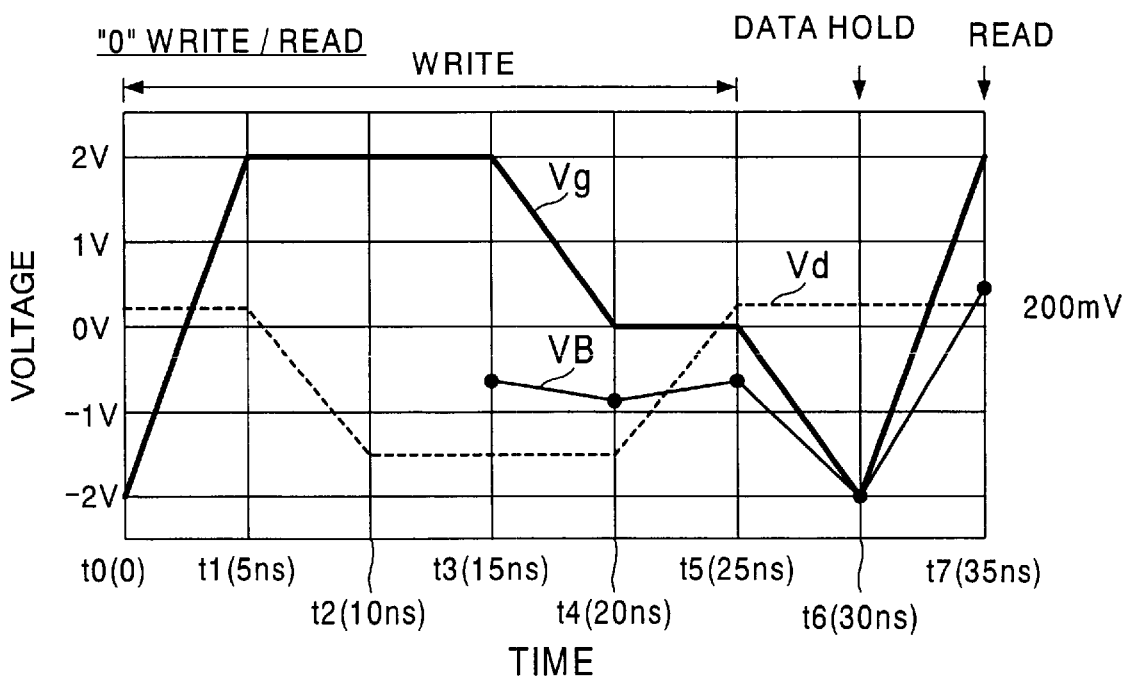
FIG. 16 is a diagram showing a change in a channel body potential by a simulation of "0" write/read operations of the memory cell.
Figure 17:
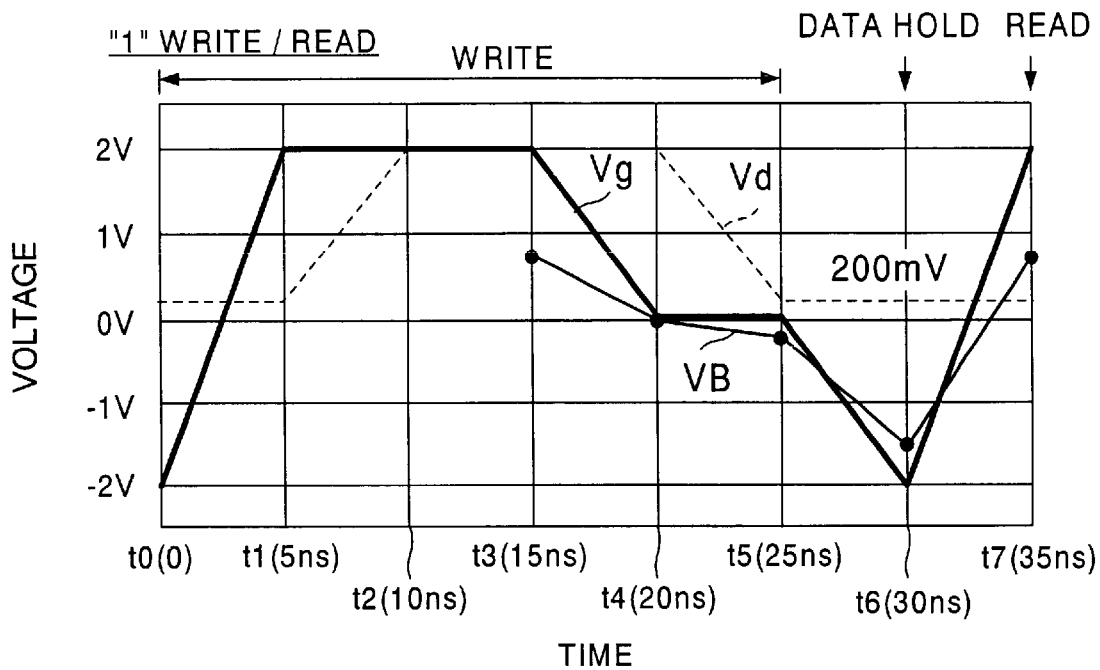
FIG. 17 is a diagram showing a change in body potential by a simulation of "1" write/read operations of the memory cell.

FIG. 16 shows a gate potential Vg, a drain potential Vd, and a channel body potential VB in the "0" data write operation, and the subsequent data hold and data read operations (shown at a moment respectively). FIG. 17 similarly shows the gate potential Vg, the drain potential Vd, and the channel body potential VB in the "1" data write operation, and the subsequent data hold and data read operations (shown at a moment respectively).

Figure 18:
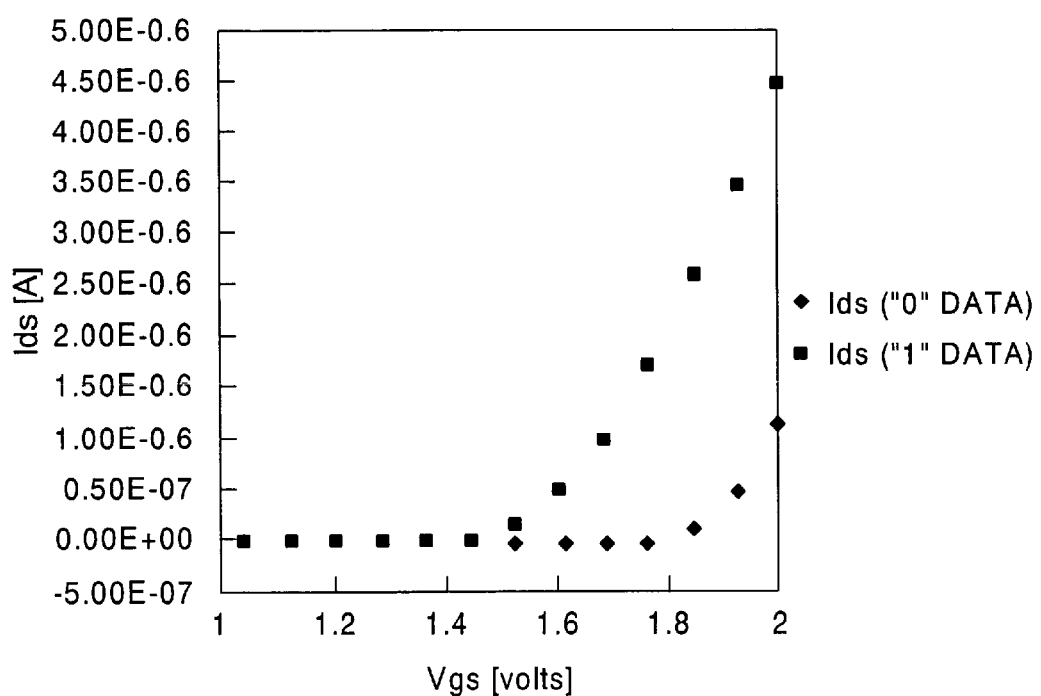
FIG. 18 is a diagram showing a drain current-gate voltage characteristic at the time of the "0" and "1" data read operations according to the simulations.

To look over the threshold voltage Vth0 of the "0" data and the threshold voltage Vth1 of the "1" data in the data read operation between points in time t6 and t7, a drain current Ids and a gate-source voltage Vgs during this period of time are shown in FIG. 18, provided that the relation between a channel width W and a channel length L is W/L=0.175 μm/0.35 μm, and that the drain-source voltage is Vds=0.2 V.

From FIG. 18, a difference ΔVth between the threshold voltage Vth0 of the "0" write cell and the threshold voltage Vth1 of the "1" write cell is ΔVth=0.32 V. From the above analysis, the problem is that in FIG. 16 and FIG. 17, the channel body potential immediately after the "0" write operation (at the point in time t3) is VB=−0.77, the channel body potential immediately after the "1" write operation is VB=0.85 V, and the difference between them is 1.62 V, while in the data hold state (at the point in time t6), the channel body potential of the "0" write cell is VB=−2.04 V, the channel body potential of the "1" write cell is VB=−1.6 V, and the difference between them is 0.44 V, which is smaller than that immediately after the write operation.

Due to two factors, the difference in body potential between data in the subsequent data hold state becomes smaller, compared with the difference immediately after the write operation as described above.

One factor is that capacitive coupling from the gate to the channel body differs depending on data. Immediately after the "0" write operation (t3 to t4), the drain is at −1.5 V, while immediately after the "1" write operation, the drain is at 2 V. Accordingly, when the gate potential Vg is lowered thereafter, in the "1" write cell, the channel easily disappears, the gate-body capacitance becomes manifest, and holes are gradually accumulated in the channel body, whereby the capacitance increases. Meanwhile, in the "0" write cell, the channel does not disappear easily, and the gate-body capacitance does not become manifest.

If the drain potential is reset at 200 mV before the gate potential is lowered, the aforementioned unbalance seems to be eliminated. In this case, however, in the cell where the "0" write operation is performed, the drain potential increases while the channel is formed, and a current due to a triode operation flows. The channel body potential which has been decreased by the "0" write operation increases by capacitive coupling of the n-type drain and the channel inversion layer, and the p-type body, and this is undesirable.

The other factor is that the channel body potential is influenced by the capacitance of the pn junction between the source or the drain and the channel body between the points in time t4 and t5 after the write operation, which operates to reduce the amounts of signals of the "0" and "1" data.

Therefore, to the aforementioned basic memory cell, a gate (a second gate) to potentially control the channel body by capacitive coupling is added separately from a gate (a first gate) to control the formation of the channel. To secure the capacitance between the second gate and the channel body, the same conductive type high concentration region as the channel body is formed on a surface on the second gate side so that an accumulation state is maintained without a channel inversion layer being formed thereon. The second gate is driven in synchronization with the first gate, for example, at a potential lower than or equal to the first gate. Alternatively, the second gate may be fixed, for example, at a reference potential given to the source or a potential lower than the reference potential (a negative potential in case of the n-channel).

Concrete embodiments will be explained below.

[First Embodiment]

Figure 19A:
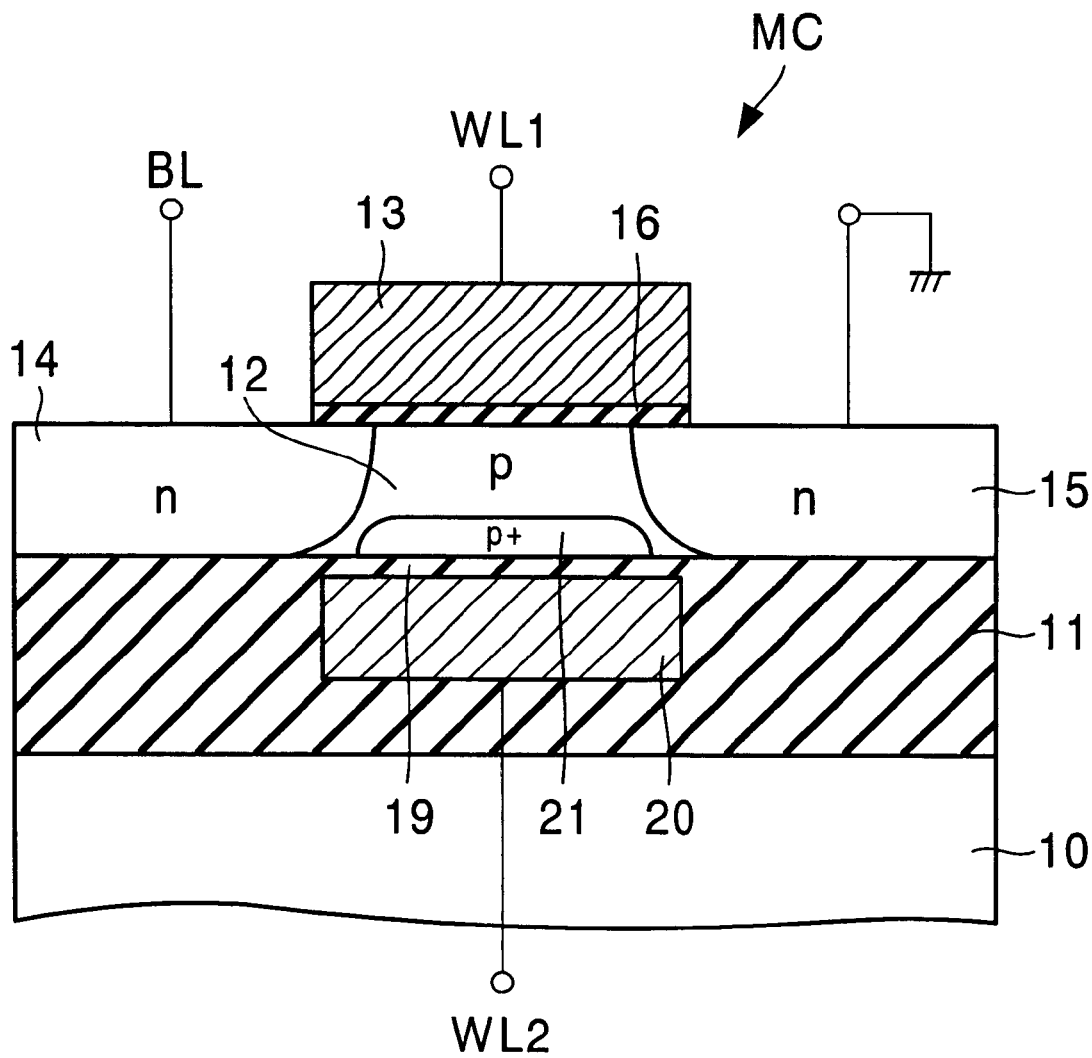
FIG. 19A is a sectional view showing the structure of a memory cell according to a first embodiment of the present invention.

FIG. 19A shows the structure of a memory cell MC according to a first embodiment of the present invention corresponding to FIG. 1. The basic structure is the same as in FIG. 1, and FIG. 19A is different from FIG. 1 in that a second gate 20 which capacitively couples with the silicon layer 12 while facing it with a gate insulating film 19 therebetween is buried in the oxide film 11 separately from the first gate 13 to control the channel, and in that such a high concentration p$^+$-type layer 21 that the channel inversion layer is not formed is formed on a surface on the second gate 20 side of the silicon layer 12. That is, the p$^+$-type layer 21 is formed in the silicon layer 12, and conductive type of the p$^+$-type layer 21 is the same as that of the silicon layer 12 and impurity concentration of the p$^+$-type layer 21 is higher than that of the silicon layer 12. Since the p$^+$-type layer 21 exits, even when a positive potential is applied to the first gate 13 and the second gate 20 in a write operation, a channel inversion layer is formed in the channel body of the first gate 13 side but a channel inversion layer is not formed in the channel body of the second gate 20 side.

In addition, in the memory cell MC according to this embodiment, the gate insulating film 19 has the same thickness as the gate insulating film 16 on the first gate 13 side.

In the actual configuration of a memory cell array, the memory cells MC shown in FIG. 19A are arranged in a matrix form, the first gates 13 are formed continuously as first word lines WL1, and the second gates 20 are arranged as second word lines WL2 in parallel with the first word lines.

Figure 19B:
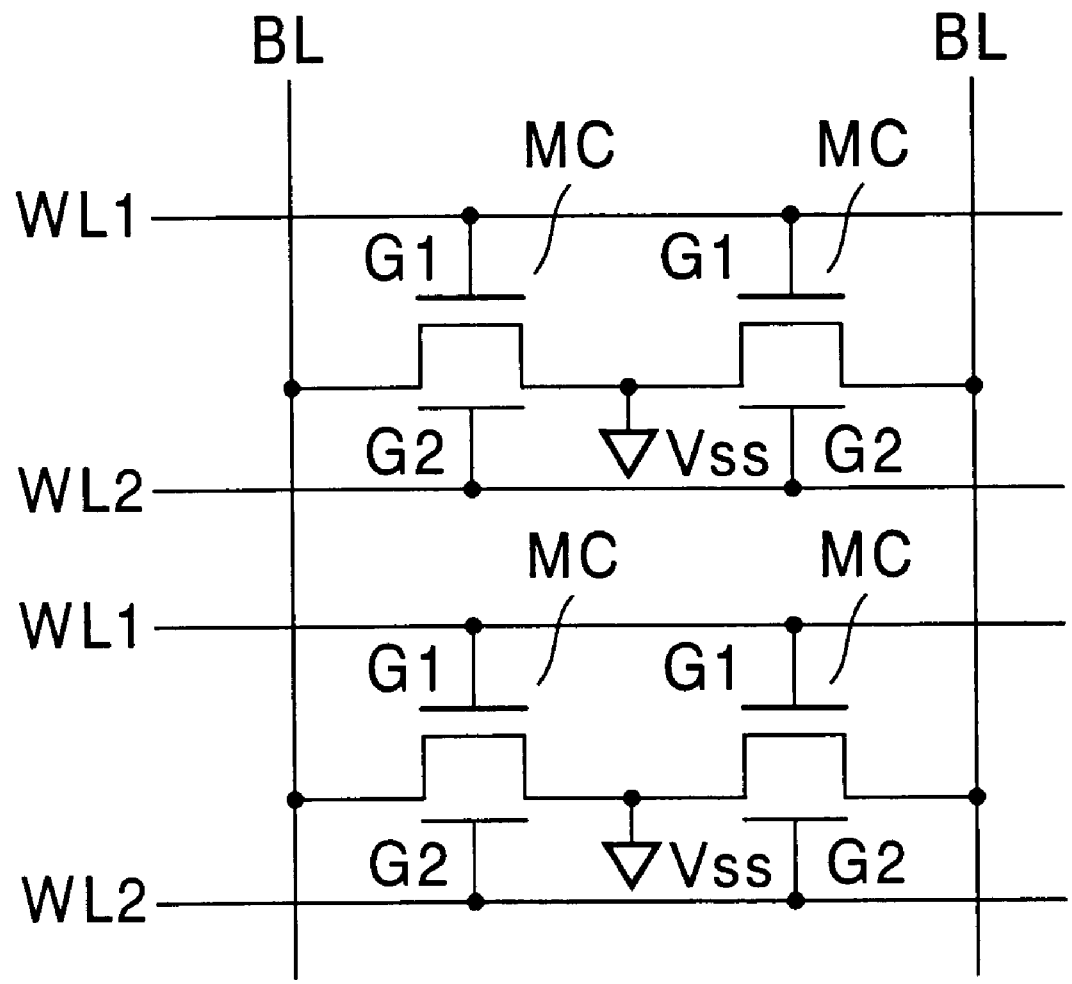
FIG. 19B is a diagram showing an equivalent circuit of a memory cell array in which the memory cells shown in FIG. 19A are arranged in a matrix form.

FIG. 19B shows an equivalent circuit of a memory cell array in which a plurality of such memory cells MC are arranged in a matrix form. The first gates (G1) 13 of a plurality of memory cells MC arranged in one direction are connected to first word lines WL1, and the second gates (G2) 20 are connected to the second word lines WL2. Bit lines BL to which the drains of the memory cells MC are connected are disposed in a direction intersecting these word lines WL1 and WL2. The sources 15 of all the memory cells MC are connected to a fixed potential line (a ground potential line VSS).

Figure 19C:
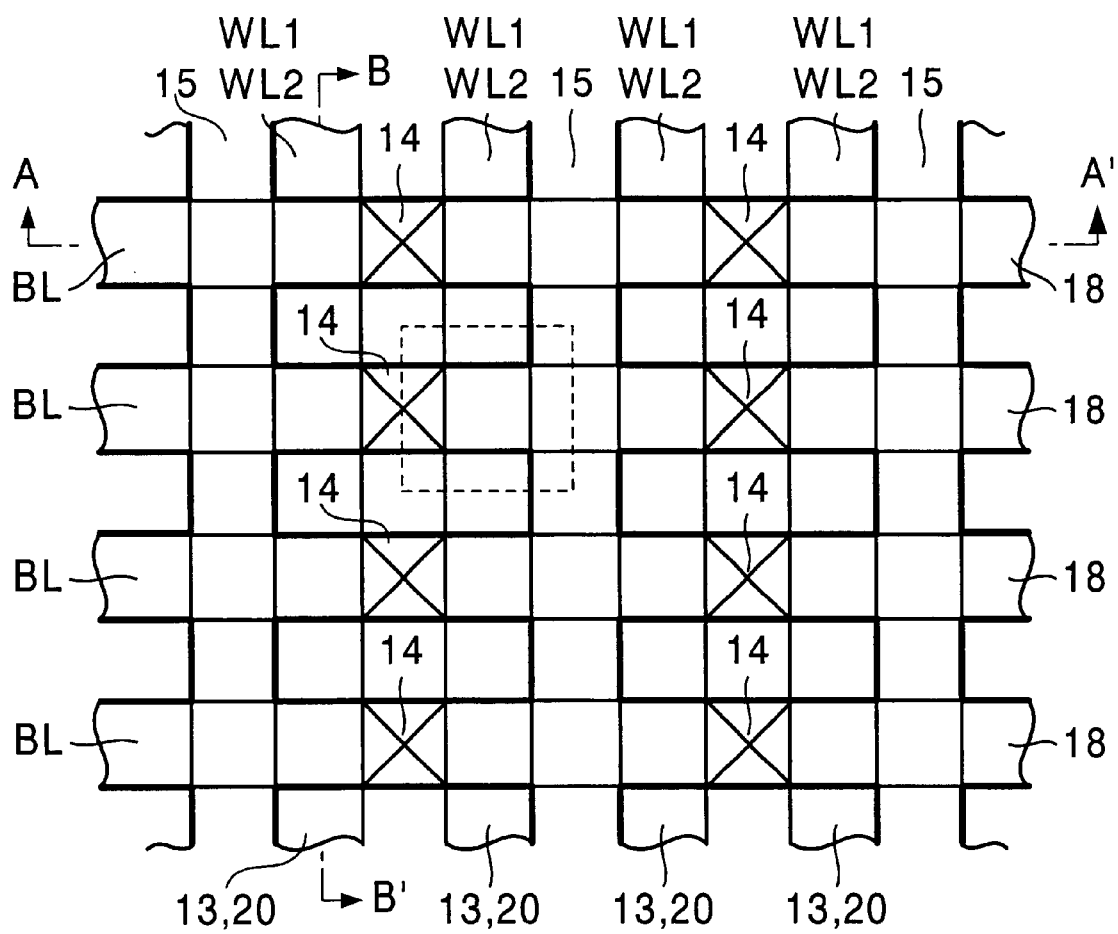
FIG. 19C is a diagram showing a layout of the memory cell array in which the memory cells shown in FIG. 19A are arranged in a matrix form.
Figure 19D:
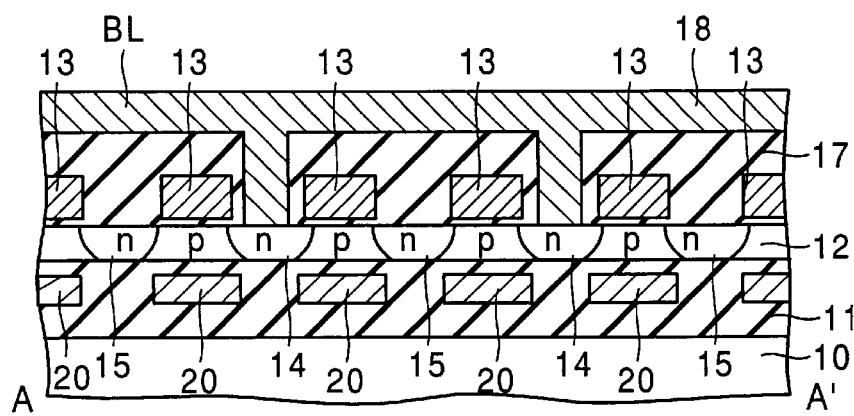
FIG. 19D is a sectional view taken along the line A–A' in FIG. 19C.
Figure 19E:
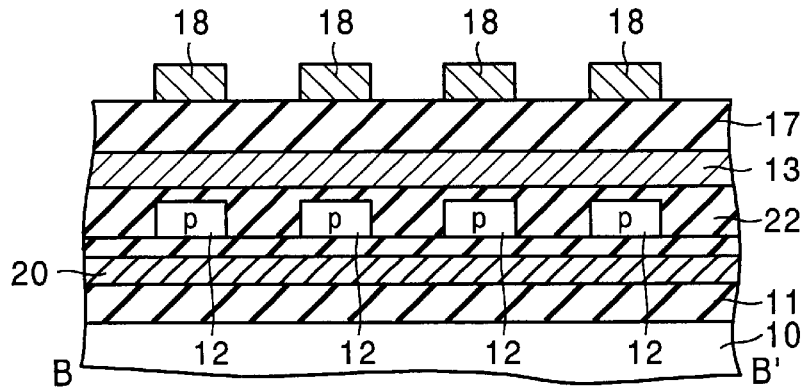
FIG. 19E is a sectional view taken along the line B–B' in FIG. 19C.

FIG. 19C shows the layout of the memory cell array, and FIG. 19D and FIG. 19E respectively show sections taken along the line A–A' and the line B–B' in FIG. 19C. The p-type silicon layer 12 is pattern-formed in a lattice form by burying a silicon oxide film 21 therein. Namely, two transistor regions sharing the drain region 14 are arranged, being element-isolated in the direction of the word lines WL1 and WL2 by the silicon oxide film 21. Alternatively, instead of burying the silicon oxide film 21, element isolation in a crosswise direction may be performed by etching the silicon layer 12. The first gates 13 and the second gates 20 are formed continuously in one direction to constitute the word lines WL1 and WL2. The sources 15 are continuously formed in the direction of the word lines WL1 and WL2 to constitute the fixed potential line (common source line). The transistors are covered with an interlayer dielectric film 17, and bit lines (BL) 18 are formed thereon. The bit lines 18 are disposed to come in contact with the drains 14 each shared by two transistors and intersect the word lines WL1 and WL2.

Thereby, the silicon layers 12, each being a channel body of each transistor, are isolated from each other at their bottom faces and side faces in the channel width direction by the oxide film, and isolated from each other in the channel length direction by pn junction to be maintained in a floating state.

In this memory cell array structure, if the word lines WL and the bit lines BL are formed with a pitch of a minimum feature size F, a unit cell area is $2F \times 2F = 4F^2$ as shown by a broken line in FIG. 19C.

With such a configuration, the same operation as previously explained using the basic memory cell is performed. On this occasion, the second word line WL2 is driven in synchronization with the first word line WL1 at a potential lower than the first word line WL1. By driving the second gate 20 with the first gate 13 as stated above, "0" and "1" data write operations with a great difference in threshold voltage become possible. Namely, while the second gate 20 is maintained at a negative potential in the data hold state and the storage state of the "1" data is maintained satisfactorily, the potential of the second gate 20 is increased at the time of the data write operation so that it is possible to increase the channel body potential by capacitive coupling and ensure the data write operation.

Specifically, a positive potential is applied to the first gate 13 in the "0" write operation and then a channel inversion layer is formed in the channel body on the first gate 13 side. However, when the channel inversion layer is formed, capacitive coupling between the first gate 13 and the channel body becomes weaker due to obstruction of the channel inversion layer. As a result, even though the positive potential is applied to the first gate 13, it is impossible to sufficiently increase the potential of the channel body.

However, in this embodiment, the potential of the channel body can be sufficiently increased by also applying a positive potential to the second gate 20. Because, the p$^+$-type layer 21 is formed, so that the channel inversion layer is not formed in the channel body on the second gate 20 side. Therefore, if a positive potential is applied to the second gate 20, it is possible to sufficiently increase the potential of the channel body by capacitive coupling. In conclusion, it is possible to ensure the "0" write operation.

Data is held by decreasing the potential of the non-selected first word line WL1 at which time the potential of the second word line WL2 making a pair therewith is also decreased to control the channel body potential low, whereby data destruction in the non-selected memory cell which holds the "1" data is certainly prevented when the "0" data write operation is performed in another cell connected to the same bit line. Moreover, there is a fear of data destruction due to surface breakdown or a GIDL current in the non-selected "0" data cell connected to the "1" write bit line, but this fear is dispelled by decreasing the channel body potential by the second word line WL2 in this embodiment.

Further, although a current flows from the source to the bit line when the bit line potential is decreased greatly at the time of the "0" write operation, it is unnecessary to decrease the bit line potential so much in this embodiment since the channel body potential is increased by the second gate 20. For example, it is possible to suppress the current flowing from the source to the bit line with the bit line potential being substantially equalized with the reference potential of the source.

At the time of the data read operation, a triode operation is necessary so as not to mistakenly perform the "1" write operation. For this reason, the bit line potential is lower than that at the time of the "1" write operation, and hence the extension of a depletion layer between the drain and the channel body is smaller than that at the time of the "1" write operation, leading to an increase in capacitive coupling of the bit line and the channel body. This causes carriers injected into the channel body at the time of the write operation to be capacitively redistributed, resulting in a drop in body potential. In this embodiment, the accumulation state of the majority carriers in the channel body can be maintained satisfactorily by being controlled by the second gate 20.

In the above explanation, the second gate 20 is driven at a lower potential than the first gate 13, but since the p$^+$-type layer 21 is formed on the surface of the channel body on the second gate 20 side, the channel inversion layer is not formed even if the second gate 20 is driven at the same potential as the first gate 13, and potential control can be performed by large capacitive coupling for the channel body.

The thicknesses of the gate insulating film 16 on the first gate 13 side and the gate insulating film 19 on the second gate 20 side need not be the same, but can be optimally set respectively depending on the size of required capacitive coupling.

Moreover, the first gate 13 and the second gate 20 respectively face the upper and the lower face of the silicon layer in this embodiment, but they may face the same face. Specifically, by disposing the first gate and the second gate integrally and forming a high concentration region to prevent forming the channel inversion layer in a part of a channel region, the same operation as in the aforementioned embodiment becomes possible. On the other hand, the first gate and the second gate can be disposed separately on the same face of the silicon layer.

Figure 19F:
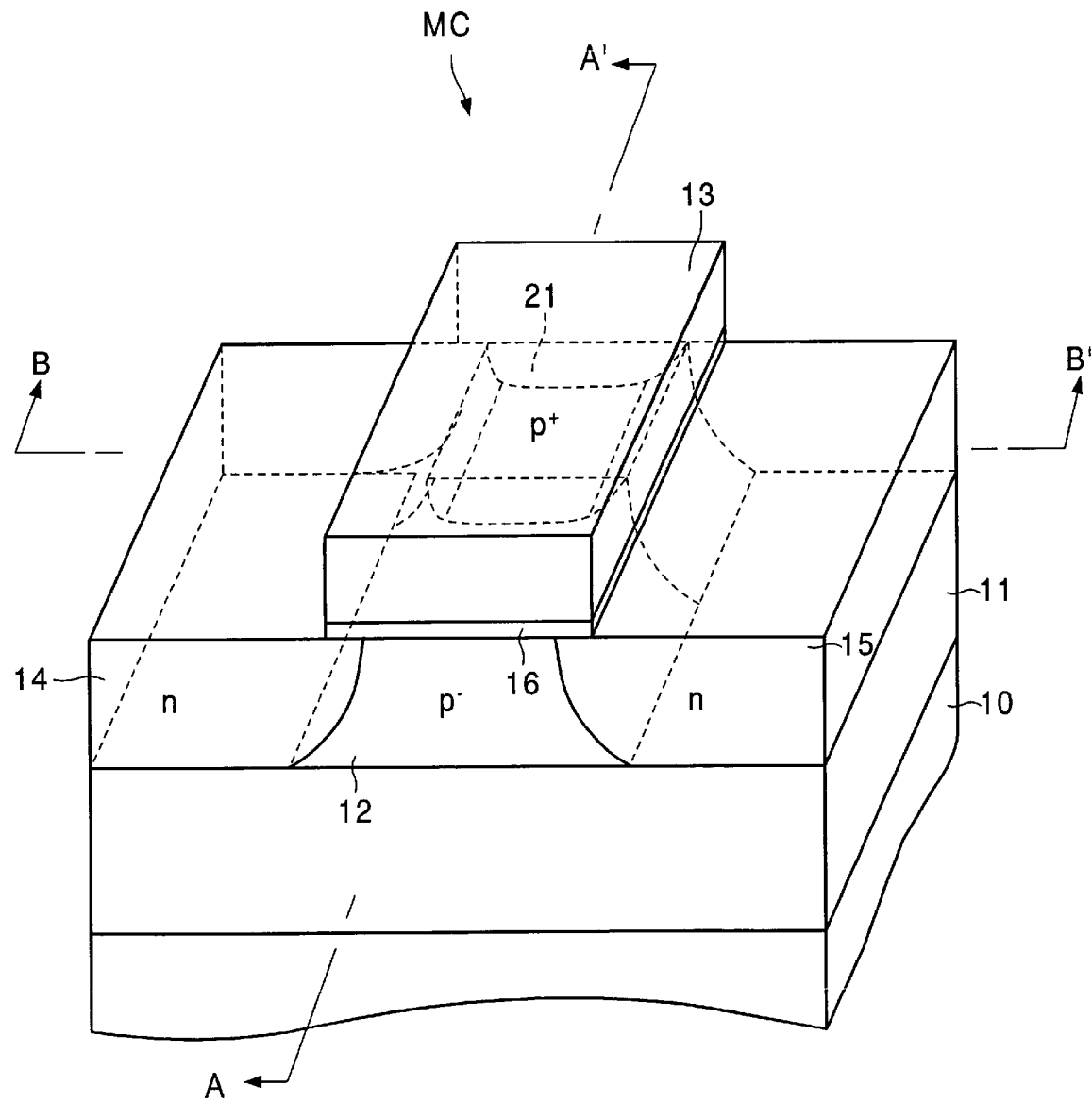
FIG. 19F is a perspective view of a memory cell according to a modified example of the first embodiment.
Figure 19G:
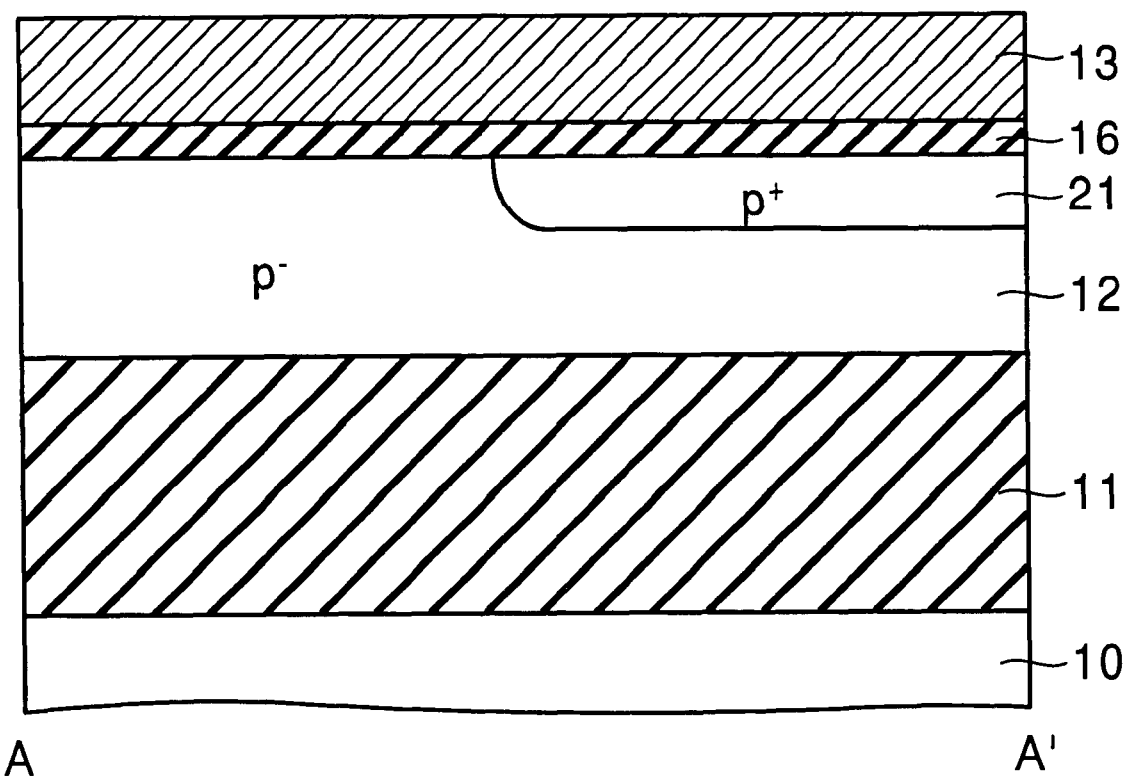
FIG. 19G is a sectional view of the memory cell taken along the line A–A' in FIG. 19F.
Figure 19H:
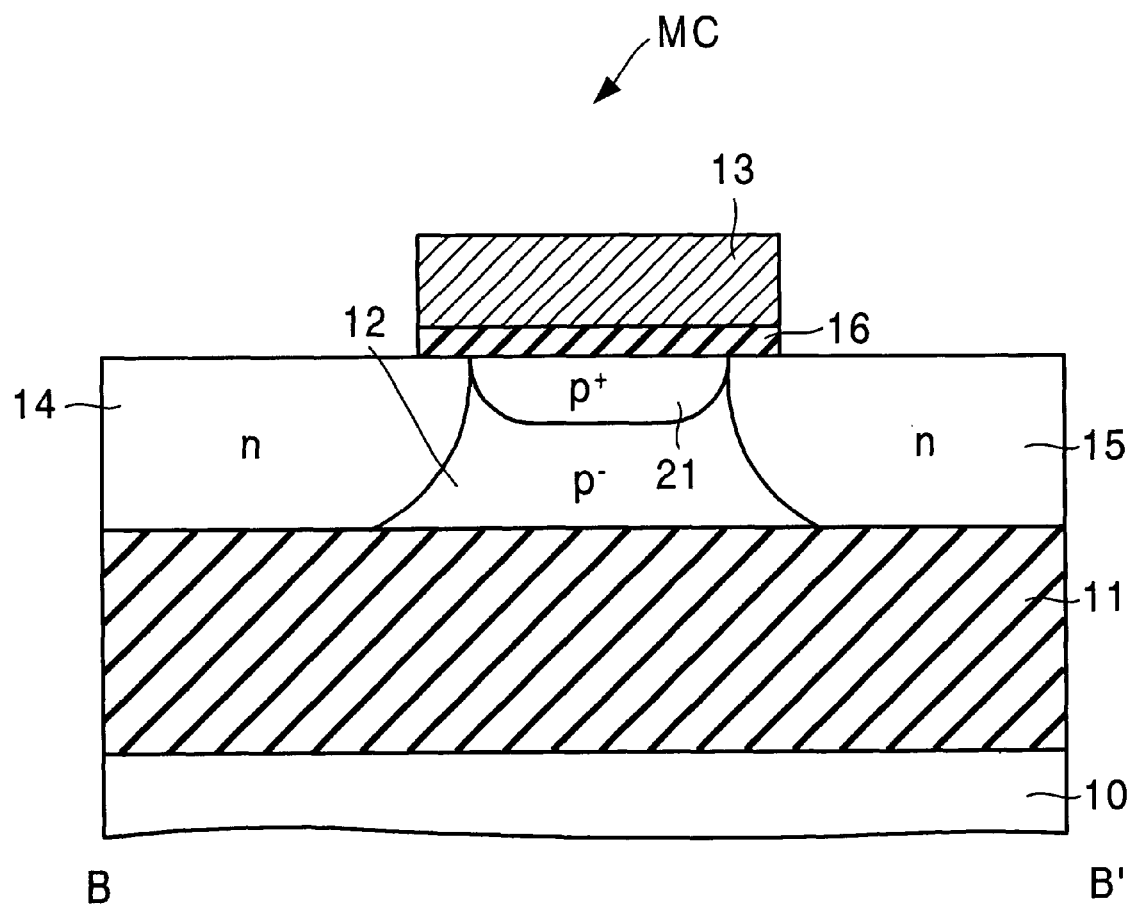
FIG. 19H is a sectional view of the memory cell taken along the line B–B' in FIG. 19F.

FIG. 19F is a perspective view of a memory cell MC in which the first gate 13 and the second gate 20 are formed integrally, FIG. 19G is a sectional view taken along the line A–A' in FIG. 19F and FIG. 19H is a sectional view taken along the line B–B' in FIG. 19F.

As can be understood from these drawings, the second gate 20 is not formed but the first gate 13 has the same function as the second gate 20 in this example. For this purpose, a high concentration p$^+$-type layer 21 is formed in a half region of a surface of the silicon layer 12. That is, the silicon layer 12 is formed as a p$^-$-type region having low impurity concentration and the p$^+$-type layer 21 is formed as a p$^+$-type region having impurity concentration higher than the silicon layer 12 in this example.

The p$^+$-type layer 21 is formed in approximately half region of the silicon layer 12 in plan view. Depth of the p$^+$-type layer 21 reaches a position between the gate insulating film 19 and the oxide film 11. Alternately, it can reach the oxide film 11. Forming size of the p$^+$-type layer 21 is free as long as the channel inversion layer is not formed when the first gate 13 is driven and the channel body can be controlled by large capacitive coupling.

Figure 19I:
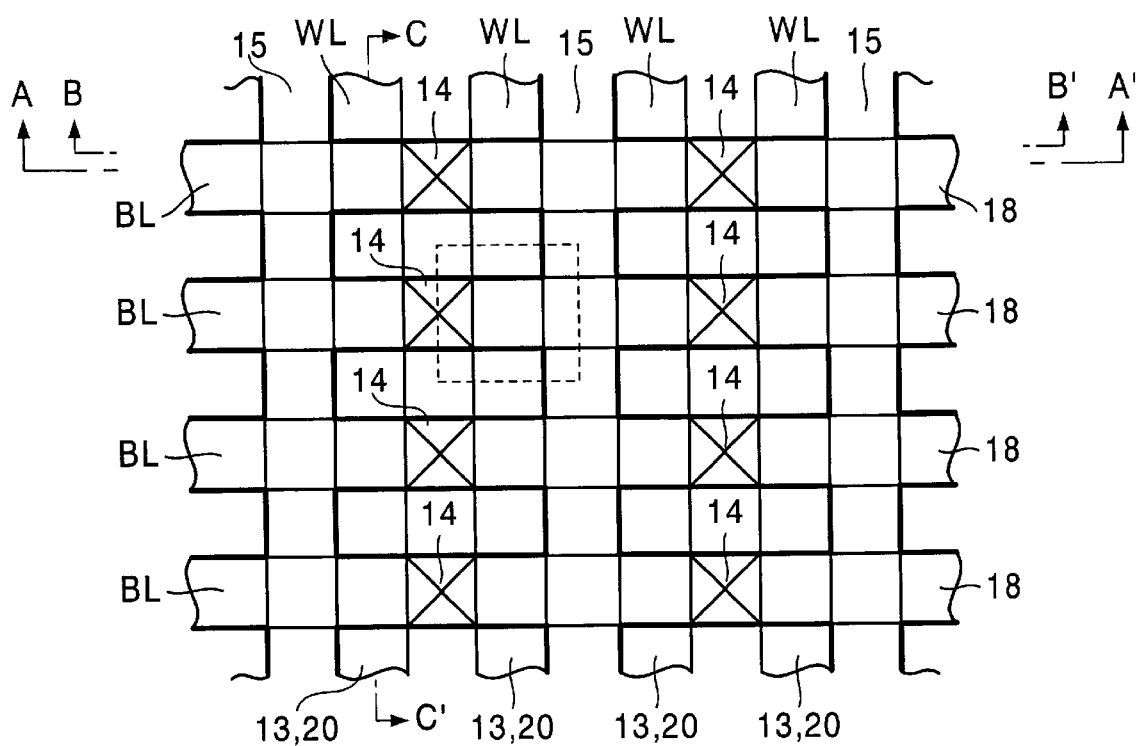
FIG. 19I is a diagram showing a layout of a memory cell array in which the memory cells shown in FIG. 19F are arranged in a matrix form.
Figure 19J:
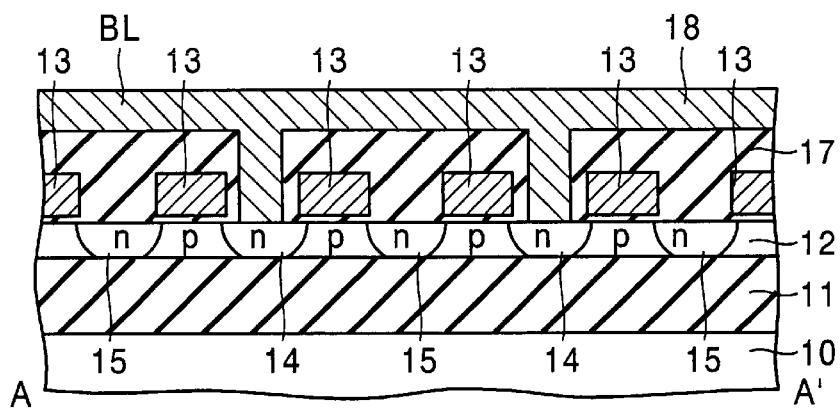
FIG. 19J is a sectional view taken along the line A–A' in FIG. 19I.
Figure 19K:
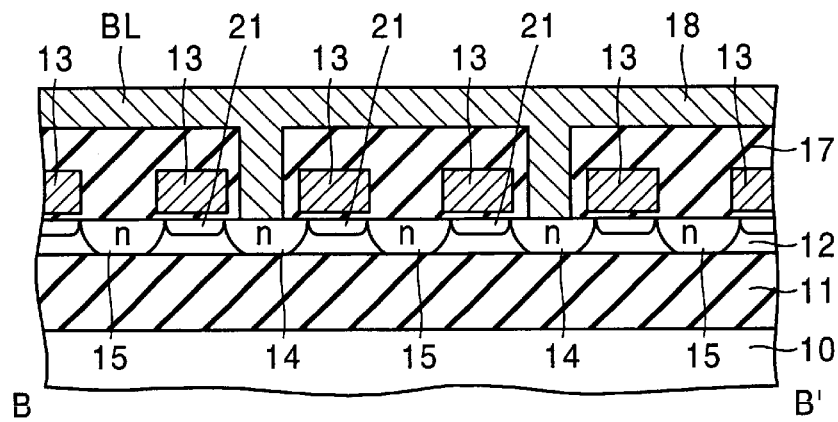
FIG. 19K is a sectional view taken along the line B–B' in FIG. 19I.
Figure 19L:
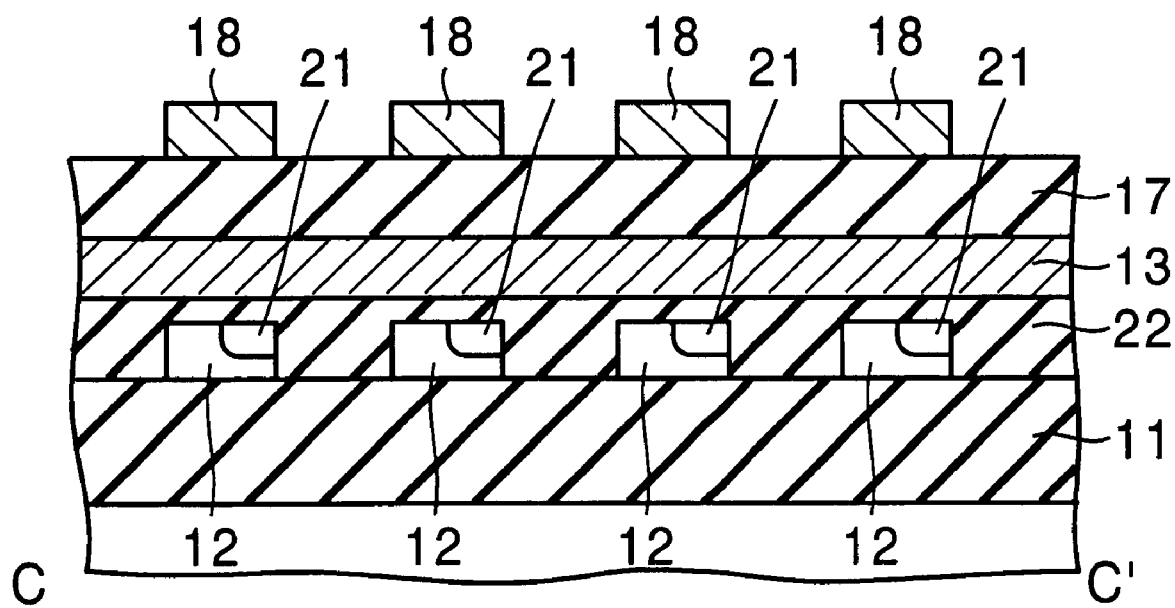
FIG. 19L is a sectional view taken along the line C–C' in FIG. 19I.

FIG. 19I is a diagram showing the layout of a memory cell array in which the memory cells MC shown in FIG. 19F are arranged in a matrix form, by contrast with FIG. 19C. FIG. 19J is a sectional view taken along the line A–A' in FIG. 19I, FIG. 19K is a sectional view taken along the line B–B' in FIG. 19I and FIG. 19L is a sectional view taken along the line C–C' in FIG. 19I.

As can be understood from these drawings, the gates 13 are formed continuously in one direction to constitute the word lines WL. However, the second gates 20 mentioned above do not exist in this example, so that the second word lines WL2 are not formed. The bit lines 18 are disposed to be in contact with the drains 14 each shared by two transistors and intersect the word lines WL. The p$^+$-type layer 21 is formed in a part of each channel body of the word line WL side between the drain 14 and source 15.

In addition, as shown in FIG. 19H, the p$^+$-type layer 21 is in contact with both the drain region 14 and the source region 15 in a direction of the sectional line B–B' in this memory cell MC. However, the p$^+$-type layer 21 may be not always in contact with the drain region 14 nor the source region 15.

Figure 19M:
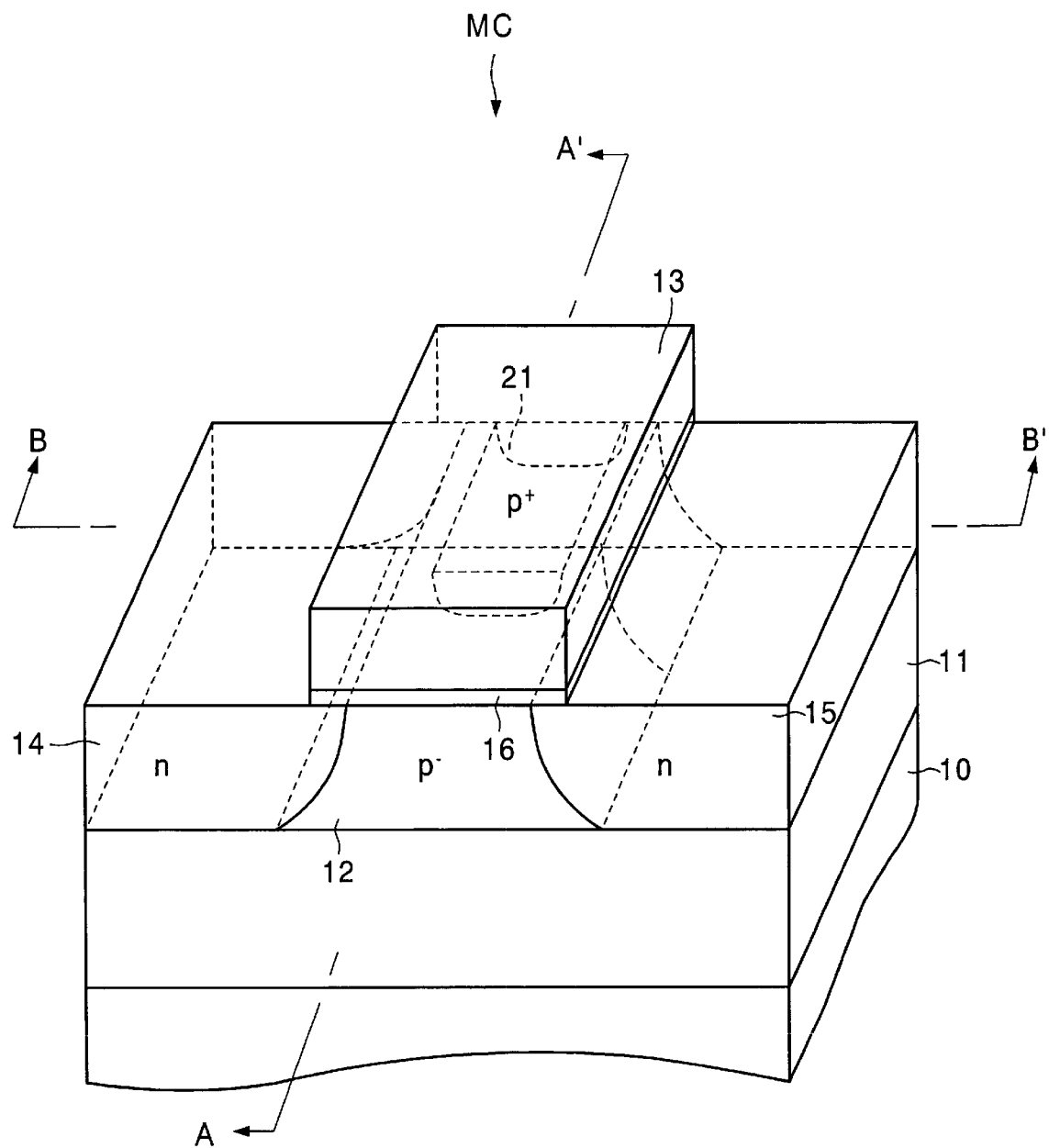
FIG. 19M is a perspective view of a memory cell which is a different modified example according to the first embodiment.
Figure 19N:
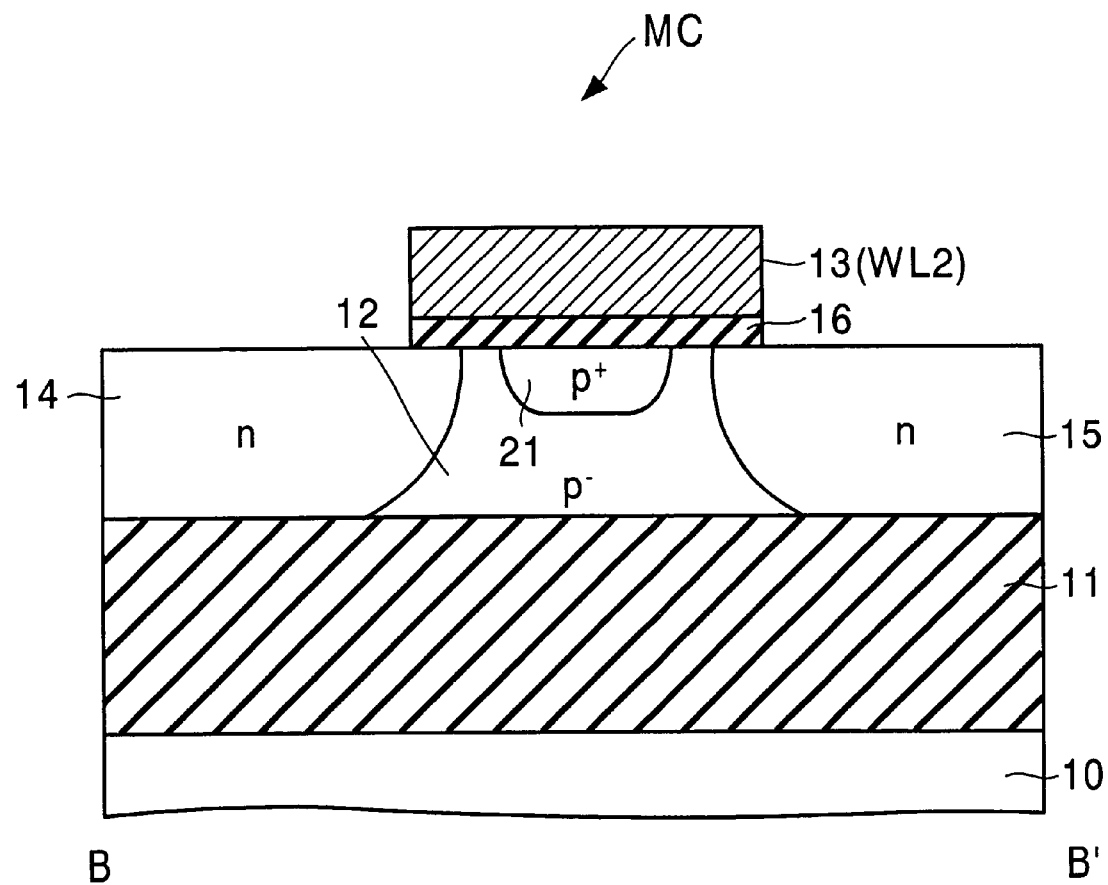
FIG. 19N is a sectional view taken along the line B–B' in FIG. 19M.

FIG. 19M and FIG. 19N show such an example. FIG. 19M is a perspective view of configuration of the memory cell MC, by contrast with FIG. 19F. FIG. 19N is a sectional view taken along the line B–B' in FIG. 19M, by contrast with FIG. 19H. A sectional view taken along the line A–A' is the same as FIG. 19G mentioned above.

As shown in FIG. 19M and FIG. 19N, the p$^+$-type layer 21 is out of contact with the drain region 14 nor the source region 15. As a result of this, it is possible to avoid shortening the retention time of the memory cell MC. More specifically, if the p$^+$-type layer 21 and the n-type drain region 14 and the source region 15 are directly connected to each other, extension of the depletion layer is decreased when a reverse bias is applied to a pn junction. As the strength of the electric field is increased, a leakage current in a pn junction portion is increased, so that the retention time, which is a period for the memory cell MC to be able to hold the data, is shorten.

In contrast to this, by forming the p$^+$-type layer 21 out of contact with the drain region 14 nor the source region 15 as shown in FIG. 19M and FIG. 19N, this situation can be avoided. That is, the retention time becomes longer in comparison with the case where the p$^+$-type layer 21 is in contact with the drain region 14 and the source region 15.

[Second Embodiment]

Figure 20:
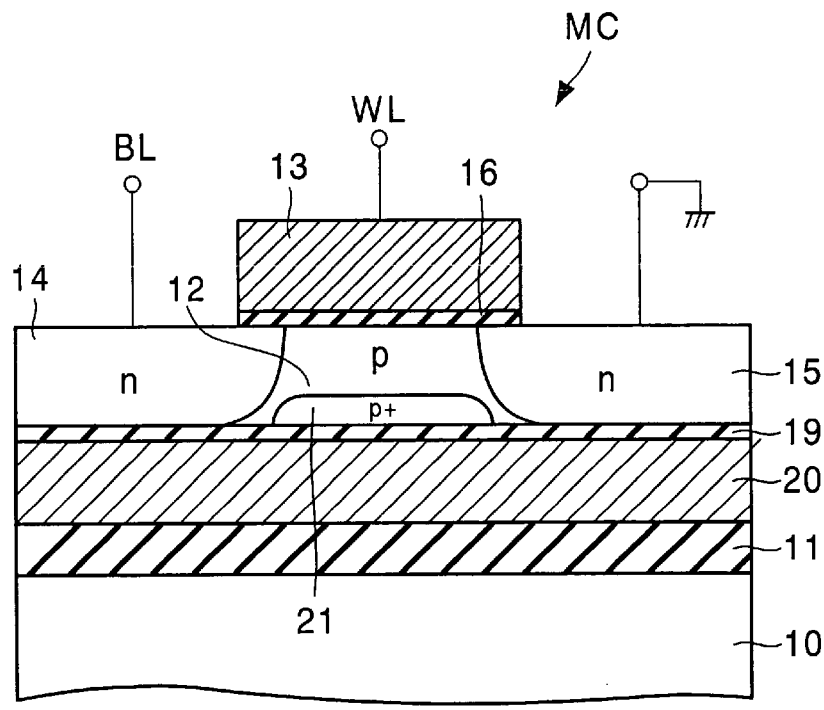
FIG. 20 is a sectional view showing the structure of a memory cell according to a second embodiment of the present invention.

FIG. 20 shows the structure of a memory cell MC according to a second embodiment. Differently from the embodiment in FIG. 19A, in this embodiment, the second gate 20 is disposed as a common gate (back plate) so as to cover the entire cell array region without being patterned as lines. Namely, the second gate 20 is provided for all the MIS transistors in the memory cell array. According to such a structure, the alignment of the second gate 20 with the first gate 13 becomes unnecessary, and the manufacturing process is simplified.

In such a structure, the second gate 20 is fixed, for example, at a potential equal to or lower than a source potential, and the same operation as explained in the preceding basic memory cell is performed. Also in this case, by increasing the amplitude of the first gate 13 (word line WL), a signal difference between the "0" and "1" data can be increased. Namely, when the second gate 20 is capacitively coupled to the channel body at a fixed potential, capacitive coupling from the first gate 13 to the channel body is decreased by capacitive division, compared with the case of the basic memory cell. However, by increasing the driving amplitude of the first gate 13, the potential of the channel body generated by the first gate 13 can be controlled so that there is no great difference between the "0" and "1" data, which makes it possible to increase the difference in threshold voltage between the "0" and "1" data in the data hold state.

[Third Embodiment]

Figure 21:
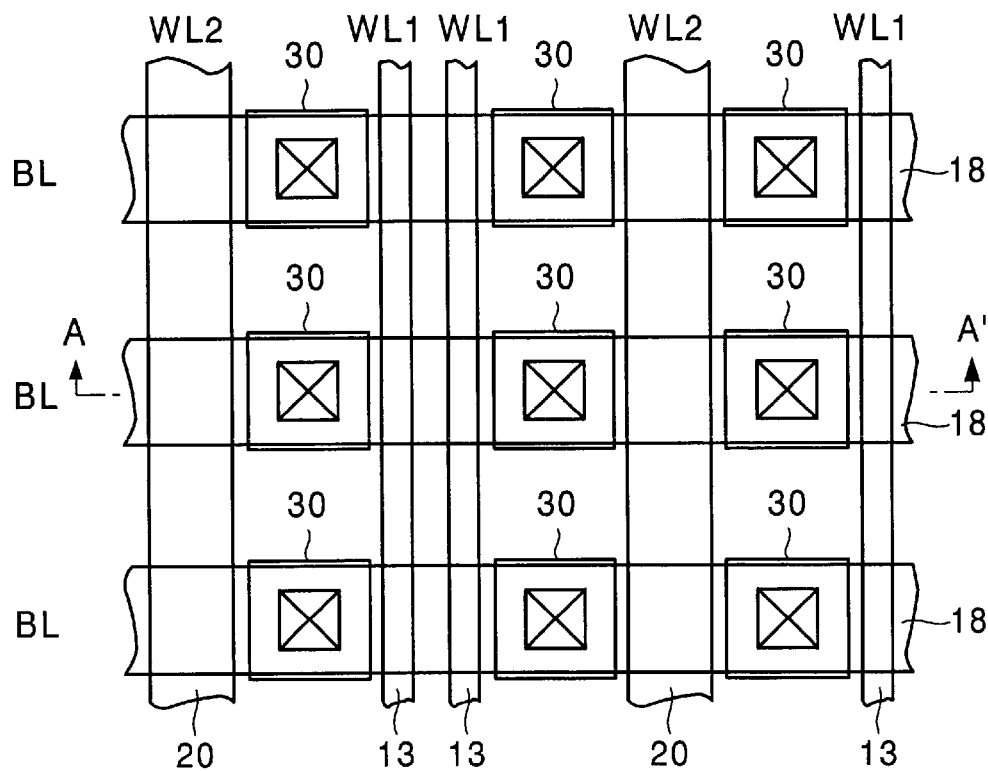
FIG. 21 is a plan view showing a memory cell array according to a third embodiment.
Figure 22:
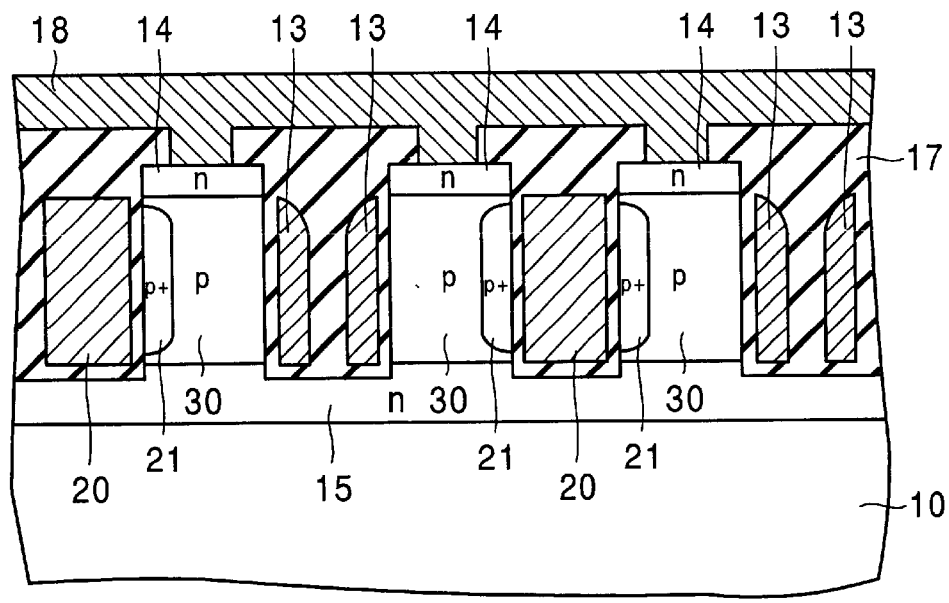
FIG. 22 is a sectional view taken along the line A–A' in FIG. 21.

FIG. 21 shows the layout of a memory cell array according to a third embodiment, and FIG. 22 shows its section taken along the line A–A'. The SOI substrate is used for making a transistor with a floating channel body in the embodiments heretofore, while, in this embodiment, a memory cell is composed of a vertical MIS transistor with a floating channel body by using a so-called SGT (Surrounding GATE Transistor) structure.

In the silicon substrate 10, trenches running lengthwise and crosswise are formed by RIE, and P-type pillar silicon portions 30 are arranged therein. The fist gate 13 and the second gate 20 are formed to face each other on both side faces of each of the pillar silicon portions 30. The first gates 13 and the second gates 20 are buried alternately between the pillar silicon portions 30 in the section in FIG. 22. The first gates 13 are formed isolatedly as independent gate electrodes relative to the adjacent pillar silicon portions 30 between the adjacent pillar silicon portions 30 by sidewall leaving technology. On the other hand, the second gates 20 are buried to be shared between the adjacent pillar silicon portions 30. The first and second gates 13 and 20 are pattern-formed continuously as the first and second word lines WL1 and WL2 respectively.

The n-type drain diffusion regions 14 are formed on top of the pillar silicon portions 30, and the n-type source diffusion region 15 which is shared among all cells is formed at the bottom thereof. The p$^+$-type layer 21 is formed on a side face on the second gate 20 side of each of the pillar silicon portions 30. Thus, memory cells MC in each of which the channel body is composed of a floating vertical transistor are structured. An interlayer dielectric film 17 is formed on the substrate into which the gates 13 and 20 are buried, and the bit lines 18 are disposed thereon.

Also in this embodiment, the same operation as that in the preceding embodiments can be performed. According to this embodiment, it is unnecessary to use the SOI substrate, and hence it becomes possible that only memory cells have floating channel bodies composed of vertical transistors and that ordinary planar transistors are used for peripheral circuits other than the cell array such as a sense amplifier, transfer gates, and row/column decoders. Accordingly, unlike the case where the SOI substrate is used, it is unnecessary to form a contact for fixing the channel body potentials of peripheral circuit transistors in order to eliminate the instability of the circuits due to body floating effects, leading to a reduction in the area of a peripheral circuit portion.

[Fourth Embodiment]

Figure 23:
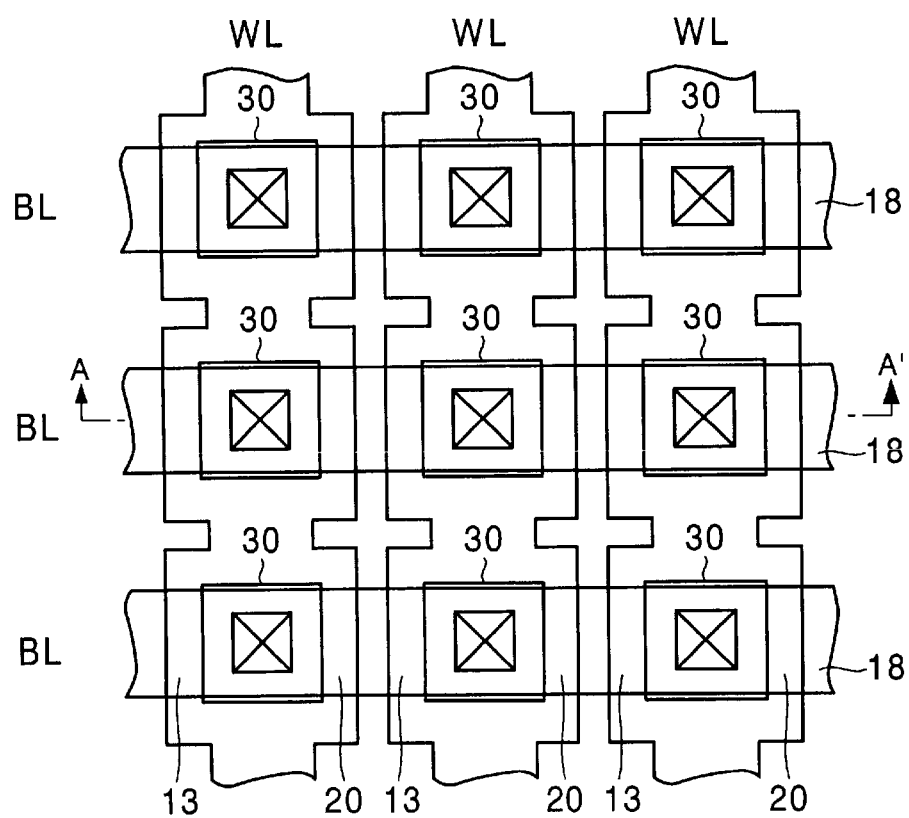
FIG. 23 is a plan view showing a memory cell array according to a fourth embodiment.
Figure 24:
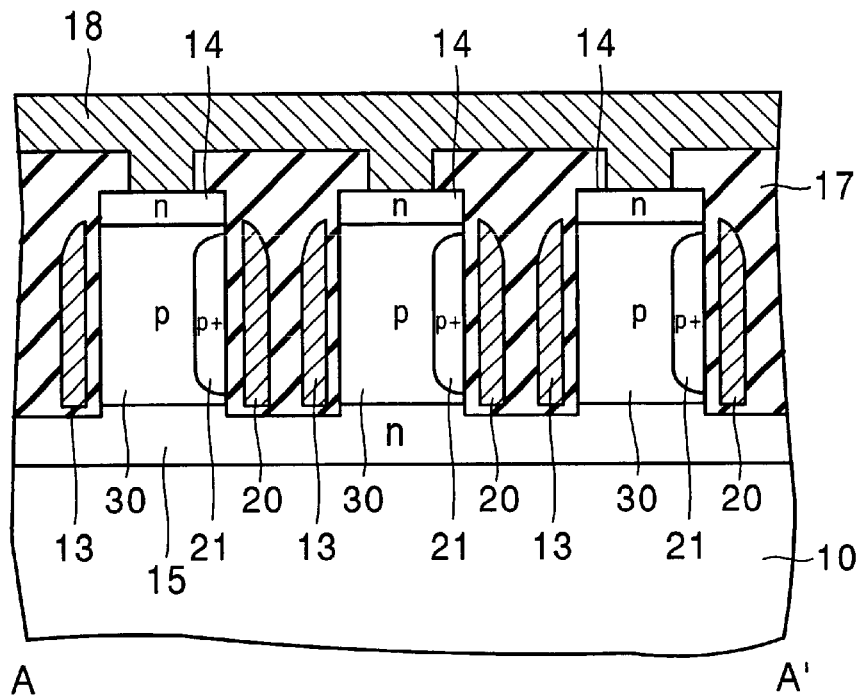
FIG. 24 is a sectional view taken along the line A–A' in FIG. 23.

FIG. 23 and FIG. 24 show the layout of a cell array and its section taken along the line A–A' according to an embodiment in which the same SGT structure as in the third embodiment is used, corresponding to FIG. 21 and FIG. 22. This embodiment is different from the third embodiment in that the gates 13 and 20 integrally surround the pillar silicon portions 30 to be disposed as common word lines WL. On a side face, which the gate 20 faces, of the pillar silicon portion 30, the p$^+$-type layer 21 is formed likewise with the third embodiment.

In this embodiment, the gates 13 and 20 are driven integrally as the word line WL at the same potential. On the gate 20 side, the p$^+$-type layer 21 is provided, and therefore a channel inversion layer is not formed, whereby the word line WL can be coupled to the channel body with a great capacitance and control the potential of the channel body. The side face on which the p$^+$-type layer 21 is formed is not limited to only one face of the pillar silicon portion 30, but it may be formed on two side face or three side face of the pillar silicon portion 30. In other words, the p$^+$-type layer 21 may be formed on at least one side face of the pillar silicon portion 30.

[Fifth Embodiment]

Figure 25A:
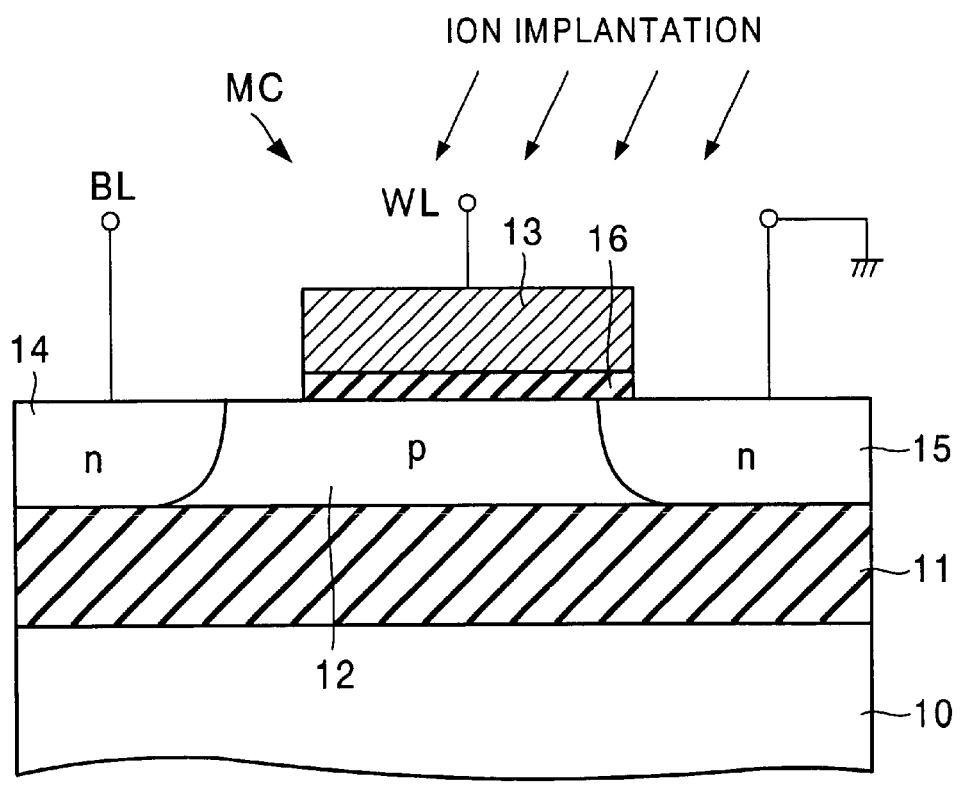
FIG. 25A is a sectional view showing the structure of a memory cell according to a fifth embodiment.

FIG. 25A shows the structure of a memory cell MC according to an embodiment which enables the improvement of reliability of the "0" data write operation corresponding to FIG. 1. A cell structure in this embodiment differs from that in FIG. 1 in that the gate 13 is offset from the drain 14. In other words, the gate 13 is formed on the source region 15 of the channel body side via the gate insulating film 16. That is, an amount of overlap between the gate 13 and the source region 15 is positive. On the other hand, the gate 13 is not formed on the drain region 14. That is, an amount of overlap between the gate 13 and the drain region 14 is negative.

This can be easily realized by changing ion implantation into the drain 14 and the source 15 to oblique ion implantation as shown in FIG. 25A. Alternatively, by performing ordinary ion implantation while a sidewall insulating film is formed on a gate side wall on the drain side only instead of the oblique ion implantation, the same offset structure can be obtained. Other points are the same as in FIG. 1.

In the memory cell according to the preceding embodiments explained above, in the "0" write operation, a forward bias is given between the drain region 14 and the channel body to emit the majority carriers in the channel body to the drain region 14. In this case, in the ordinary transistor structure shown in FIG. 1, a channel inversion layer is formed and becomes a shield layer between the gate 13 and the channel body, and hence capacitive coupling of the channel inversion layer and the channel body is increased. As a result, when the potential of the drain region 14 is returned from a negative potential to 0 V, the channel body potential rises due to the capacitive coupling of the channel inversion layer and the channel body, which brings about a possibility that the "0" write operation can not be performed adequately. Moreover, since the capacitance between the gate 13 and the channel body reduces due to the channel inversion layer, the bit line tends to exert a greater influence. Further, when the channel inversion layer is formed, a channel current (electron current in the case of the n-channel) flows. This channel current is a current unnecessary for the write operation and causes an increase in write electric power, and in addition if impact ionization occurs, it causes a "1" write mode, resulting in a lowering of reliability of the "0" write operation.

Figure 25B:
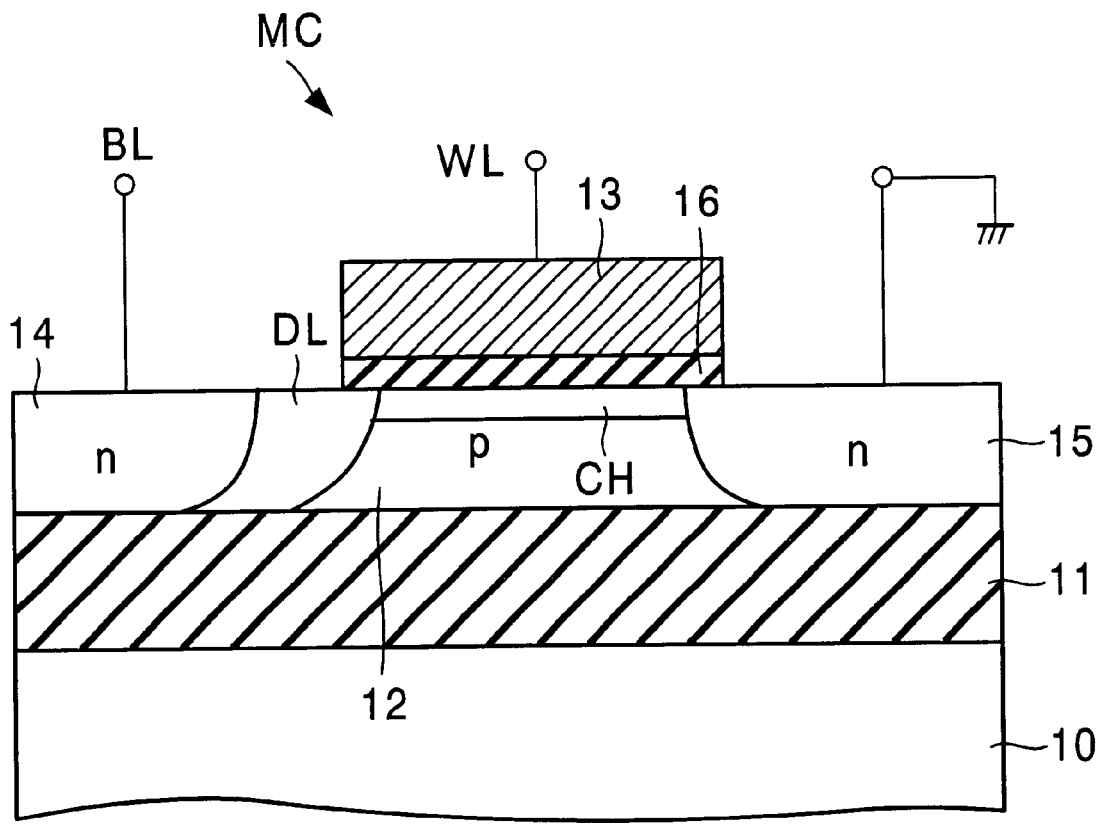
FIG. 25B is a schematic diagram showing a state of the memory cell shown in FIG. 25A in the case where a positive potential is applied to a drain region, a positive potential is applied to a gate and a source is connected to the ground of the memory cell.
Figure 26:
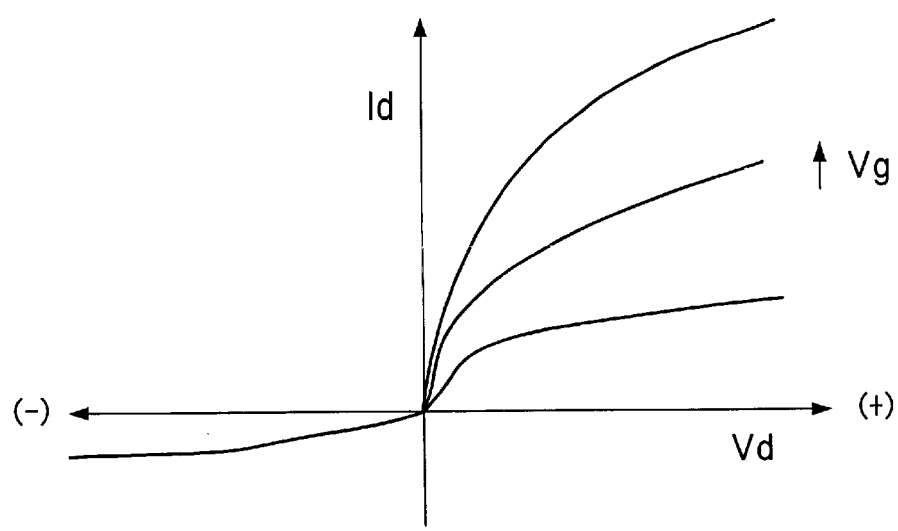
FIG. 26 is a diagram showing characteristics of the memory cell in the embodiment.

Meanwhile, as shown in FIG. 25A, when the offset structure is provided on the drain side, as shown in FIG. 25B, a depletion layer DL extending from the drain region 14 extends to a position directly below the gate 13 in the case of an ordinary transistor operation in which a positive potential is given to the drain region 14 so that the drain junction is in a reverse bias. Therefore, if a positive potential is applied to the gate 13, the channel inversion layer CH is formed between the depletion layer DL from the drain region 14 and the source region 15 and then it is in a situation that a channel current can flow between the drain region 14 and the source region 15. That is, the memory cell MC shown in FIG. 25A normally operates as a MIS transistor as shown in FIG. 26. This FIG. 26 is a graph showing a relation between the voltage Vd applied to the drain region 14 and the current Id which flows between the source and the drain. Moreover, it shows characteristics in the case where the voltage Vg applied to the gate 13 is changed.

Figure 25C:
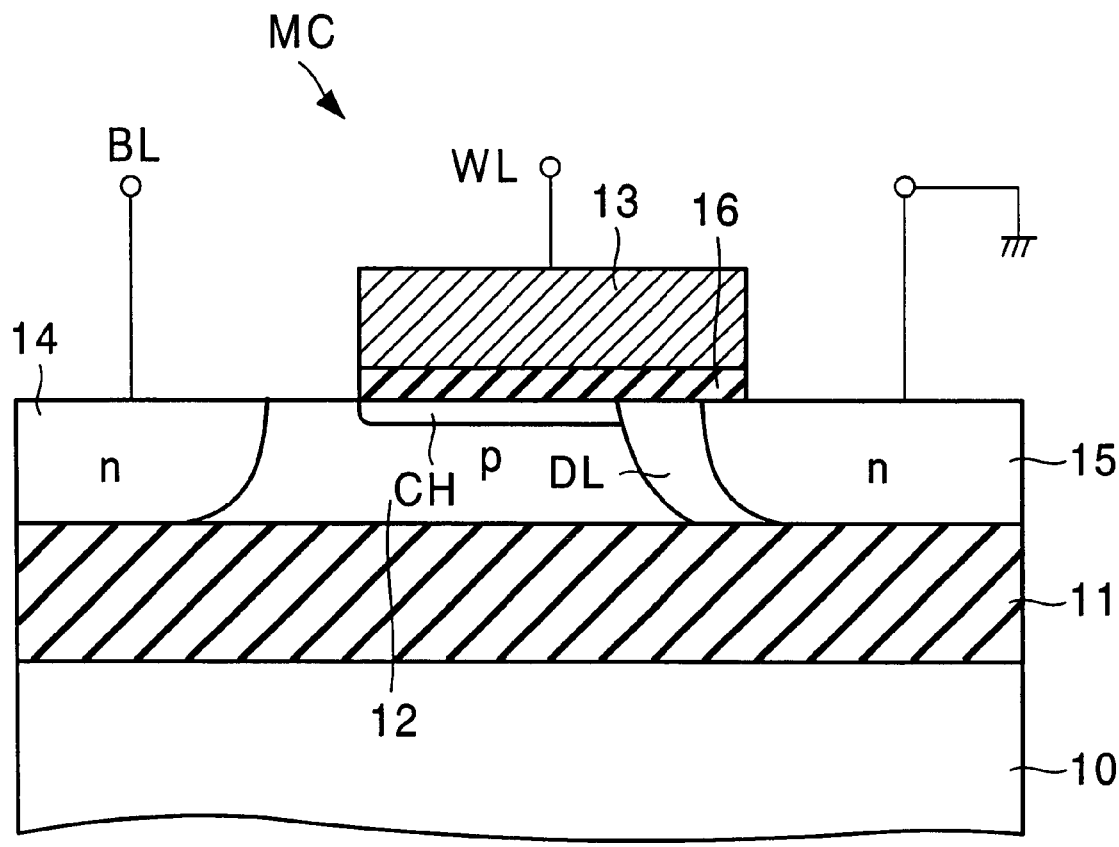
FIG. 25C is a schematic diagram showing a state of the memory cell shown in FIG. 25A in the case where a negative potential is applied to a drain region, a positive potential is applied to a gate and a source is connected to the ground of the memory cell.

However, when a negative potential is given to the drain region 14, the functions of the drain and the source are reversed in the transistor operation, and as shown in FIG. 25C, the depletion layer DL is formed on the source region 15 side and the channel inversion layer CH is formed apart from the source region 14. Consequently, as shown in FIG. 26, the channel current hardly flows between the drain region 14 and the source region 15.

Therefore, according to this embodiment, at the time of the "0" write operation (namely, as shown in FIG. 25C, the forward bias is applied between the drain region 14 and the channel body), an increase in channel body potential due to unnecessary capacitive coupling between the drain region 14 and the channel body is suppressed, whereby a "0" write margin can be increased. Furthermore, at the time of the "0" write operation, it is possible to hold down the unnecessary channel current, reduce a write current passed through the bit line BL, and reduce write electric power.

The case where the current hardly flows in a reverse direction is described above, but by making the channel current have slight asymmetry with a difference of 10% or more, the effects of reducing the current and the like can be obtained similarly. Moreover, the offset structure is provided on the drain region 14 side as one of methods of making the channel current at the time of the reversal of the source/drain asymmetric, and other methods can be adopted to give asymmetry to the channel current in the forward and reverse directions of the source/drain. In other words, the MIS transistor, which has different characteristics between the case where a channel current flows from the source region 15 to the drain region 14 and the case where a channel current flows from the drain region 14 to the source region 15 even when the same potential is applied to the gate 13, is suitable.

[Sixth Embodiment]

Figure 27:
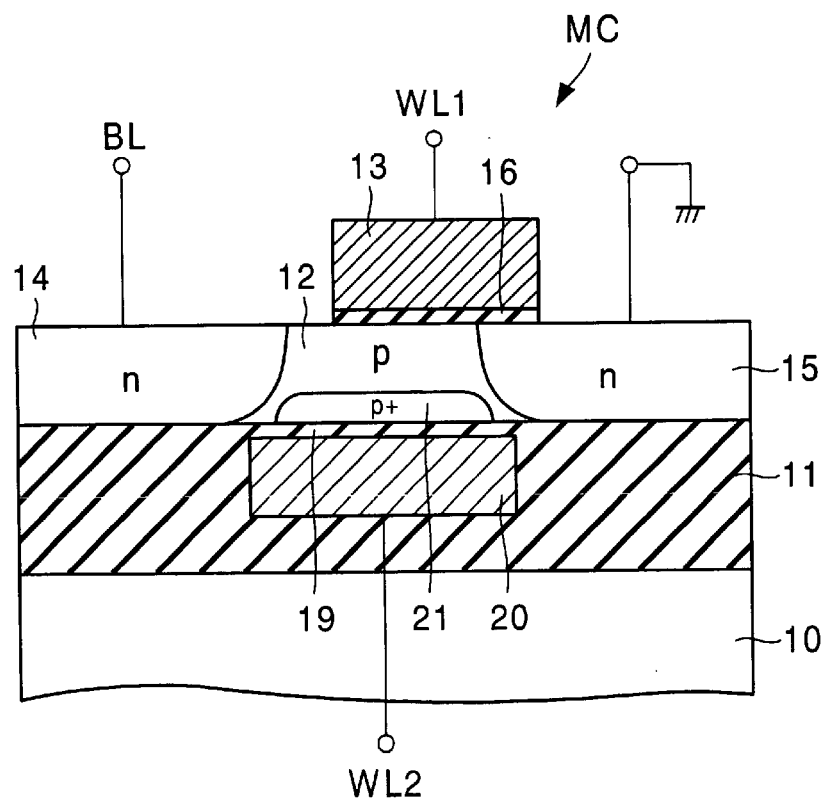
FIG. 27 is a sectional view showing the structure of a memory cell according to a sixth embodiment.
Figure 28:
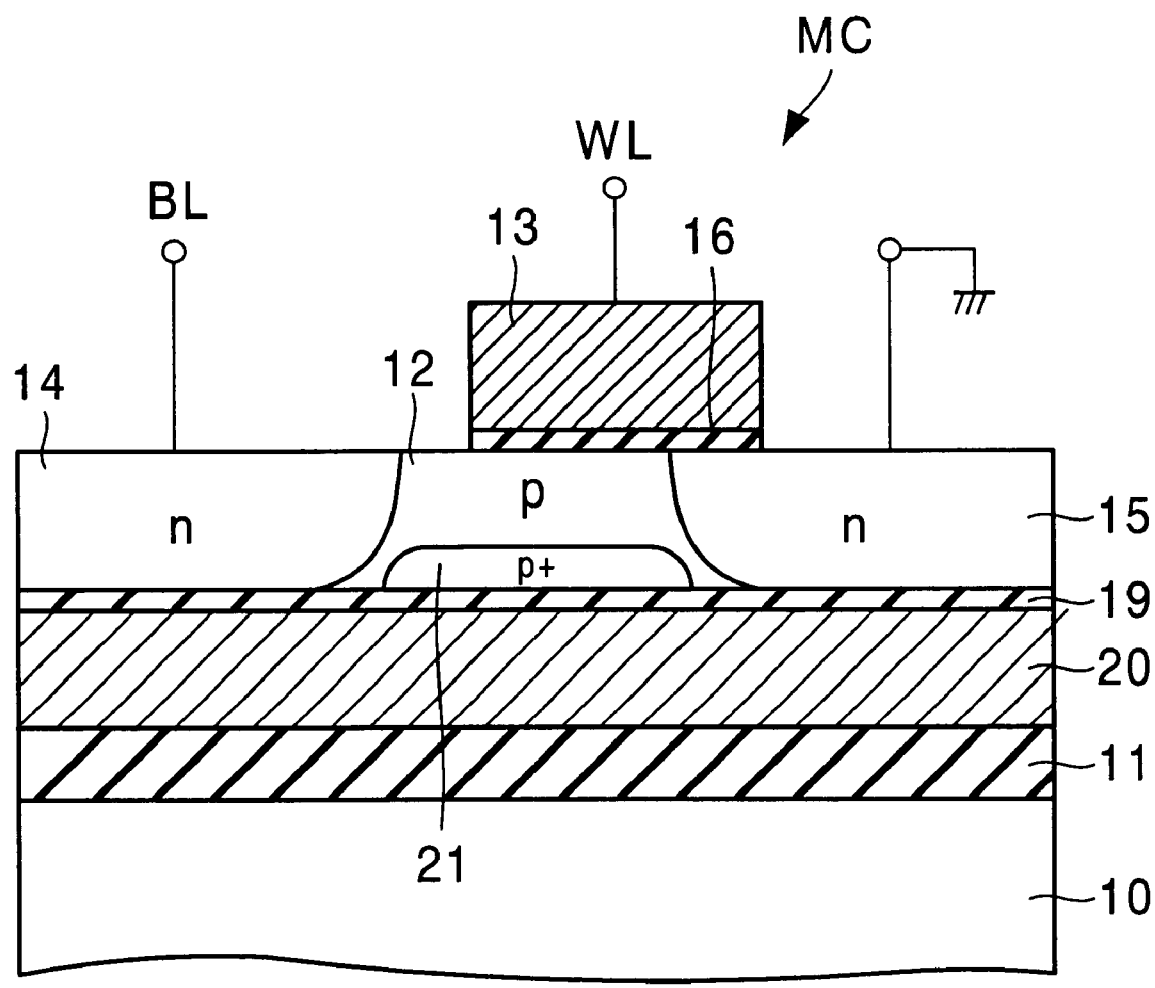
FIG. 28 is a sectional view showing another structure of a memory cell according to the sixth embodiment.

FIG. 27 and FIG. 28 respectively show an embodiment in which a gate offset structure is introduced similarly into the memory cell MC in FIG. 19A and FIG. 20. Also in this embodiment, the unnecessary current at the "0" write operation can be reduced.

Figure 29A:
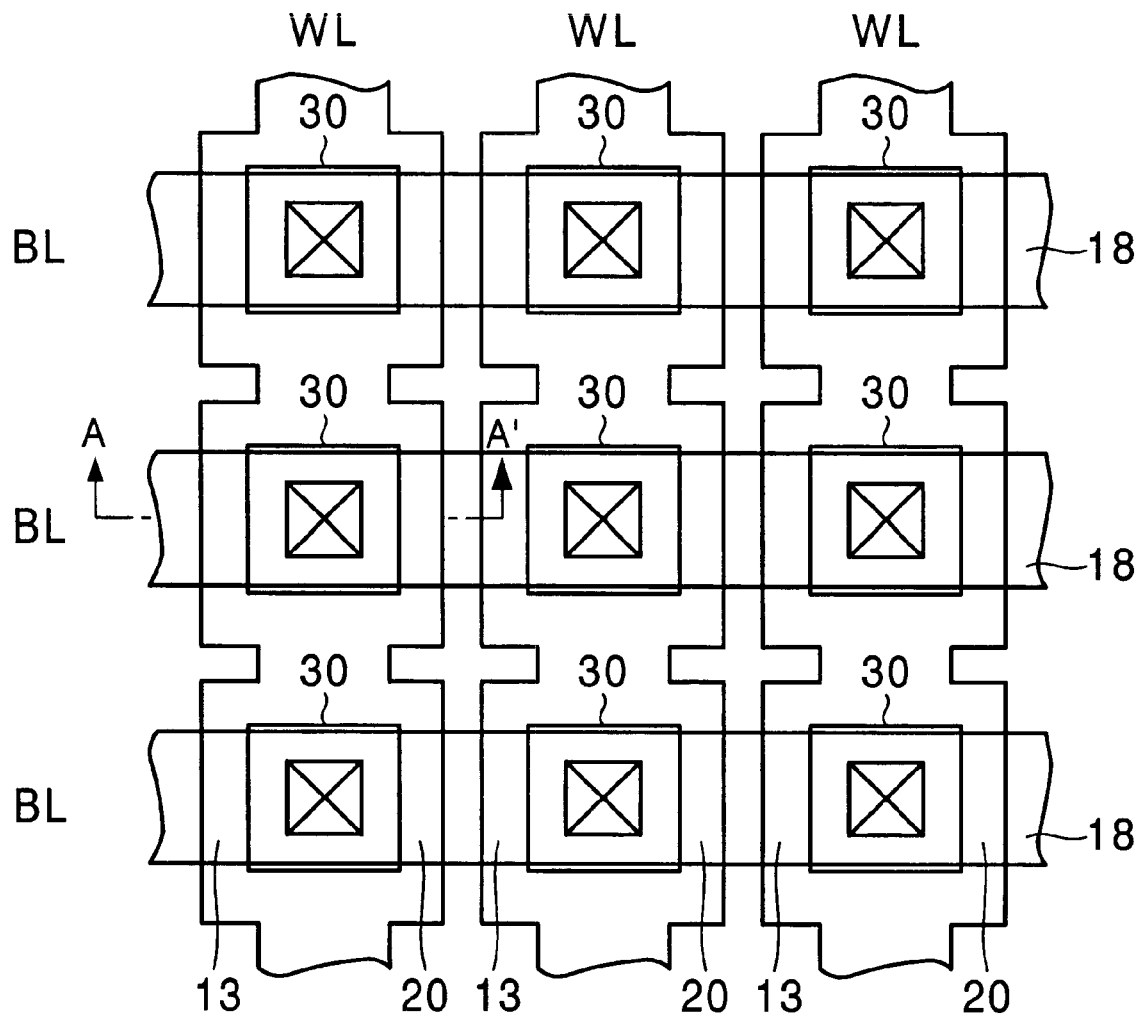
FIG. 29A is a plan view of a memory cell array (the sixth embodiment) in which the gate offset structure is introduced into the memory cells having the SGT structure.
Figure 29B:
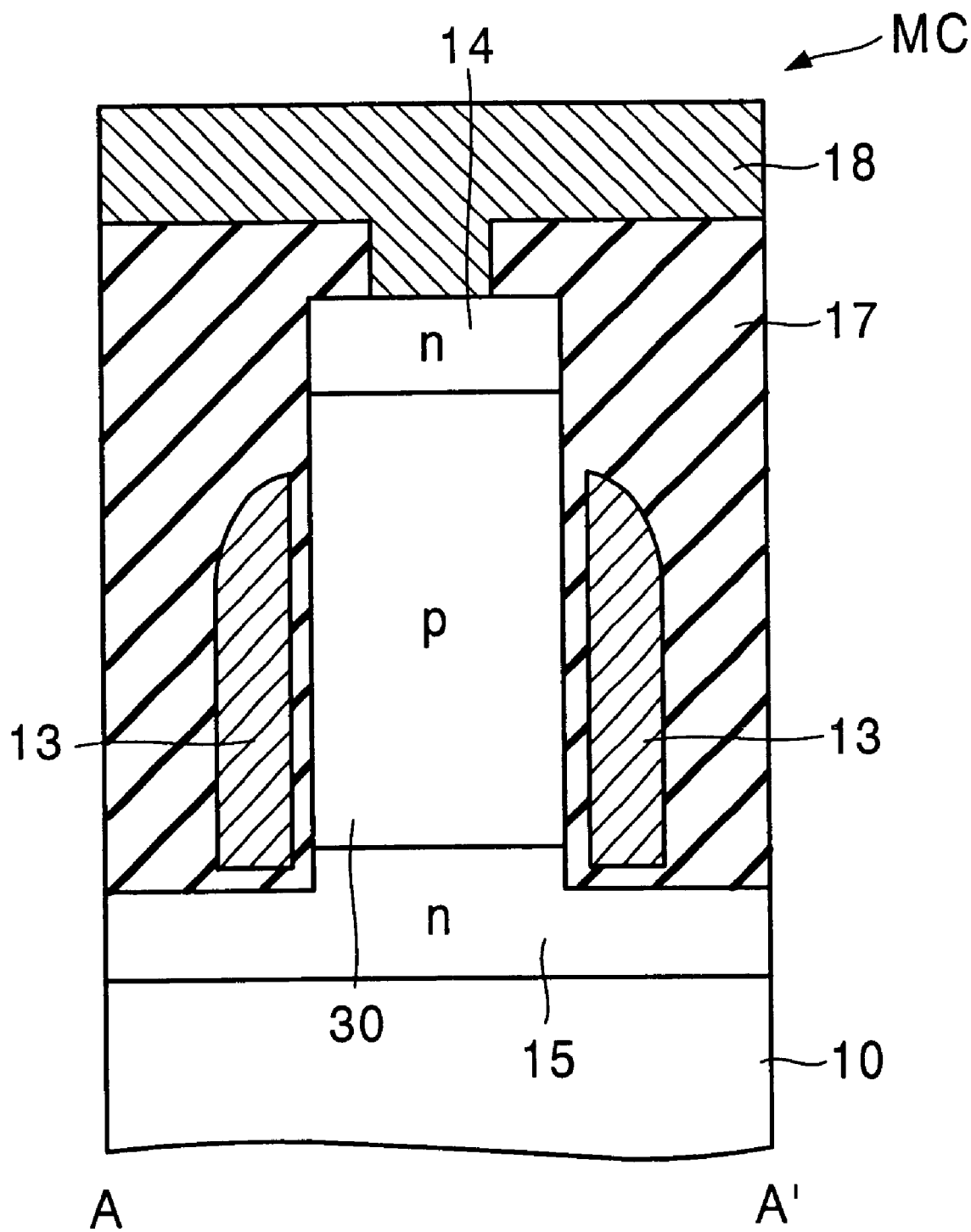
FIG. 29B is a sectional view taken along the line A–A' of the memory cell array in FIG. 29A.

FIG. 29A and FIG. 29B show an embodiment in which the gate offset structure is introduced similarly into the memory cell having the SGT structure. FIG. 29A is a plan view showing a layout of a memory cell array composed of such memory cells and FIG. 29B is a sectional view taken along the line A–A' in FIG. 29A. As shown in FIG. 29A and FIG. 29B, the gate 13 is integral to surround the pillar silicon portion 30. Moreover, the p$^+$-type layer 21 which is the high concentration region is not formed in the pillar semiconductor portion 30.

As shown in FIG. 29B, the gate 13 is formed around the source region 15 of the channel body side in the pillar silicon portion 30 via the gate insulating film. That is, an amount of overlap between the gate 13 and the source region 15 is positive. On the other hand, the gate 13 is not formed around the drain region 14 in the pillar silicon portion 30. That is, an amount of overlap between the gate 13 and the drain region 14 is negative.

Figure 30A:
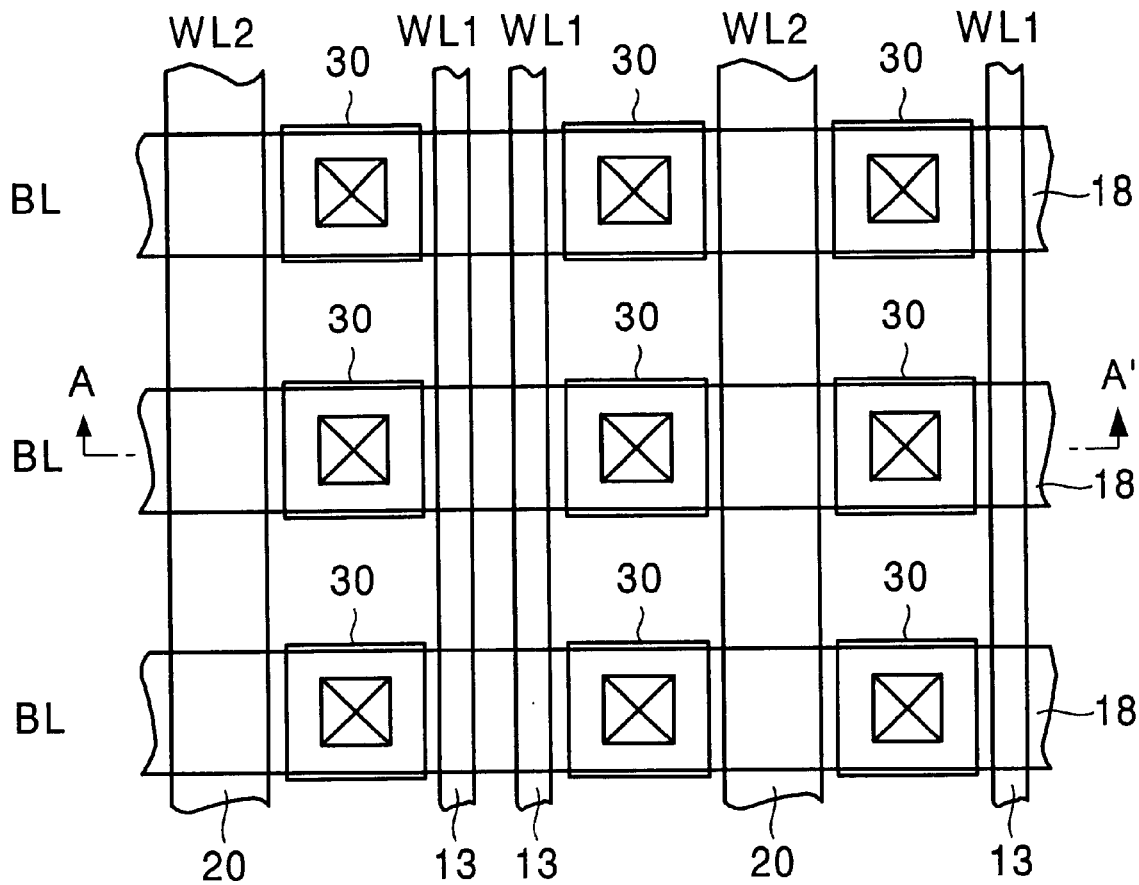
FIG. 30A is a plan view of a memory cell array (the sixth embodiment) in which the gate offset structure is introduced into the memory cells in the third embodiment.
Figure 30B:
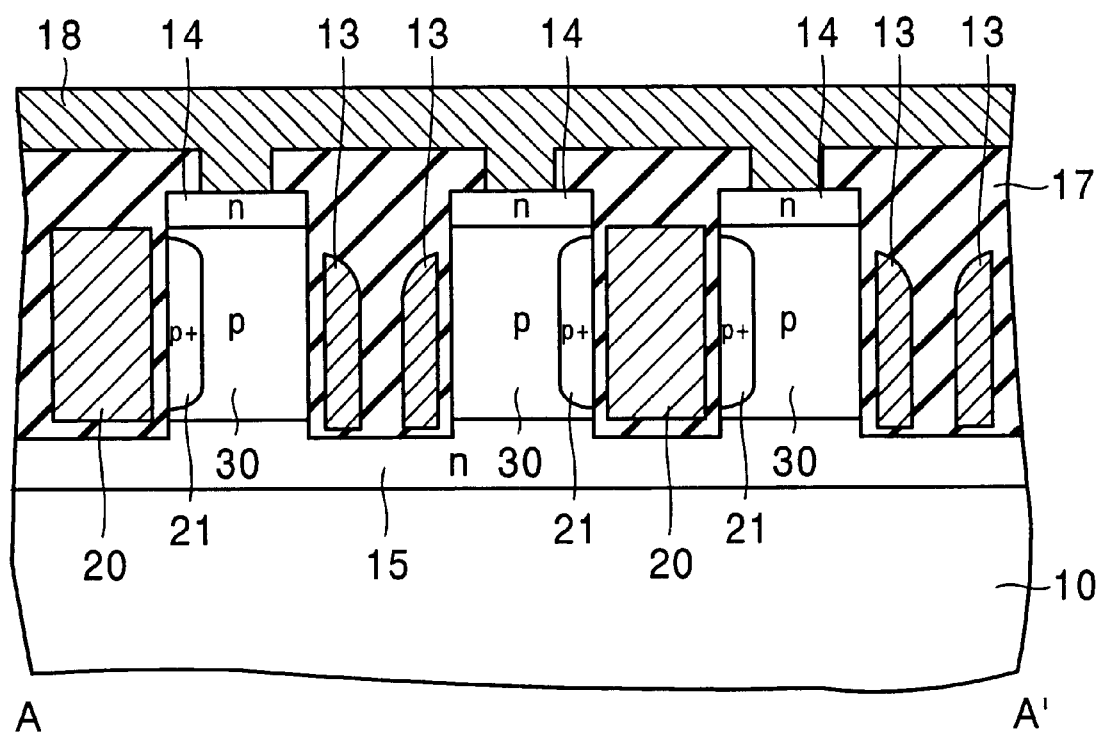
FIG. 30B is a sectional view taken along the line A–A' of the memory cell array in FIG. 30A.

FIG. 30A is a plan view showing a layout of a memory cell array composed of memory cells into which the gate offset structure is introduced in FIG. 21 and FIG. 22 according to the third embodiment. FIG. 30B is a sectional view taken along the line A–A' in FIG. 30A. As shown in FIG. 30A and FIG. 30B, the first gates 13 are shifted to the source region 15. In other words, the first gate 13 is formed on the side face of the source region 15 in the pillar silicon portion 30 via the gate insulating film. That is, an amount of overlap between the first gate 13 and the source region 15 is positive. On the other hand, the first gate 13 is not formed on the side face of the drain region 14 in the pillar silicon portion 30. That is, an amount of overlap between the first gate 13 and the drain region 14 is negative. Its structure other than this is the same as the third embodiment, and therefore the first gate 13 and the second gate 20 are provided separately as different word lines.

Figure 30C:
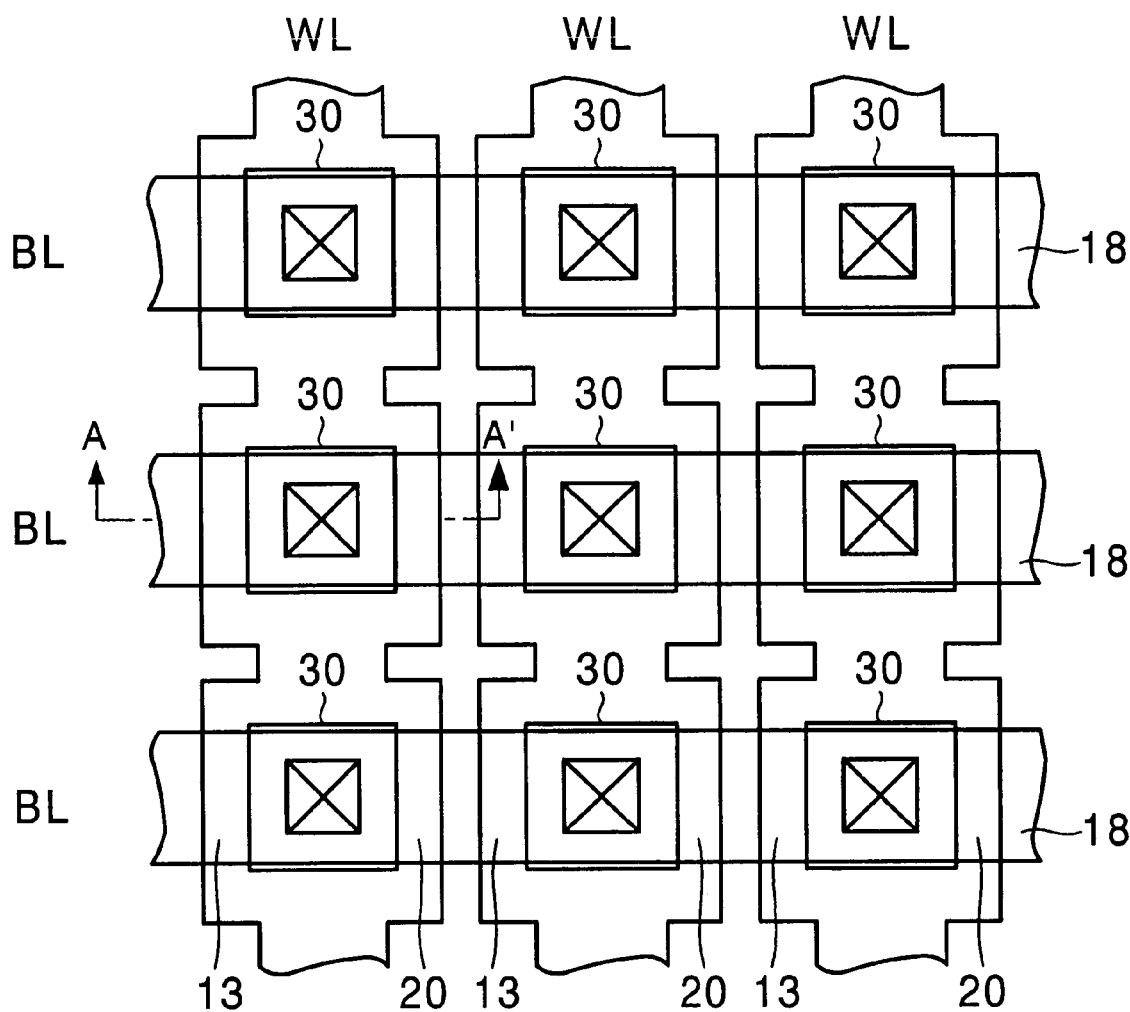
FIG. 30C is a plan view of a memory cell array (sixth embodiment) in which the gate offset structure is introduced into the memory cells in the fourth embodiment.
Figure 30D:
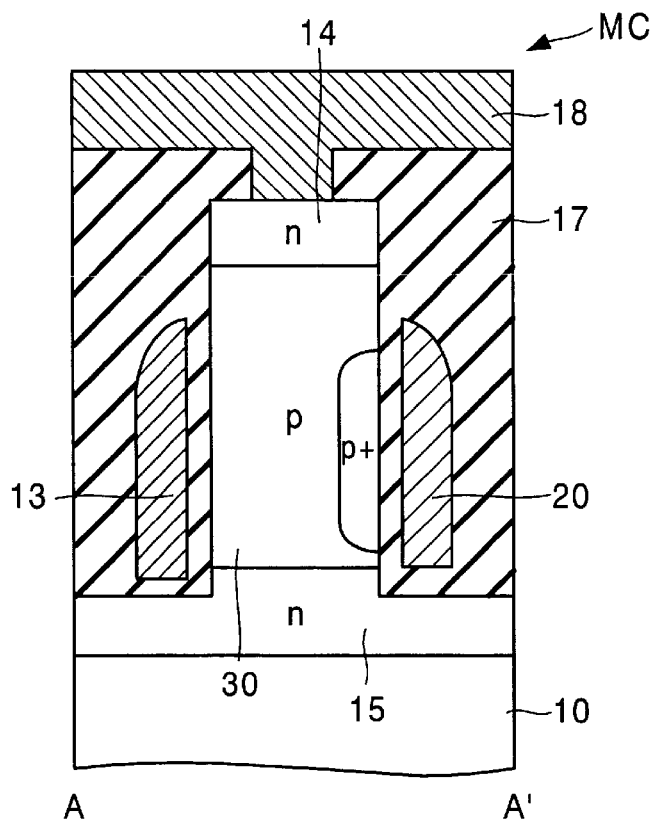
FIG. 30D is a sectional view taken along the line A–A' of the memory cell array in FIG. 30C.

FIG. 30C is a plan view showing a layout of a memory cell array composed of memory cells into which the gate offset structure is introduced in FIG. 23 and FIG. 24 according to the fourth embodiment. FIG. 30D is a sectional view taken along the line A–A' in FIG. 30C. As shown in FIG. 30C and FIG. 30D, the first gates 13 are shifted to the source region 15. In other words, the first gate 13 is formed on the side face of the source region 15 in the pillar silicon portion 30 via the gate insulating film. That is, an amount of overlap between the first gate 13 and the source region 15 is positive. On the other hand, the first gate 13 is not formed on the side face of the drain region 14 in the pillar silicon portion 30. That is, an amount of overlap between the first gate 13 and the drain region 14 is negative. Its structure other than this is the same as the fourth embodiment, and therefore the first gate 13 and the second gate 20 is integrally provided as a common word line.

Also in this embodiment, the unnecessary current at the time of the "0" write operation can be eliminated.

[Seventh Embodiment]

Figure 31:
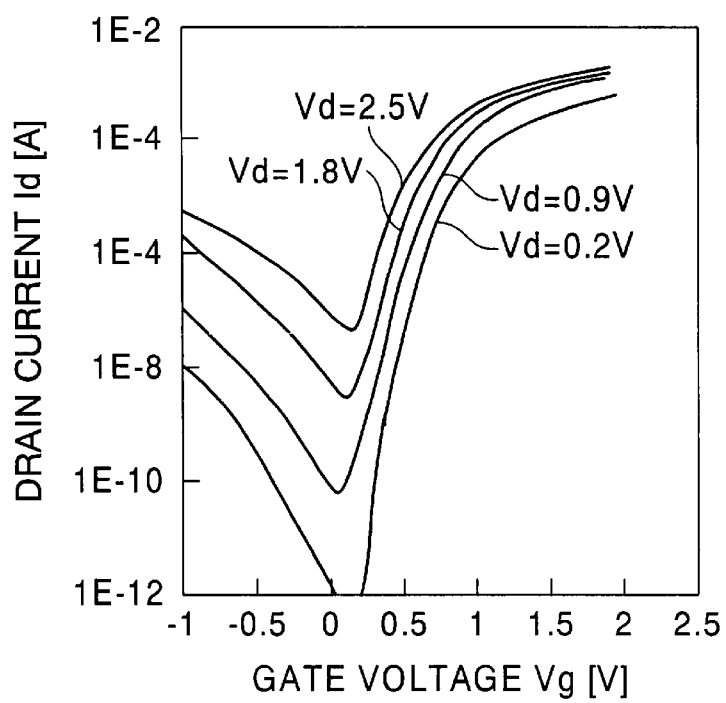
FIG. 31 is characteristics diagram showing a GIDL current of an MISFET (a seventh embodiment)

In the embodiments heretofore, in the "1" write operation, a substrate current generated by impact ionization near the drain junction is utilized, but instead of the impact ionization, a drain leakage current which is a so-called GIDL current caused by the gate can be also utilized. FIG. 31 shows a gate voltage-drain current characteristic in an MISFET with a gate length/gate width=0.175 $\mu$m/10 $\mu$m. When the gate length is shortened, a large substrate current flows when the positive drain voltage Vd is applied in a region where the gate voltage Vg is negative. This is the GIDL current, and by using this, the "1" write operation becomes possible.

Figure 32:
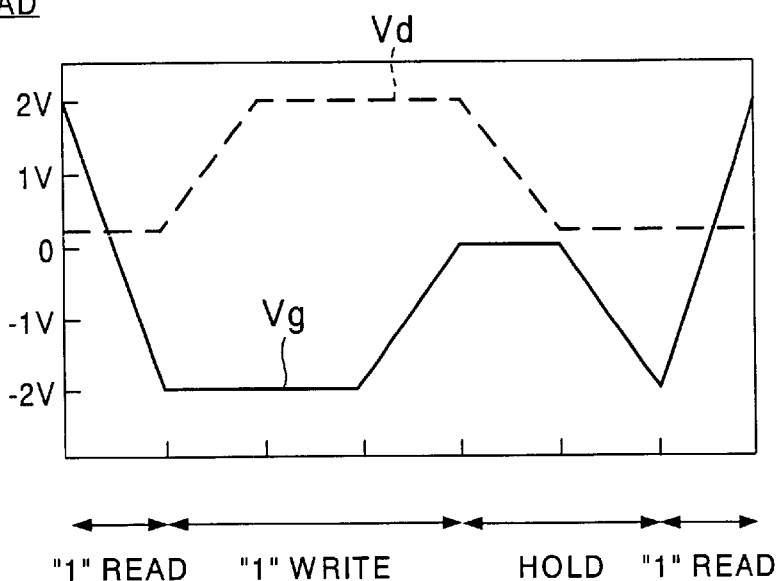
FIG. 32 is a diagram showing waveforms of "1" write/read operations in which the GIDL current is used.

FIG. 32 shows waveforms of the "1" write/read operations in which the GIDL current is used. Differently from the case where impact ionization is used, the gate voltage Vg is negative and the drain voltage Vd is positive at the time of the "1" write operation. Thereby, holes can be injected and accumulated in the channel body by the GIDL current.

Incidentally, the "1" write method which uses the GIDL current is applicable not only to the basic memory cell structure shown in FIG. 1 but also to the memory cell structures in the respective embodiments shown in FIG. 19A and the following drawings.

[Eighth Embodiment]

Figure 33:
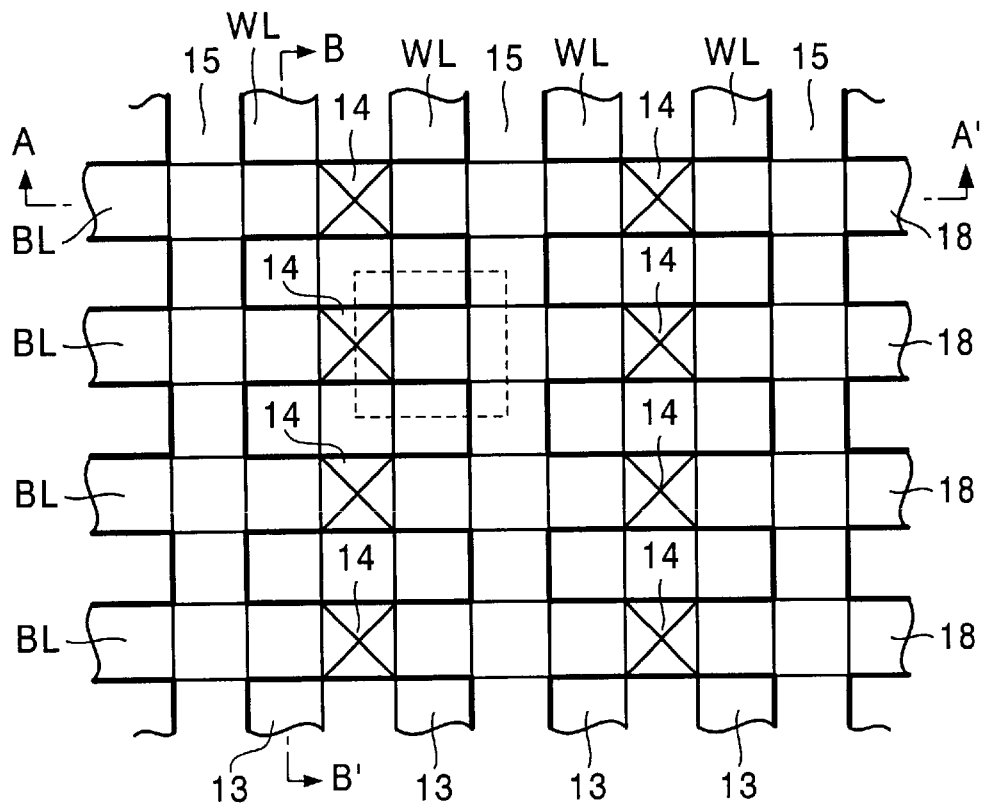
FIG. 33 is a plan view showing a memory cell array according to a eighth embodiment.
Figure 34A:
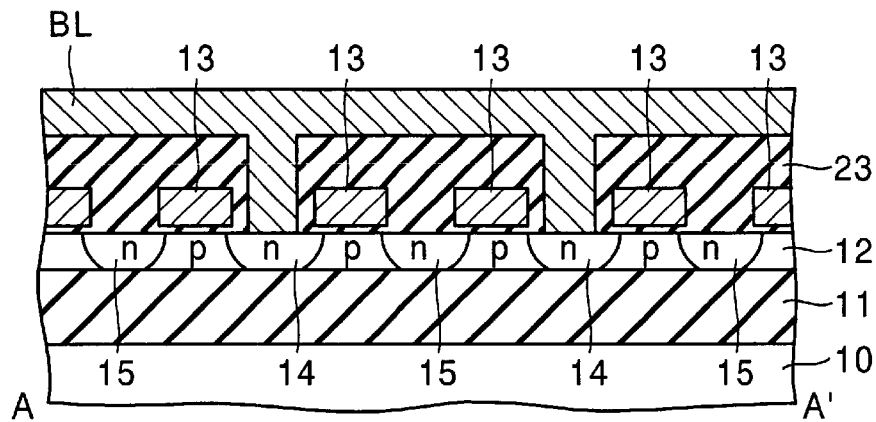
FIG. 34A is a sectional view taken along the line A–A' in FIG. 33.
Figure 34B:
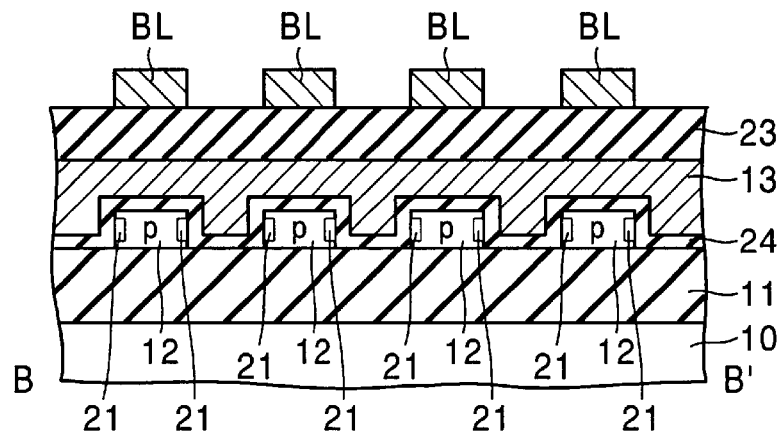
FIG. 34B is sectional view taken along the line B–B' in FIG. 33.

FIG. 33, FIG. 34A and FIG. 34B show an embodiment in which the silicon layer 12 is formed in a convex stripe form on the insulating film 11. FIG. 33 is a plan view of a layout of a memory cell array including such memory cells, FIG. 34A is a sectional view taken along the line A–A' in FIG. 33 and FIG. 34B is a sectional view taken along the line B–B' in FIG. 33.

In this case, the gate 13 signifies that the first gate and the second gate in the aforementioned respective embodiments are formed integrally, and faces an upper face and both side faces of the convex silicon layer 12. Specifically, this structure can be obtained by burying a element-isolation insulating film 24 in such a manner that the silicon layer 12 protrudes. The $p^+$-type layer 21 is formed on, for example, both side faces out of three faces of the silicon layer 12 which the gate 13 faces, and this portion becomes capacitive coupling portion without a channel inversion layer. However, it is suitable that the $p^+$-type layer 21 is formed in at least one face among the upper face and both the side faces of the silicon layer 12.

Thus, the same operation as in the aforementioned embodiments can be performed.

[Ninth Embodiment]

According to the embodiments described above, one MIS transistor serves as one bit memory cell MC, and a memory cell array capable of dynamic storage is constituted. As mentioned above, when the first gate 13 and the second gate 20 are formed separately, the first gate 13 and the second gate 20 can be driven in synchronization with each other either at different potentials or at the same potential.

Figure 35A:
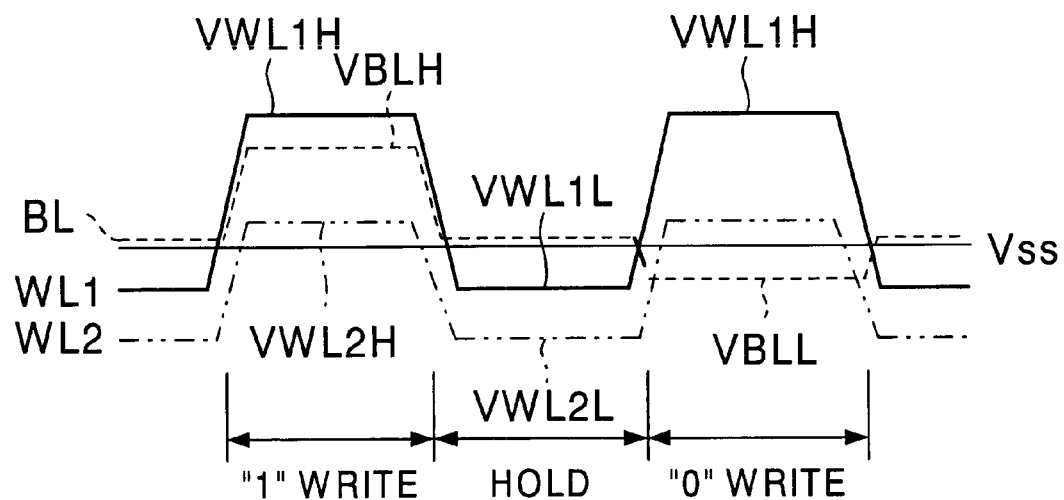
FIG. 35A is a waveform diagram showing a write operation of the memory cell when a first gate and a second gate are driven in synchronization with each other at different potentials (a ninth embodiment)
Figure 35B:
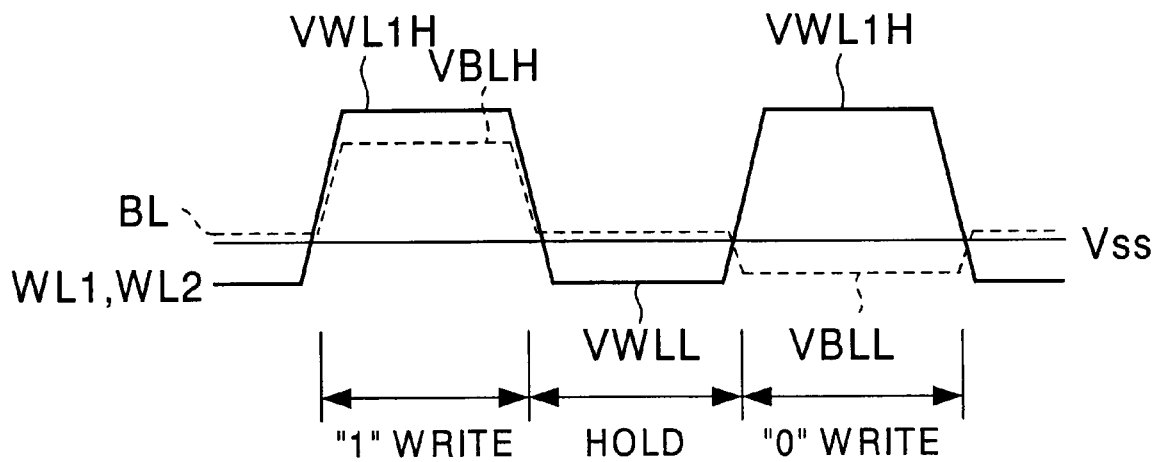
FIG. 35B is a waveform diagram showing a write operation of a memory cell when the first gate and the second gate are driven in synchronization with each other at the same potential (the ninth embodiment)

FIG. 35A and FIG. 35B show voltage waveforms of the word lines WL1 and WL2 and the bit line BL at the time of a data write operation. The first word line WL1 and the second word line WL2 which form a pair are driven synchronously. FIG. 35A shows that when the first gate 13 and the second gate 20 are formed separately, the accumulation of majority carriers on the second gate 20 side of the channel body becomes possible by controlling the second gate 20 at a potential lower than the first gate 13. Meanwhile, FIG. 35B shows that the first gate 13 and the second gate 20 are driven at the same potential and then the accumulation of majority carriers on the second gate 20 side of the channel body becomes possible. The voltage waveform of FIG. 35B can be also applied to the case where the first gate 13 and the second gate 20 are commonly formed.

In the case of FIG. 35A, at the time of a "1" data write operation, a positive potential VWL1H higher than a reference potential VSS is applied to the selected first word line WL1, and a potential VWL2H (a positive potential higher than the reference potential VSS in the illustrated example) lower than the potential VWLLH is applied to the simultaneously selected second word line WL2, and a positive potential VBLH higher than the reference potential VSS is applied to the selected bit line BL. Thereby, in the selected memory cell MC, impact ionization due to a pentode operation occurs, whereby holes are accumulated in the channel body.

In a data hold operation, a negative potential VWL1L lower than the reference potential VSS is applied to the first word line WL1, and a still lower potential VWL2L is applied to the second word line WL2. Thereby, the "1" data in the state in which excessive holes are accumulated in the channel body is held.

At the time of a "0" datawrite operation, the same potentials VWL1H and VWL2H as at the time of the "1" data write operation are applied respectively to the selected first and second word lines WL1 and WL2, and a negative potential VBLL lower than the reference potential VSS is applied to the selected bit line BL. Thereby, in the selected memory cell MC, a drain junction is forward biased, and the holes in the channel body are emitted to the drain region 14, whereby the "0" data in the state of low body potential is written.

In the case of FIG. 35B, at the time of the "1" data write operation, a positive potential VWLH higher than the reference potential VSS is applied to the selected first and second word lines WL1 and WL2, and the positive potential VBLH higher than the reference potential VSS is applied to the selected bit line BL. Thereby, in the selected memory cell MC, impact ionization due to the pentode operation occurs, whereby holes are accumulated in the channel body.

In the data hold operation, a negative potential VWLL lower than the reference potential VSS is applied to the first and second word lines WL1 and WL2. Thereby, the "1" data in the state in which excessive holes are accumulated in the channel body is held.

At the time of the "0" data write operation, the same potential VWLH as at the time of the "1" data write operation is applied to the selected first and second word lines WL1 and WL2, and the negative potential VBLL lower than the reference potential VSS is applied to the selected bit line BL. Thereby, in the selected memory cell MC, the drain junction is forward biased, and the holes in the channel body are emitted to the drain, whereby the "0" data in the state of low body potential is written.

Figure 35C:
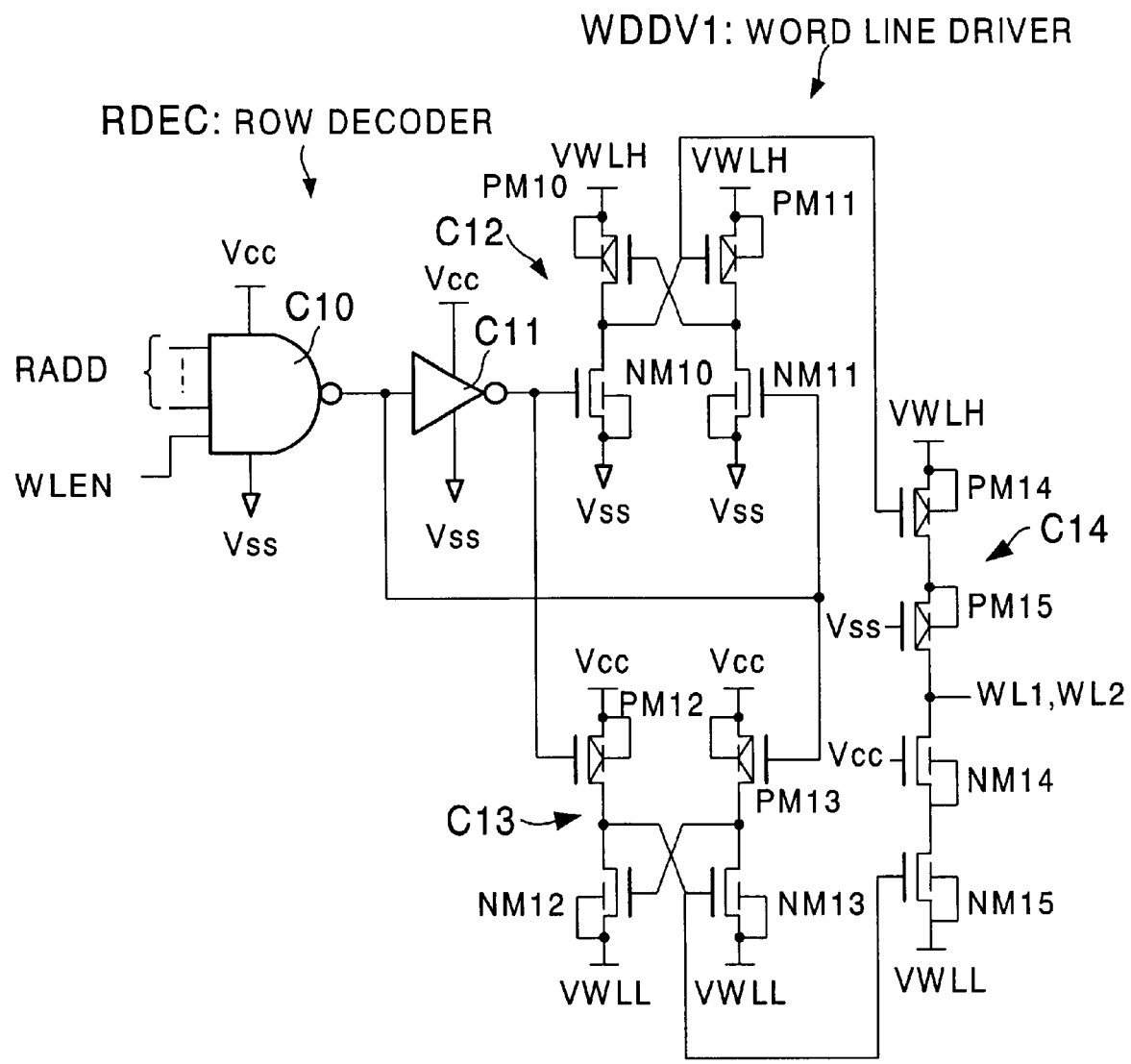
FIG. 35C is a diagram showing an example of the circuit configuration of a word line driver and a row decoder to generate waveforms of the write operation in FIG. 35B.

Next, an example of the concrete circuit configuration of a row decoder and a word line driver in this embodiment will be explained. FIG. 35C is a diagram showing an example of a row decoder RDEC and an example of a word line driver WDDV1 to generate the voltage waveform of the word lines WL1 and WL2 shown in FIG. 35B.

As shown in FIG. 35C, the row decoder RDEC is composed of a NAND circuit C10, and the word line driver WDDV1 is composed of an inverter circuit C11, a level shift circuit C12, a level shift circuit C13, and an output buffer circuit C14. According to this structure, the word line driver WDDV1 selected by the row decoder RDEC changes a potential of a high level into VWLH which is a potential higher than a positive potential VCC and supplies it to the word lines WL1 and WL2.

More specifically, a row address signal RADD and a word line enabling signal WLEN are inputted to the NAND circuit C10. All the high-level row address signals RADD and high-level word line enabling signals WLEN are inputted to the word line driver WDDV1 corresponding to the selected word lines WL1 and WL2. Accordingly, an output from the NAND circuit C10 of the word line driver WDDV1 corresponding to the selected word lines WL1 and WL2 is at a low level, that is, the reference potential VSS. The output from the NAND circuit C10 is inputted to the inverter circuit C11.

This inverter circuit C11 inverts the inputted signal and outputs it. Accordingly, in the selected word line driver WDDV1, an output from the inverter circuit C11 is at a high level, that is, the positive potential VCC. The output from the inverter circuit C11 is inputted to the level shift circuit C12 and the level shift circuit C13. The output from the NAND circuit C10 is also inputted to the level shift circuit C12 and the level shift circuit C13.

Outputs from the level shift circuit C12 and the level shift circuit C13 are inputted to the output buffer circuit C14. By the level shift circuit C12 and the output buffer circuit C14, the output of VCC being a high-level output potential of the inverter circuit C11 is changed to VWLH which is a positive potential higher than VCC and supplied to the word lines WL1 and WL2. Moreover, by the level shift circuit C13 and the output buffer circuit C14, the output of VSS being a low-level output potential of the inverter circuit C11 is changed to VWLL which is a potential lower than VSS and supplied to the word lines WL1 and WL2.

In this embodiment, the level shift circuit C12 is composed of p-type MOS transistors PM10 and PM11 and n-type MOS transistors NM10 and NM11. Source terminals of the p-type MOS transistors PM10 and PM11 are respectively connected to supply lines of the potential VWLH, and drain terminals thereof are respectively connected to drain terminals of the n-type MOS transistors NM10 and NM11. A gate terminal of the p-type MOS transistor PM10 is connected to a node between the p-type MOS transistor PM11 and the n-type MOS transistor NM11, and a gate terminal of the p-type MOS transistor PM11 is connected to a node between the p-type MOS transistor PM10 and the n-type MOS transistor NM10.

The output from the inverter circuit C11 is inputted to a gate terminal of the n-type MOS transistor NM10, and the output from the NAND circuit C10 is inputted to a gate terminal of the n-type MOS transistor NM11. Source terminals of these n-type MOS transistors NM10 and NM11 are respectively connected to supply lines of the potential VSS.

Meanwhile, the level shift circuit C13 is composed of a p-type MOS transistors PM12 and PM13 and n-type MOS transistors NM12 and NM13. Source terminals of the p-type MOS transistors PM12 and PM 13 are respectively connected to supply lines of the potential VCC, and drain terminals thereof are respectively connected to drain terminals of the n-type MOS transistors NM12 and NM13. The output from the inverter circuit C11 is inputted to a gate terminal of the p-type MOS transistor PM12, and the output from the NAND circuit C10 is inputted to a gate terminal of the p-type MOS transistor PM13.

A gate terminal of then-type MOS transistor NM12 is connected to a node between the p-type MOS transistor PM13 and the n-type MOS transistor NM13, and a gate terminal of then-type MOS transistor NM13 is connected to a node between the p-type MOS transistor PM12 and the n-type MOS transistor NM12. Source terminals of these n-type MOS transistors NM12 and NM13 are respectively connected to supply lines of the potential VWLL.

The output buffer circuit C14 is configured by connecting p-type MOS transistors PM14 and PM15 and n-type MOS transistors NM14 and NM15 in series.

A source terminal of the p-type MOS transistor PM14 is connected to a supply line of the potential VWLH, and a gate terminal thereof is connected to the gate terminal of the p-type MOS transistor PM11 in the level shift circuit C12. A drain terminal of the p-type MOS transistor PM14 is connected to a source terminal of the p-type MOS transistor PM15. The potential VSS is inputted to a gate terminal of this p-type MOS transistor PM15. Hence, the p-type MOS transistor PM15 is a normally-on MOS transistor. A drain terminal of the p-type MOS transistor PM15 is connected to a drain terminal of the n-type MOS transistor NM14. A voltage to drive the word lines WL1 and WL2 is outputted from a node between these p-type MOS transistor PM15 and n-type MOS transistor NM14.

The potential VCC is supplied to a gate terminal of the n-type MOS transistor NM14. Hence, the n-type MOS transistor NM14 is a normally-on MOS transistor. A source terminal of the n-type MOS transistor NM14 is connected to a drain terminal of the n-type MOS transistor NM15. A gate terminal of this n-type MOS transistor NM15 is connected to the gate terminal of the n-type MOS transistor NM13 in the level shift circuit C13. A source terminal of the n-type MOS transistor NM15 is connected to a supply line of the potential VWLL.

Using the row decoder RDEC and the word line driver WDDV1 structured as above, the potentials VWLH and VWLL shown in FIG. 35B are generated and supplied to the word lines WL1 and WL2. Incidentally, in FIG. 35C, back gate connection is performed in each MOS transistor, but this is not always necessary.

The output buffer circuit C14 of this word line driver WDDVL includes the normally-on MOS transistors PM15 and NM14 in order that a differential voltage between the potential VWLH and the potential VWLL is not directly applied to the MOS transistors PM14 and NM15. Namely, by the normally-on MOS transistors PM15 and NM14, the differential voltage is reduced by a voltage corresponding to their drop in threshold. Accordingly, if this differential voltage is allowed to be directly applied to the MOS transistors PM14 and NM15, the MOS transistors PM15 and NM14 can be omitted as shown in FIG. 35D.

Figure 35D:
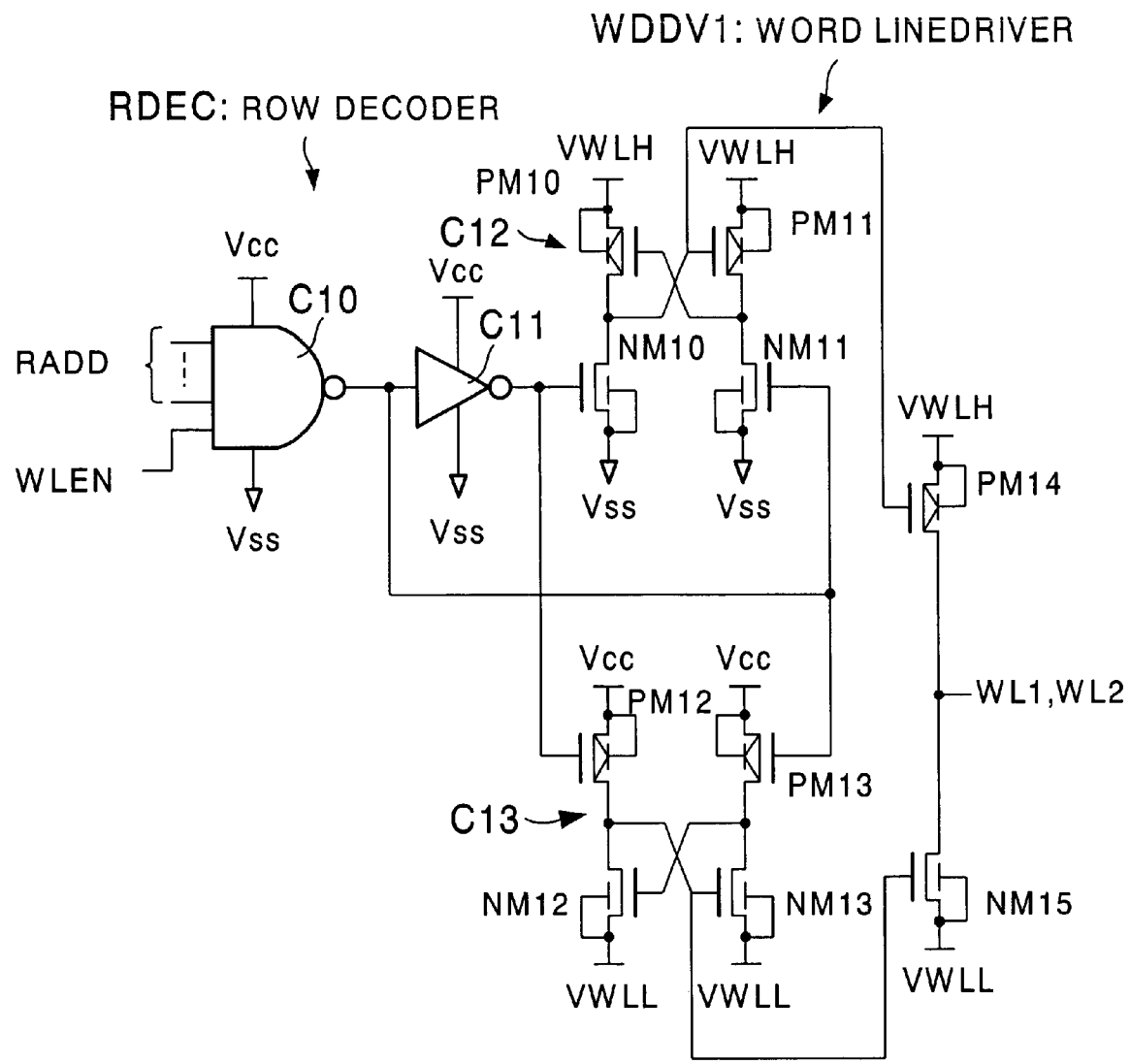
FIG. 35D is a diagram showing a modified example of the word line driver shown in FIG. 35C.
Figure 35E:
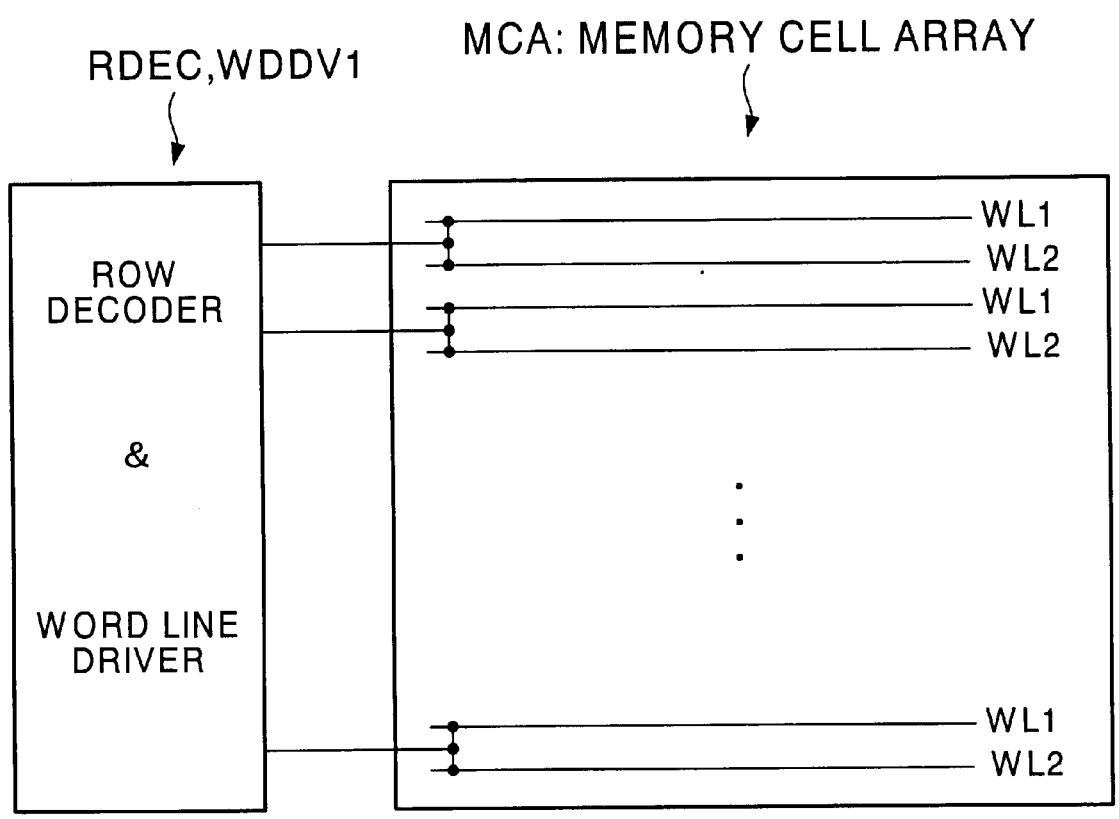
FIG. 35E is a diagram showing an example of a layout when the row decoder and the word line driver shown in FIG. 35C or FIG. 35D are disposed in relation to a memory cell array (disposed on one side)

FIG. 35E is a layout diagram in which the row decoder RDEC and the word line driver WDDV1 shown in FIG. 35C or FIG. 35D are arranged in relation to a memory cell array MCA. As shown in FIG. 35E, when a layout pitch of the word line driver WDDV1 and a wiring pitch of the word lines WL1 and WL2 are matched, the row decoder RDEC and the word line driver WDDV1 can be disposed on one side of the memory cell array MCA.

Figure 35F:
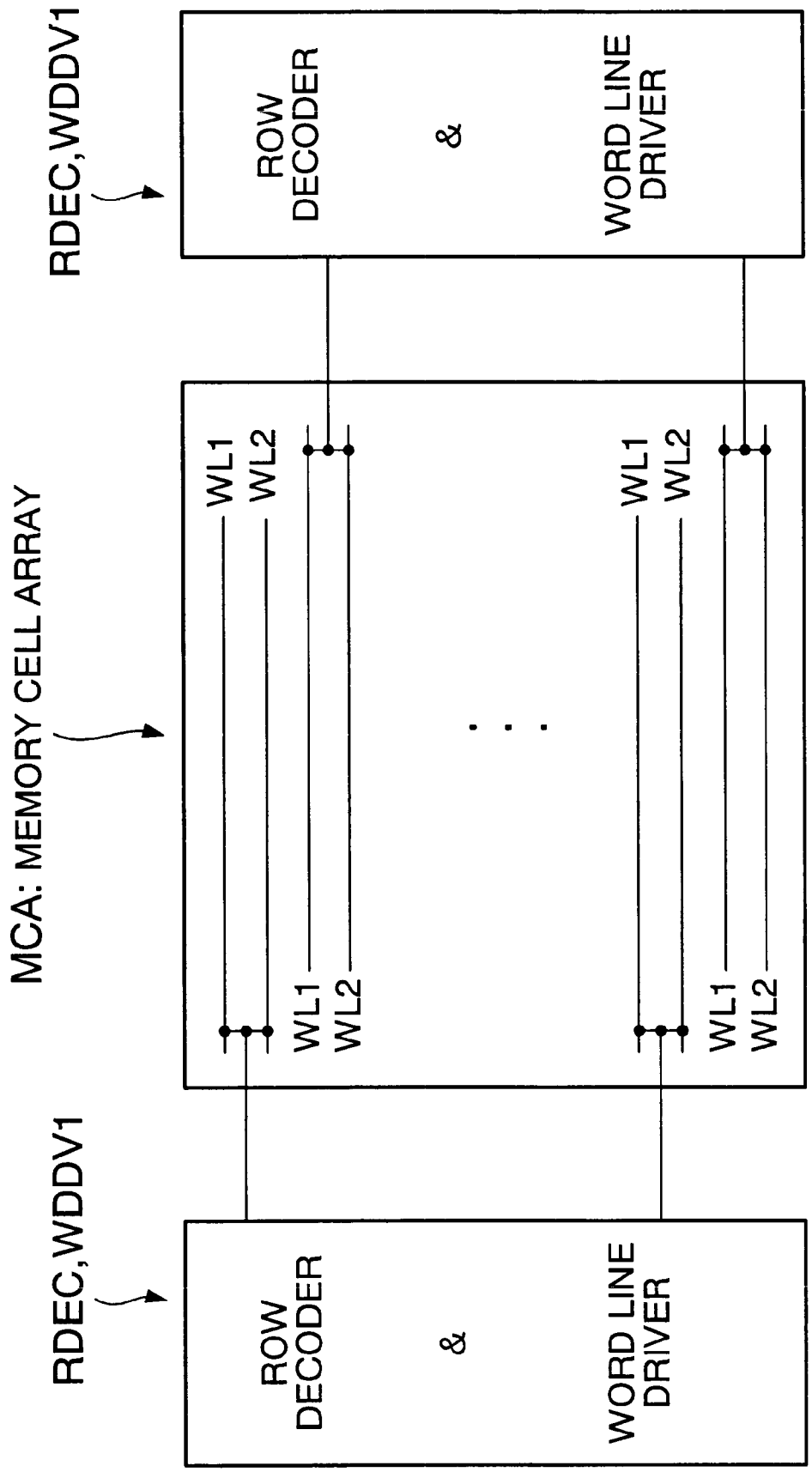
FIG. 35F is a diagram showing an example of the layout when the row decoder and the word line driver shown in FIG. 35C or FIG. 35D are disposed in relation to a memory cell array (disposed on either side)

On the other hand, when the layout area of the word line driver WDDV1 increases and the layout pitch of the word line driver WDDV1 and the wiring pitch of the word lines WL1 and WL2 can not be matched, such a layout as shown in FIG. 35F is devised. Specifically, the row decoder RDEC and the word line driver WDDV1 are disposed on either side of the memory cell array MCA, and, for example, the word lines WL1 and WL2 at odd number positions are decoded and driven by the row decoder RDEC and the word line driver WDDV1 on the left side of the memory cell array MCA and the word lines WL1 and WL2 at even number positions are decoded and driven by the row decoder RDEC and the word line driver WDDV1 on the right side of the memory cell array MCA.

Figure 35G:
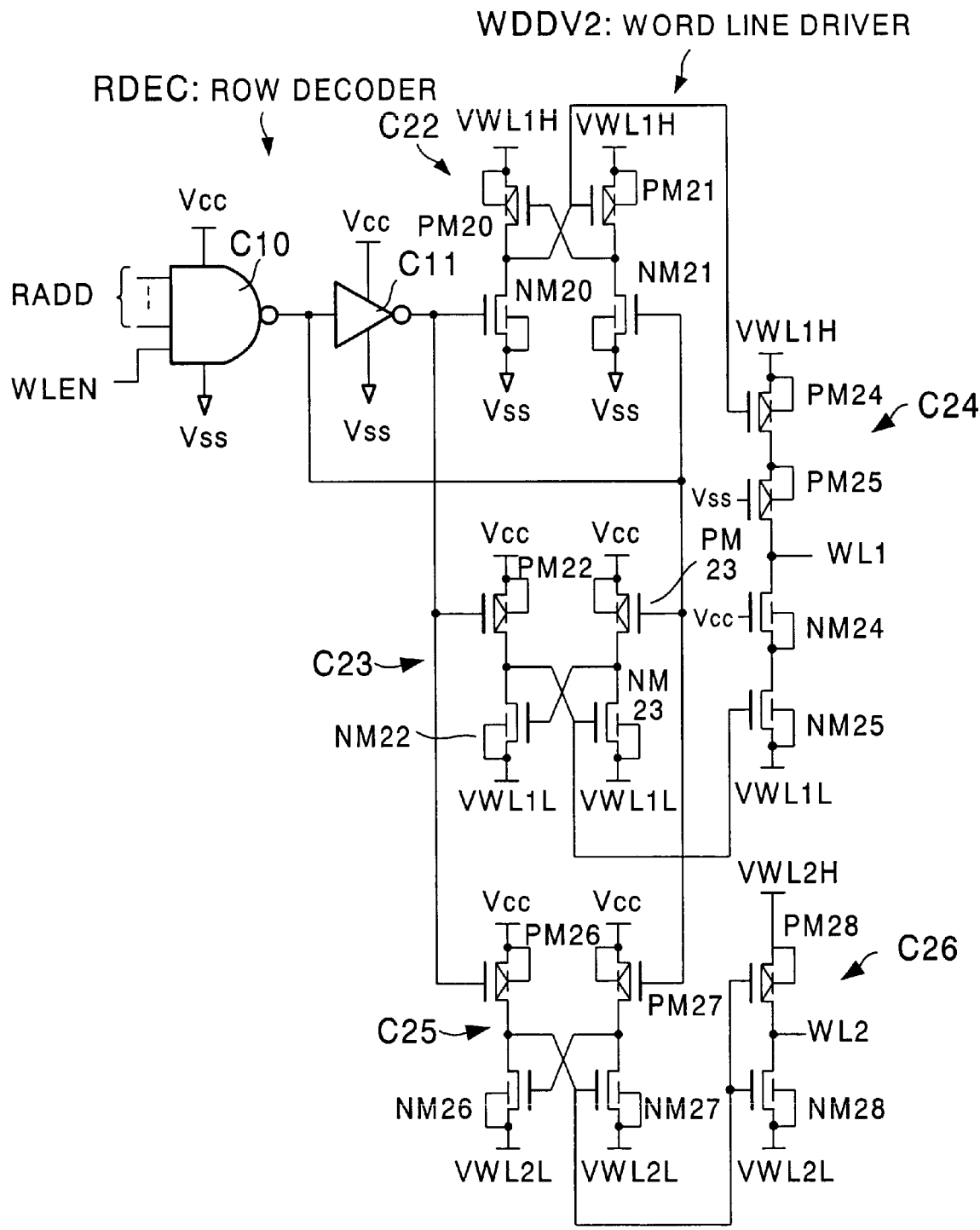
FIG. 35G is a diagram showing an example of the circuit configuration of a word line driver and a row decoder to generate waveforms of the write operation in FIG. 35A.

Next, the circuit configuration of a row decoder and a word line driver corresponding to FIG. 35A will be explained. FIG. 35G is a diagram showing an example of the row decoder and an example of a word line driver WDDV2 to generate the voltage waveforms of the word lines WL1 and WL2 shown in FIG. 35A.

As shown in FIG. 35G, the row decoder RDEC is composed of the NAND circuit C10, and the word line driver WDDV2 is composed of the inverter circuit C11, a level shift circuit C22, a level shift circuit C23, and an output buffer circuit C24, a level shift circuit C25, and an output buffer circuit C26. The relation of voltage level here is VWL1H>VWL2H>VSS>VWL1L>VWL2L in accordance with the example in FIG. 35A.

Only points different from FIG. 35C will be explained. The level shift circuit C22 has basically the same configuration as the level shift circuit C12 in FIG. 35C and includes p-type MOS transistors PM20 and PM21 and n-type MOS transistors NM20 and NM21. However, source terminals of the p-type MOS transistors PM20 and PM21 are connected to supply lines of the potential VWL1H.

The level shift circuit 23 has basically the same configuration as the level shift circuit C13 in FIG. 35C and includes p-type MOS transistors PM22 and PM23 and n-type MOS transistors NM22 and NM23. However, source terminals of the n-type MOS transistors NM22 and NM23 are connected to supply lines of the potential VWL1L.

The output buffer circuit C24 has basically the same configuration as the buffer circuit C14 in FIG. 35C and includes p-type MOS transistors PM24 and PM25 and n-type MOS transistors NM24 and NM25 which are connected in series. However, a source terminal of the p-type MOS transistor PM24 is connected to a supply line of the potential VWL1H, and a source terminal of the n-type MOS transistor NM25 is connected to a supply line of the potential VWL1L.

In addition to this, the word line driver WDDV2 in FIG. 35G includes the level shift circuit C25 and the output buffer circuit C26. The level shift circuit C25 has the same configuration as the level shift circuit C23 and includes p-type MOS transistors PM26 and PM27 and n-type MOS transistors NM26 and NM27. However, source terminals of the n-type MOS transistors NM26 and NM27 are connected to supply lines of the potential VWL2L.

The output buffer circuit C26 has the same configuration as the output buffer circuit C24, but comprises two MOS transistors of a p-type MOS transistor PM28 and an n-type MOS transistor NM28. A source terminal of the p-type MOS transistor PM28 is connected to a supply line of the potential VWH2H, and a source terminal of the n-type MOS transistor NM28 is connected to a supply line of the potential VWL2L.

The reason why no normally-on MOS transistor is inserted is that since the differential voltage between the potential VWL2H and the potential VWL2L is not so large as can be seen from FIG. 35A, any problem does not arise even if this differential voltage is directly applied to the MOS transistors PM28 and NM28.

As can be seen from this configuration, an output from the output buffer circuit C24 varies between the potential VWL1H and the potential VWL1L, whereby the first word line WL1 is driven. An output from the output buffer circuit C26 varies in synchronization with the output from the output buffer circuit C24, whereby the second word line WL2 is driven. Incidentally, back gate connection is performed in each MOS transistor in FIG. 35G, but this is not always necessary.

Figure 35H:
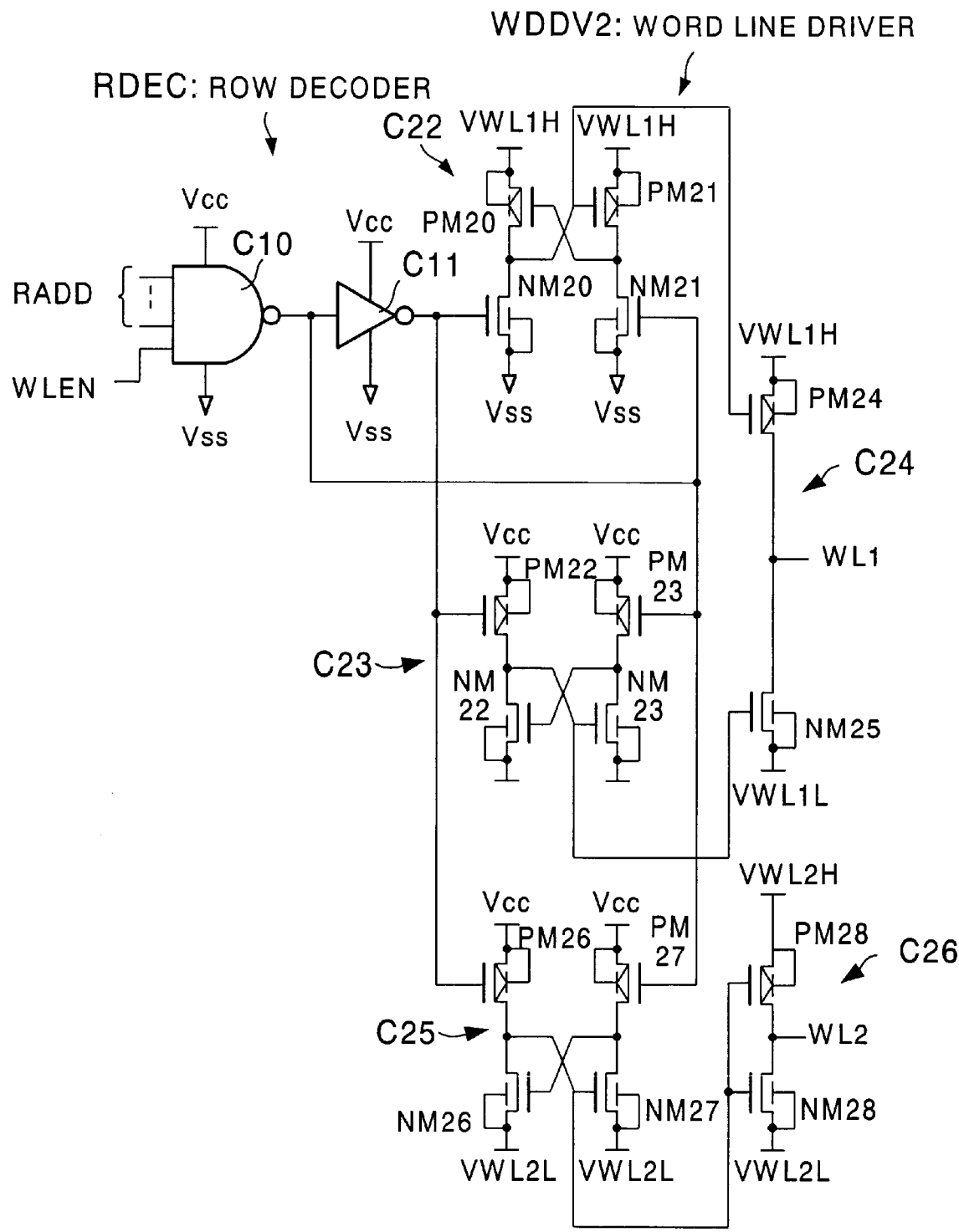
FIG. 35H is a diagram showing a modified example of the word line driver shown in FIG. 35G.

Likewise with the word line driver WDDV1 shown in FIG. 35D, it is possible to omit the P-type MOS transistor PM25 and the n-type MOS transistor NM24 also in the word line driver WDDV2 as shown in FIG. 35H.

Figure 35I:
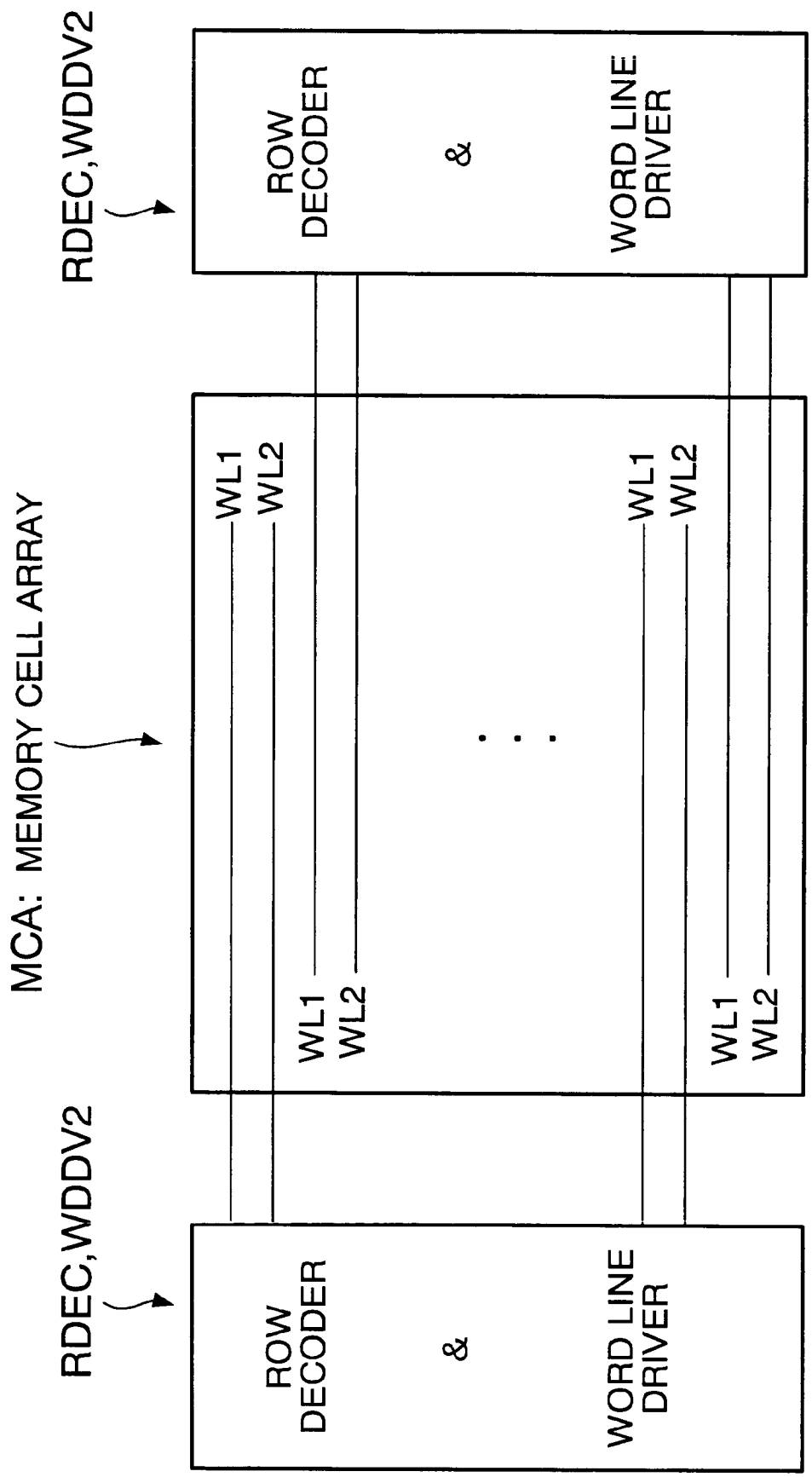
FIG. 35I is a diagram showing an example of a layout when the row decoder and the word line driver shown in FIG. 35G or FIG. 35H are disposed in relation to the memory cell array (when the row decoder and the word line driver on the right and the left side are disposed alternately for pairs of the first word line and the second word line)

FIG. 35I is a layout diagram in which the row decoder RDEC and the word line driver WDDV1 shown in FIG. 35G or FIG. 35H are arranged in relation to the memory cell array MCA. In the word line driver WDDV2 shown in FIG. 35G and FIG. 35H, since the first word line WL1 and the second word line WL2 are driven synchronously at different potentials, its layout area is larger than that of the word line driver WDDV1 shown in FIG. 35C and FIG. 35D. Accordingly, it is difficult to match a layout pitch of the word line driver WDDV2 with a wiring pitch of the word lines WL1 and WL2. For this reason, in a layout shown in FIG. 35I, the row decoder RDEC and the word line driver WDDV2 are disposed on either side of the memory cell array MCA. Namely, the word lines WL1 and WL2 at odd number positions are decoded and driven by the row decoder RDEC and the word line driver WDDV2 on the left side of the memory cell array MCA and the word lines WL1 and WL2 at even number positions are decoded and driven by the row decoder RDEC and the word line driver WDDV2 on the right side of the memory cell array MCA.

Figure 35J:
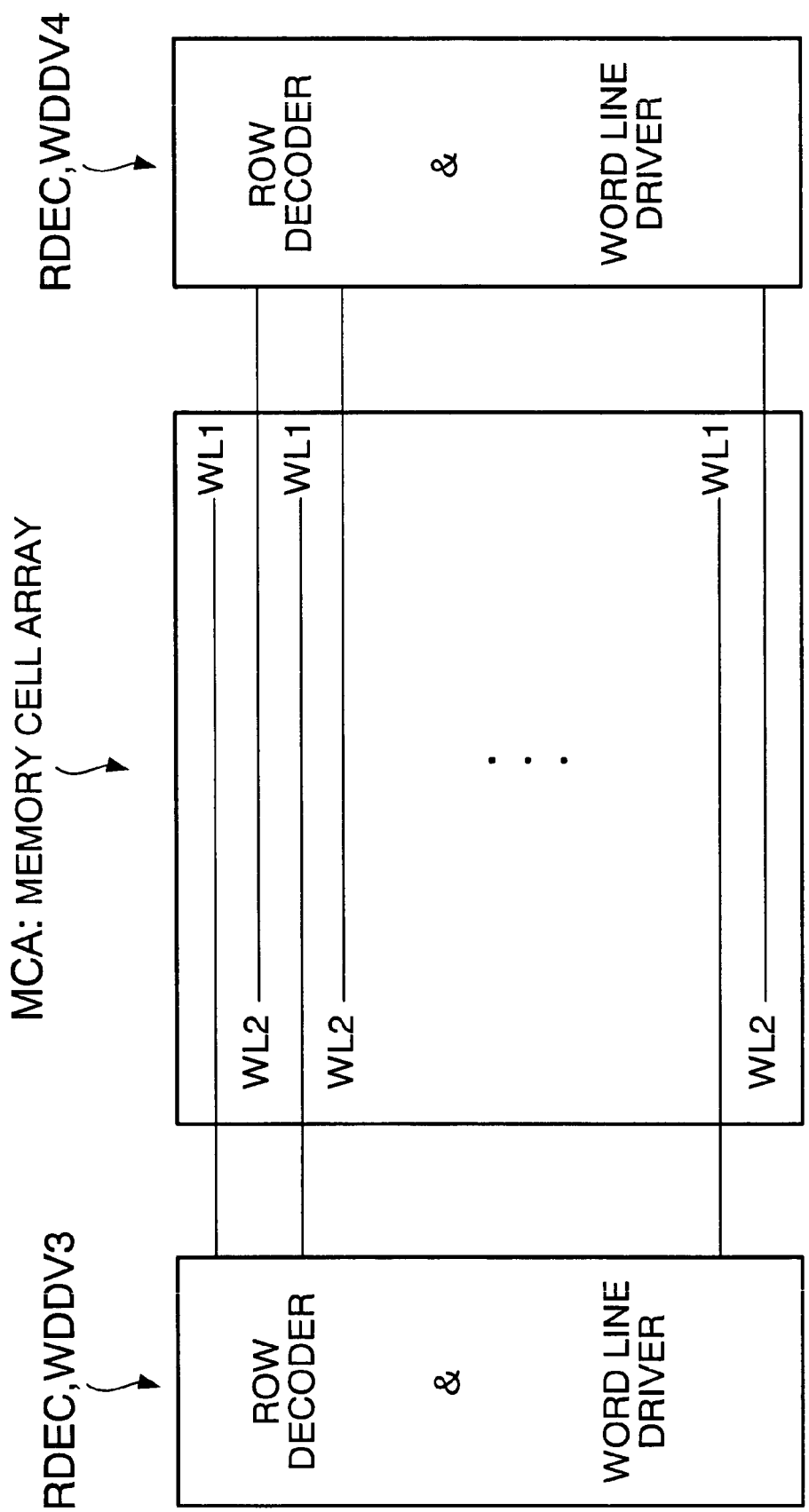
FIG. 35J is a diagram showing an example of the layout when the row decoder and the word line driver shown in FIG. 35G or FIG. 35H are disposed in relation to the memory cell array (when the row decoder and the word line driver for the first word lines are disposed on one side and the row decoder and the word line driver for the second word lines are disposed on the other side)

Moreover, as shown in FIG. 35J, for example, it is suitable to dispose a word line driver WDDV3 for the first word lines WL1 on the left side of the memory cell array MCA and dispose a word line driver WDDV4 for the second word lines WL2 on the right side of the memory cell array MCA. This disposition can facilitate power supply wiring. Namely, it is suitable to situate potential supply lines of the potential VWL1H and the potential VWL1L only on the left side of the memory cell array MCA where the word line driver WDDV3 for the first word lines WL1 is provided and situate potential supply lines of the potential VWL2H and the potential VWL2L only on the right side of the memory cell array MCA where the word line driver WDDV4 for the second word lines WL2 is provided.

In this layout, however, individual row decoders RDEC are needed for both the word line driver WDDV3 and the word line driver WDDV4. An example of such a word line driver WDDV3 is shown in FIG. 35K, and an example of such a word line driver WDDV4 is shown in FIG. 35L.

Figure 35K:
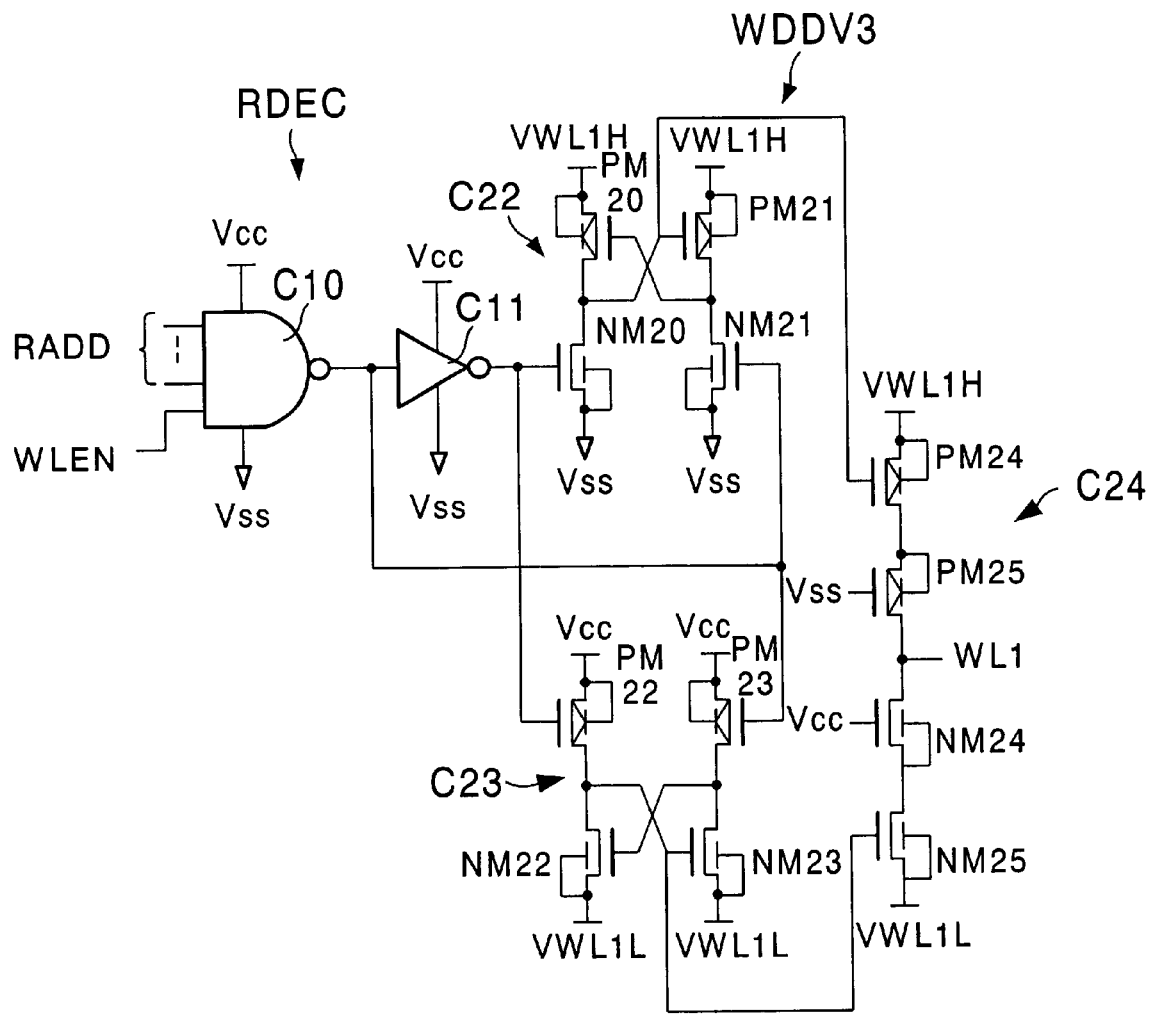
FIG. 35K is a diagram showing an example of the circuit configuration of the row decoder and the word line driver for the first word lines when the layout shown in FIG. 35J is adopted.

As shown in FIG. 35K, the word line driver WDDV3 for the first word lines WL1 comprises the level shift circuit C22 connected to the row decoder RDEC via the inverter circuit C11, the level shift circuit C23 directly connected to the row decoder RDEC, and the output buffer circuit C24. Their configurations are the same as those in the aforementioned word line driver WDDV2 in FIG. 35G.

Figure 35L:
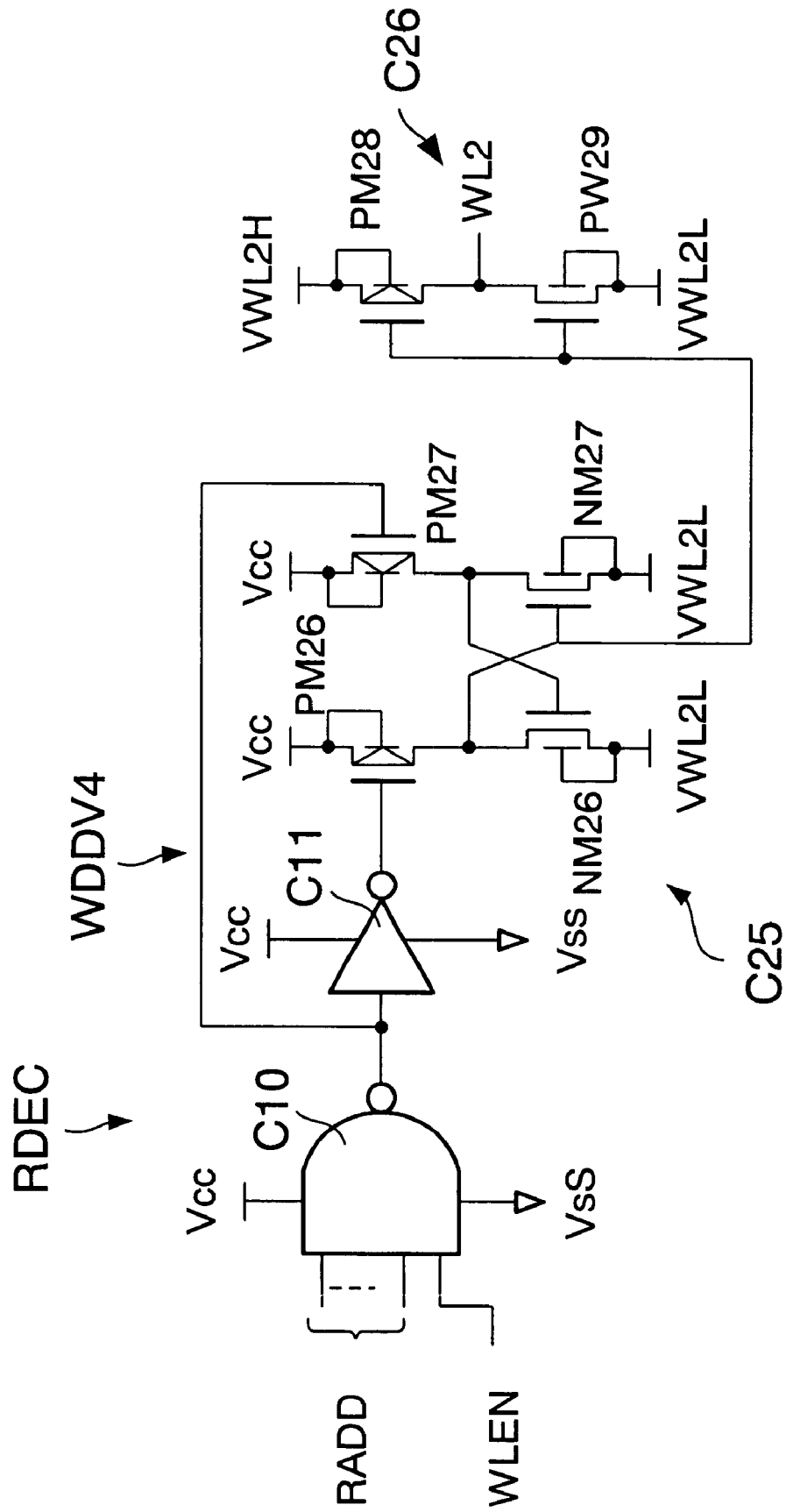
FIG. 35L is a diagram showing an example of the circuit configuration of the row decoder and the word line driver for the second word lines when the layout shown in FIG. 35J is adopted.

Meanwhile, as shown in FIG. 35L, the word line driver WDDV4 for the second word lines WL1 comprises the row decoder RDEC, the inverter circuit C11, the level shift circuit C25, and the output buffer circuit C26. The configurations of the level shift circuit C25 and the output buffer circuit C26 are the same as those in the aforementioned word line driver WDDV2 in FIG. 35G. However, since the word line driver WDDV4 is disposed on the right side of the memory cell array MCA, the row decoder RDEC can not be shared with the word line driver WDDV3, and hence the row decoder RDEC and the inverter circuit C11 are additionally provided for the word line driver WDDV4.

The row address signals RADD and WLEN are inputted synchronously to the row decoder RDEC of the word line driver WDDV3 and the row decoder RDEC of WDD4, and as a result word line driving potentials synchronized at different voltage amplitudes are outputted.

Figure 35M:
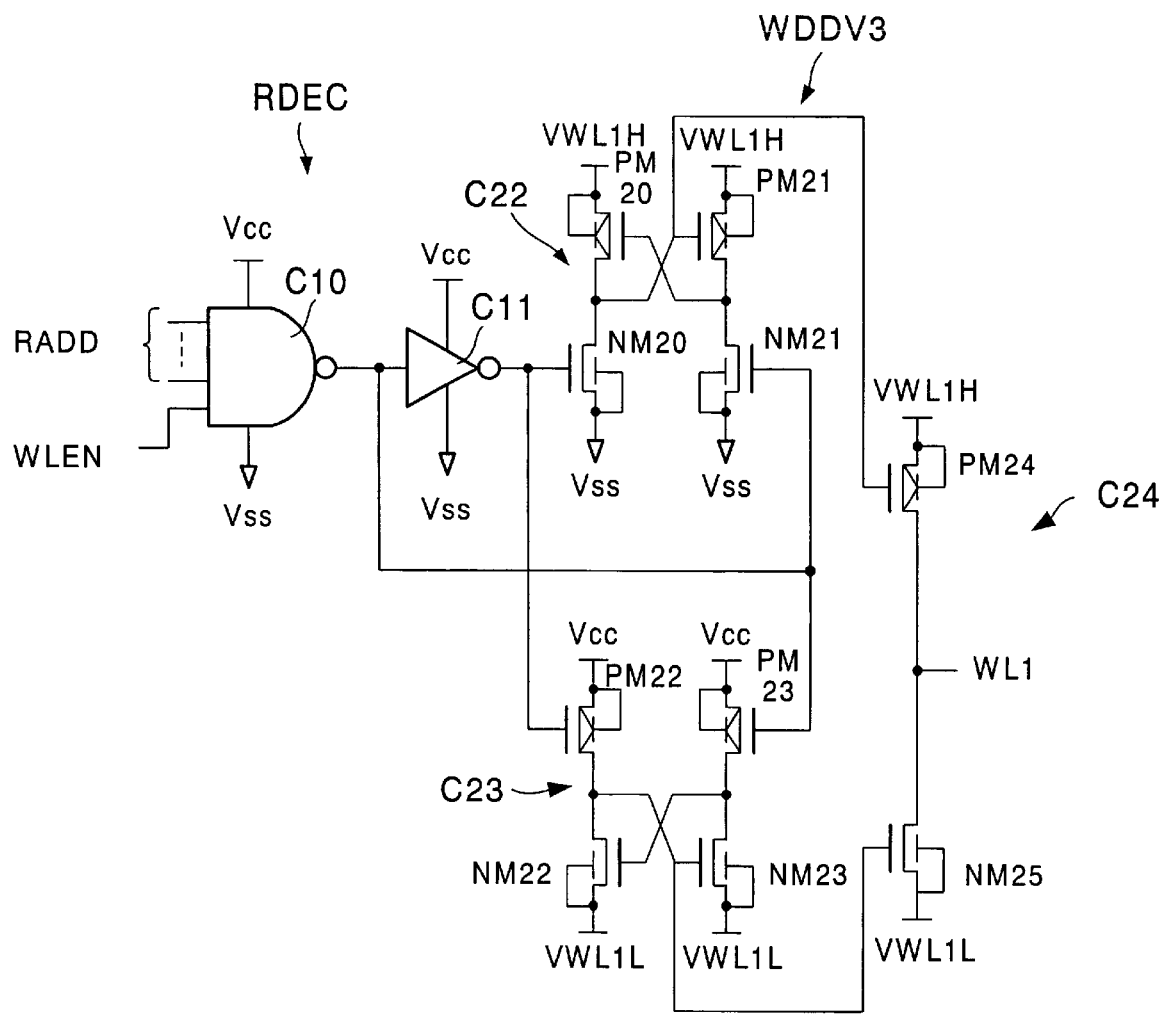
FIG. 35M is a diagram showing a modified example of the word line driver shown in FIG. 35K.

Incidentally, in FIG. 35K and FIG. 35L, back gate connection is performed in each MOS transistor, but this is not always necessary. Moreover, in the word line driver WDDV3 shown in FIG. 35K, the p-type MOS transistor PM25 and the n-type MOS transistor NM24 can be omitted as shown in FIG. 35M.

What is claimed is:

1. A semiconductor memory device including MIS transistors to constitute memory cells, each of the MIS transistors comprising:

a semiconductor layer;

a source region formed in the semiconductor layer;

a drain region formed apart from the source region in the semiconductor layer, the semiconductor layer between the source region and the drain region serving as a channel body in a floating state;

a first gate which forms a channel in the channel body;

a second gate formed so as to control a potential of the channel body by a capacitive coupling; and a high concentration region formed in the channel body on the second gate side, impurity concentration of the high concentration region being higher than that of the channel body, wherein the MIS transistor has a first data state in which the channel body has a first potential and a second data state in which the channel body has a second potential.

2. The semiconductor memory device according to claim 1, wherein the first data state is set by the impact ionization generated near a drain junction with a pentode operation of the MIS transistor, and the second data state is set by applying a forward bias between the channel body to which a predetermined potential is applied from the first gate by the capacitive coupling and the drain region.

3. The semiconductor memory device according to claim 1, wherein the first gate and second gate are formed separately.

4. The semiconductor memory device according to claim 3, wherein the MIS transistors are arranged in a matrix form to constitute a memory cell array, the drain regions of the MIS transistors along a first direction are connected to a bit line, the first gates of the MIS transistors along a second direction are connected to a first word line, the source regions of the MIS transistors are connected to a fixed potential, and the second gates of the MIS transistors along the second direction are connected to a second word line.

5. The semiconductor memory device according to claim 3, wherein the MIS transistors are arranged in a matrix form to constitute a memory cell array, the drain regions of the MIS transistors along a first direction are connected to a bit line, the first gates of the MIS transistors along a second direction are connected to a word line, the source regions of the MIS transistors are connected to a first fixed potential, and the second gate is formed as a common plate for all the MIS transistors in the memory cell array and connected to a second fixed potential.

6. The semiconductor memory device according to claim 5, wherein an amount of overlap between the first gate and the source region is positive whereas an amount of overlap between the first gate and the drain region is negative.

7. The semiconductor memory device according to claim 3, wherein the semiconductor layer is formed on a semiconductor substrate via an insulating film, and the first gate is continuously formed on the semiconductor layer to constitute a first word line, and the second gate is continuously formed under the semiconductor layer to constitute a second word line in parallel with the first word line.

8. The semiconductor memory device according to claim 3, wherein the semiconductor layer is a pillar semiconductor portion formed on a semiconductor substrate, the first gate is formed so as to face one side face of the pillar semiconductor portion, the second gate is formed so as to face the high concentration region which is formed on the opposite side face to the first gate of the pillar semiconductor portion, and the drain region is formed on the top of the pillar semiconductor portion and the source region is formed on the bottom of the pillar semiconductor portion.

9. The semiconductor memory device according to claim 8, wherein an amount of overlap between the first gate and the source region is positive whereas an amount of overlap between the first gate and the drain region is negative.

10. The semiconductor memory device according to claim 3, wherein an amount of overlap between the first gate and the source region is positive whereas an amount of overlap between the first gate and the drain region is negative.

11. The semiconductor memory device according to claim 3, further comprising a driving circuit which drives the first gate and the second gate, and which drives the second gate in synchronization with the first gate at a potential lower than the first gate.

12. The semiconductor memory device according to claim 3, further comprising a driving circuit which drives the first gate and the second gate in synchronization with each other at the same potential.

13. The semiconductor memory device according to claim 1, wherein the first gate and the second gate are formed as a common gate.

14. The semiconductor memory device according to claim 13, wherein the high concentration region is formed in a part of the common gate side of the channel body.

15. The semiconductor memory device according to claim 14, wherein the high concentration region is in contact with both the source region and the drain region.

16. The semiconductor memory device according to claim 14, wherein the high concentration region is out of contact with the source region nor the drain region.

17. The semiconductor memory device according to claim 13, wherein the semiconductor layer is a pillar semiconductor portion formed on a semiconductor substrate, the common gate is formed so as to surround the pillar semiconductor portion, the high concentration region is formed on at least one side face of the pillar semiconductor portion, and the drain region is formed on the top of the pillar semiconductor portion and the source region is formed on the bottom of the pillar semiconductor portion.

18. The semiconductor memory device according to claim 17, wherein an amount of overlap between the common gate and the source region is positive whereas an amount of overlap between the common gate and the drain region is negative.

19. The semiconductor memory device according to claim 17, wherein the semiconductor layer a convex semiconductor layer formed on a semiconductor substrate, the common gate is formed so as to face the top face and both the side faces of the convex semiconductor layer, the high concentration region is formed on at least one side face, which faces the common gate, of the convex semiconductor layer, and the drain region and the source region are formed in the convex semiconductor layer, the common gate being between the drain region and the source region.

20. The semiconductor memory device according to claim 1, wherein the first data state is set by a drain leakage current caused by the first gate to which a negative potential is applied, and the second data state is set by applying a forward bias between the channel body to which a predetermined potential is applied from the first gate by the capacitive coupling and the drain region.

21. A semiconductor memory device including MIS transistors to constitute memory cells, each of the MIS transistors comprising:

a semiconductor layer;

a source region formed in the semiconductor layer;

a drain region formed apart from the source region in the semiconductor layer, the semiconductor layer between the source region and the drain region serving as a channel body in a floating state; and a first gate which forms a channel in the channel body, wherein characteristics of the MIS transistor in the case where a channel current flows from the source region to the drain region is different from characteristics of the MIS transistor in the case where a channel current flows from the drain region to the source region, even when the same potential is applied to the first gate, and wherein the MIS transistor has a first data state in which the channel body has a first potential and a second data state in which the channel body has a second potential, the first data state being set by the impact ionization generated near a drain junction or by a drain leakage current caused by the first gate, the second data state being set by sending a forward bias current between the drain region and the channel body.

22. The semiconductor memory device according to claim 21, wherein an amount of overlap between the first gate and the source region is positive whereas an amount of overlap between the first gate and the drain region is negative.

23. The semiconductor memory device according to claim 22, wherein the channel current flowing from the drain region to the source region is larger than that flowing from the source region to the drain region, even when the same potential is applied to the first gate.

24. The semiconductor memory device according to claim 23, further comprising a second gate which controls a potential of the channel body by a capacitive coupling.

25. The semiconductor memory device according to claim 24, further comprising a high concentration region which is formed in the channel body on the second gate side, conductive type of the high concentration being the same as that of the channel body, impurity concentration of the high concentration region being higher than that of the channel body.

26. A semiconductor memory device including MIS transistors to constitute memory cells, each of the MIS transistors comprising:

a semiconductor layer;

a source region formed in the semiconductor layer;

a drain region formed apart from the source region in the semiconductor layer, the semiconductor layer between the source region and the drain region serving as a channel body in a floating state; and a gate which forms a channel in the channel body, wherein the MIS transistor has a first data state in which the channel body has a first potential and a second data state in which the channel body has a second potential, the first data state being set by a drain leakage current caused by the gate to which a negative potential is applied, the second data state being set by sending a forward bias current between the drain region and the channel body.

* * * * *